(12) United States Patent
Rajapakse et al.

(10) Patent No.: US 12,345,753 B2
(45) Date of Patent: *Jul. 1, 2025

(54) METHOD FOR DETERMINING CONDUCTORS INVOLVED IN A FAULT ON A POWER TRANSMISSION LINE AND FAULT LOCATION USING LOCAL CURRENT MEASUREMENTS

(71) Applicant: University of Manitoba, Winnipeg (CA)

(72) Inventors: Athula Dayanarth Rajapakse, Winnipeg (CA); Naushath Mohamed Haleem, Winnipeg (CA); Jagannath Sri Wijekoon, Winnipeg (CA)

(73) Assignee: University of Manitoba, Winnipeg (CA)

( * ) Notice: Subject to any disclaimer, the term of this patent is extended or adjusted under 35 U.S.C. 154(b) by 0 days.

This patent is subject to a terminal disclaimer.

(21) Appl. No.: 18/600,022

(22) Filed: Mar. 8, 2024

(65) Prior Publication Data
US 2024/0288482 A1    Aug. 29, 2024

Related U.S. Application Data

(63) Continuation of application No. 17/287,786, filed as application No. PCT/CA2019/051556 on Nov. 1, 2019, now Pat. No. 11,971,440.
(Continued)

(51) Int. Cl.
*G01R 31/08* (2020.01)
*H02J 3/00* (2006.01)
(Continued)

(52) U.S. Cl.
CPC .......... *G01R 31/085* (2013.01); *H02J 3/0012* (2020.01); *H02J 3/36* (2013.01); *H02J 13/00002* (2020.01); *H02J 2203/20* (2020.01)

(58) Field of Classification Search
None
See application file for complete search history.

(56) References Cited

U.S. PATENT DOCUMENTS

| | | | |
|---|---|---|---|
| 2003/0038640 A1* | 2/2003 | Zuercher | H02H 1/04 324/536 |
| 2013/0054183 A1* | 2/2013 | Afzal | H02J 13/00002 702/141 |

(Continued)

*Primary Examiner* — Nasima Monsur
(74) *Attorney, Agent, or Firm* — Ryan W. Dupuis; Michael R. Williams; Ade & Company Inc.

(57) ABSTRACT

One or more faulted conductors are identified in a power transmission system having at least two power-transmitting conductors and a fault location is determined. The methods for identifying faulted connectors and determining fault location include steps of monitoring current signals which are representative of currents in the conductors at a generally common location within the power transmission system; filtering the current signals; determining a maximum rate of change of each filtered current signal within a predetermined time interval after the fault event has commenced; and calculating a ratio of a pair of the maximum rates of change of the filtered current signals. For fault classification, the ratio is compared against a discrimination factor to identify the one or more faulted conductors. For fault location, the calculated ratio is compared against the calibration data to determine the distance from the connection terminal of the faulted conductor to the fault location.

4 Claims, 23 Drawing Sheets

Related U.S. Application Data

(60) Provisional application No. 62/754,005, filed on Nov. 1, 2018.

(51) Int. Cl.
*H02J 3/36* (2006.01)
*H02J 13/00* (2006.01)

(56) References Cited

U.S. PATENT DOCUMENTS

| | | | | |
|---|---|---|---|---|
| 2013/0128396 A1* | 5/2013 | Danesh | ............... | G01R 23/02 |
| | | | | 361/45 |
| 2016/0084893 A1* | 3/2016 | Gubba Ravikumar | ............... | |
| | | | | G01R 21/00 |
| | | | | 702/60 |

* cited by examiner

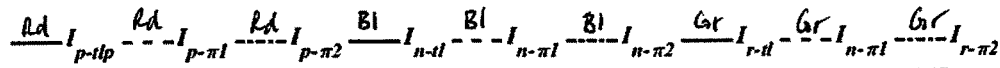
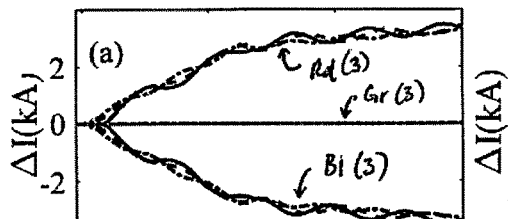
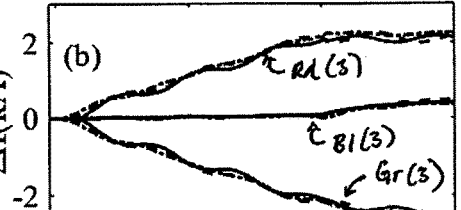
FIG. 3A  FIG. 3B  FIG. 3C  FIG. 3D
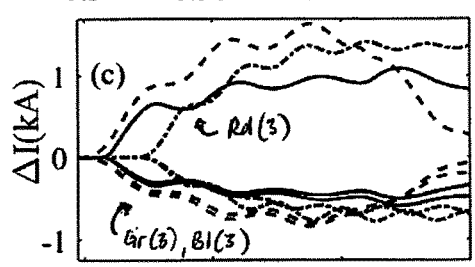
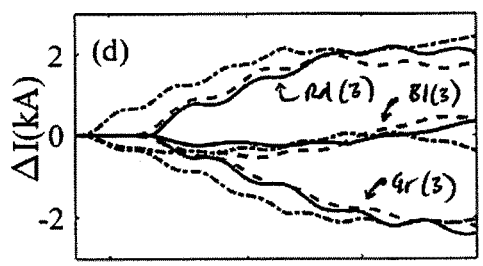
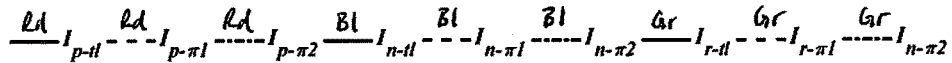
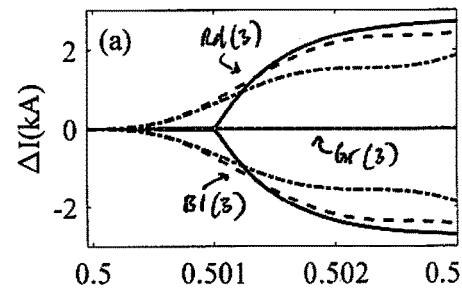
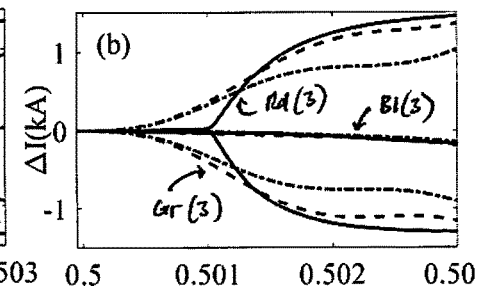
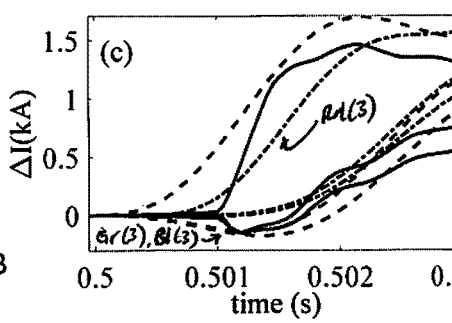
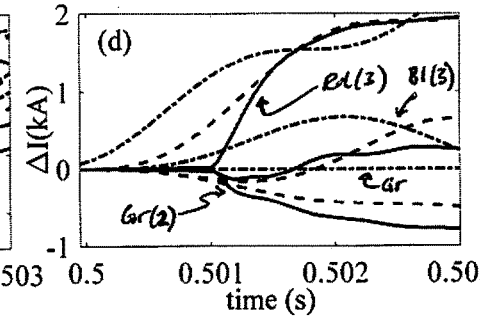
FIG. 4A  FIG. 4B  FIG. 4C  FIG. 4D

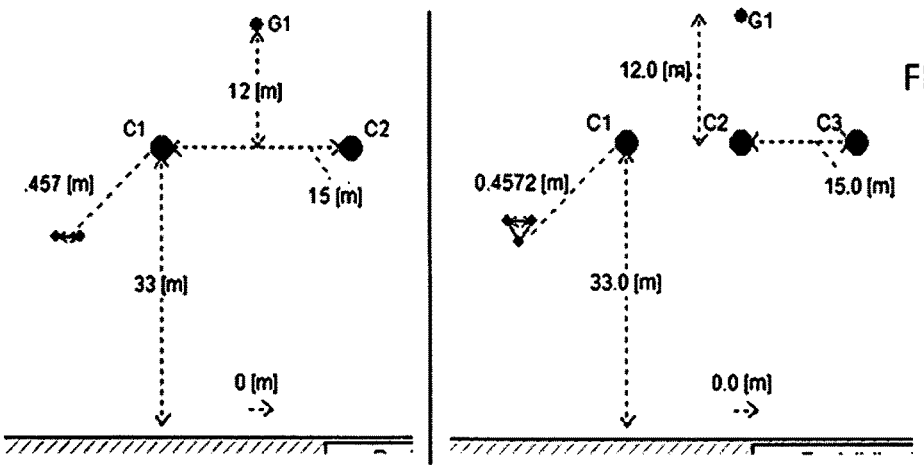
FIG. 8B
FIG. 8C
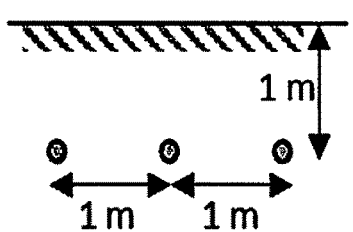
FIG. 8D
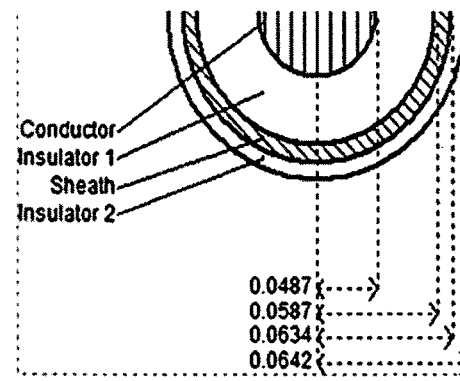
FIG. 8E
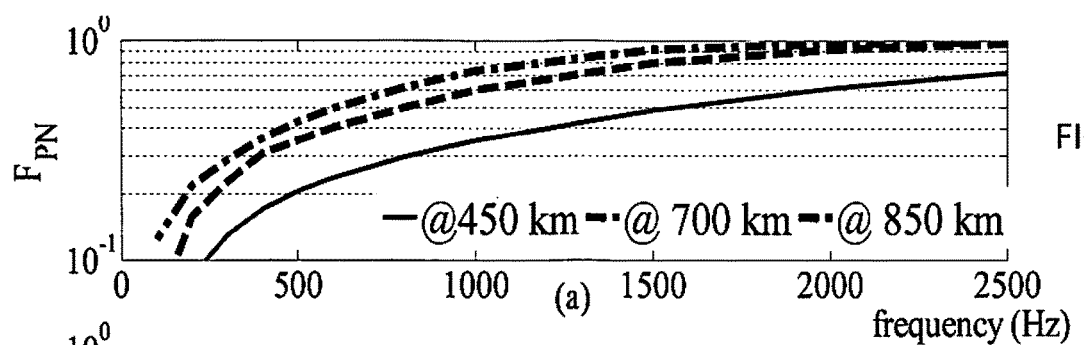
FIG. 9A
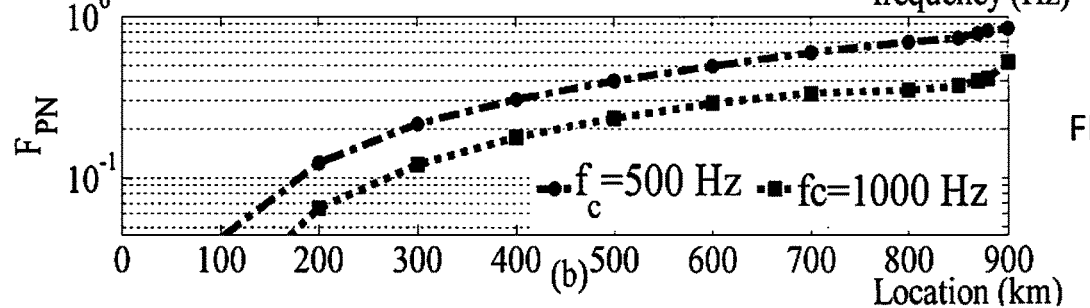
FIG. 9B

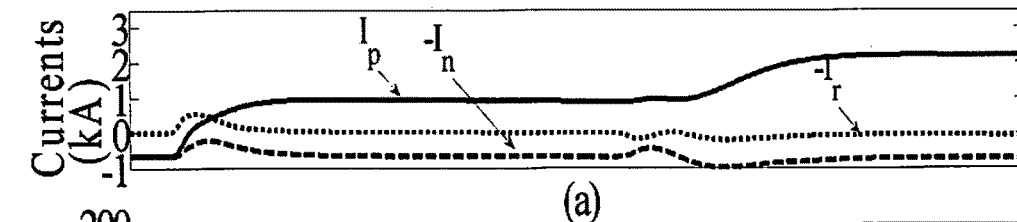
FIG. 13A
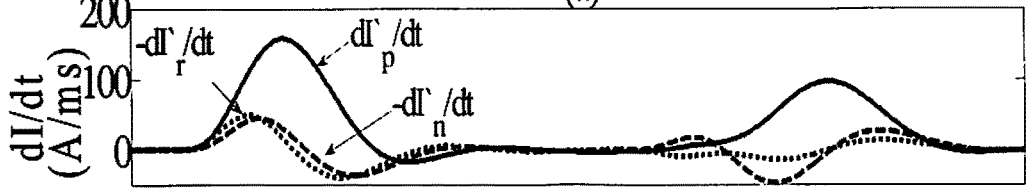
FIG. 13B
FIG. 13C
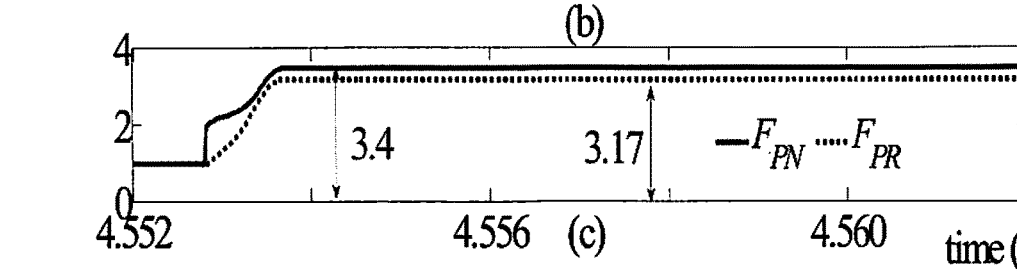
FIG. 14
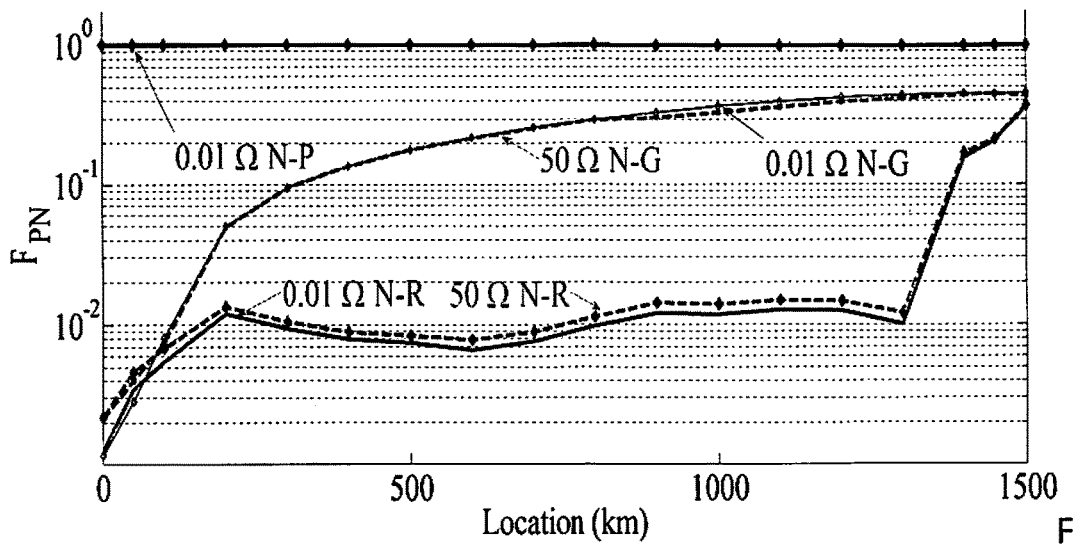
FIG. 15

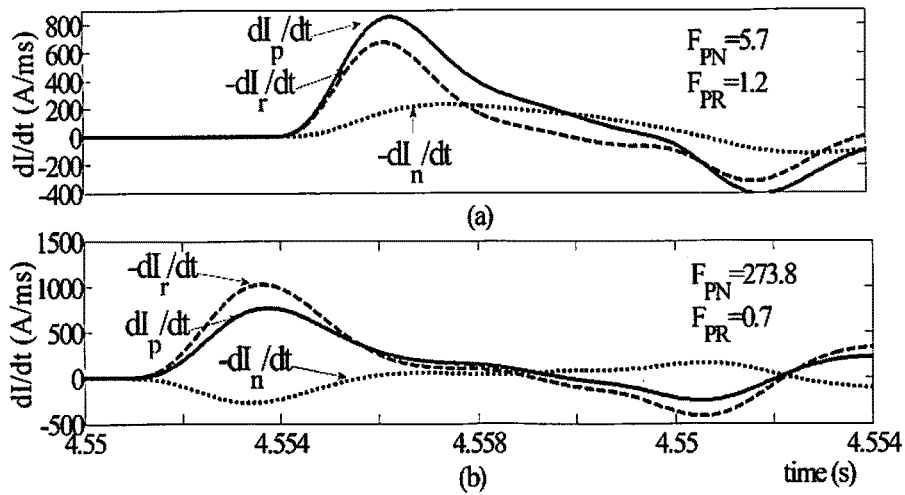
FIG. 16A
FIG. 16B
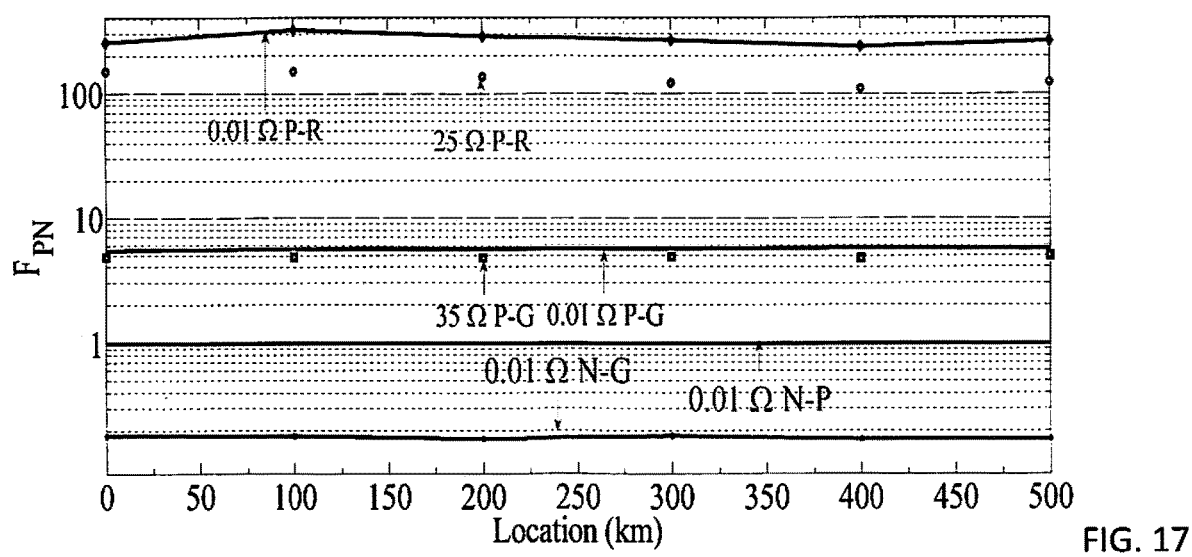
FIG. 17
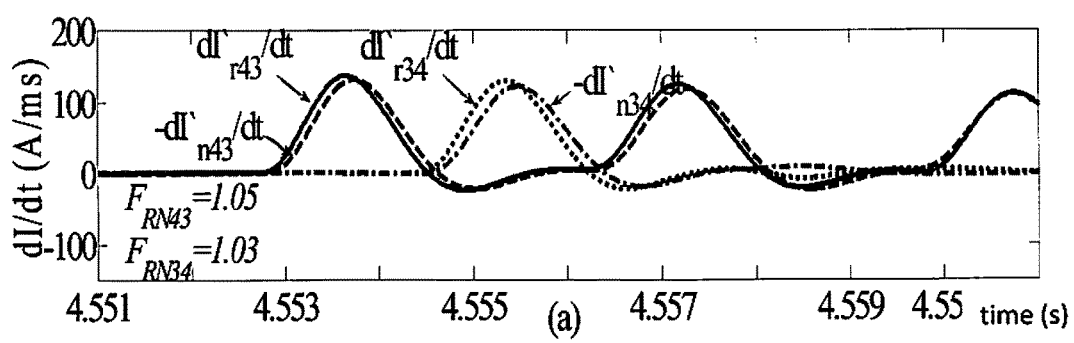
FIG. 18A

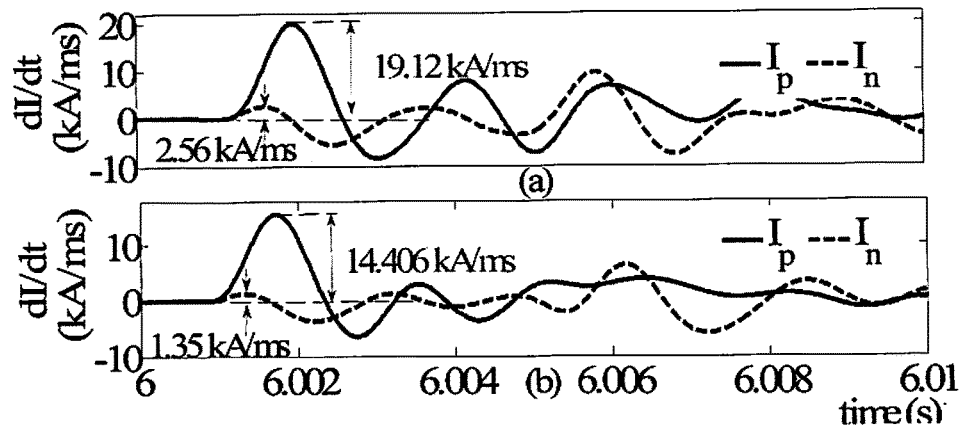
FIG. 28A
FIG. 28B
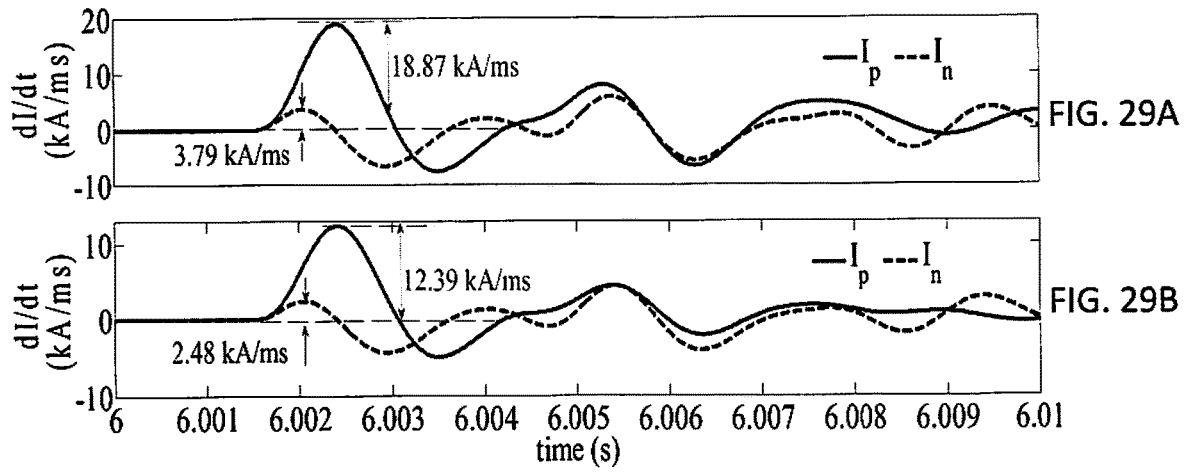
FIG. 29A
FIG. 29B
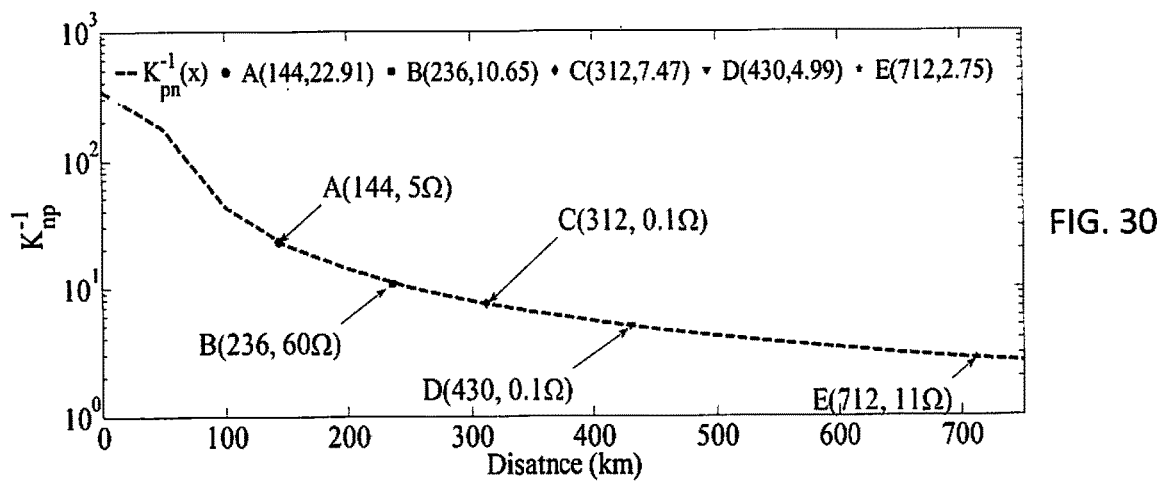
FIG. 30

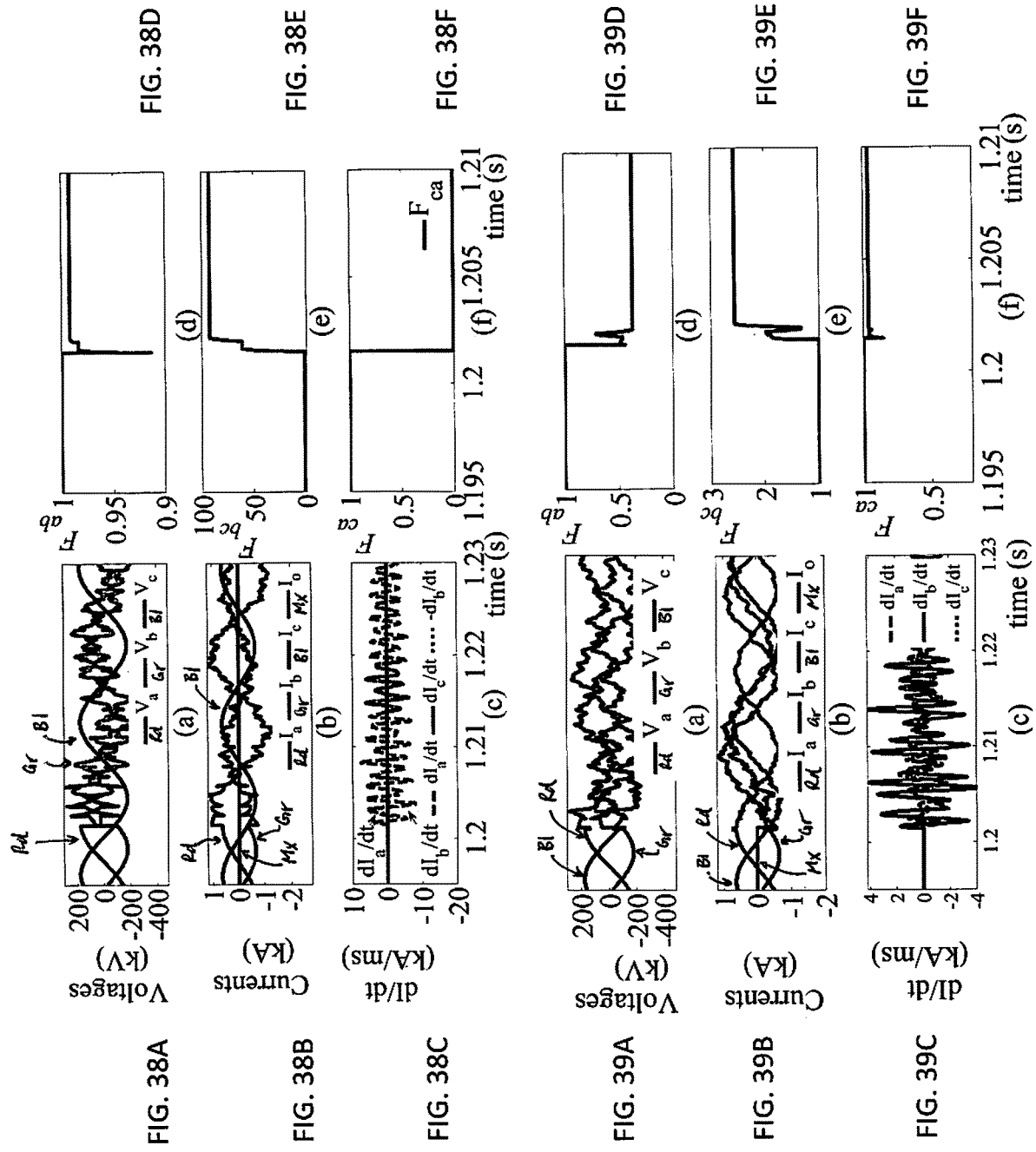

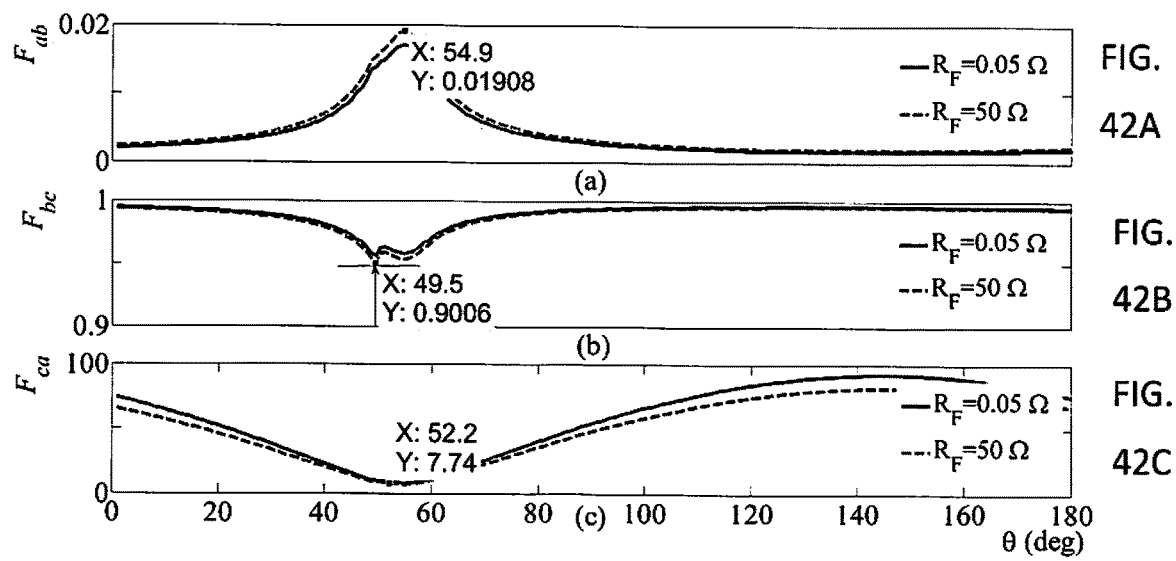
FIG. 42A
FIG. 42B
FIG. 42C
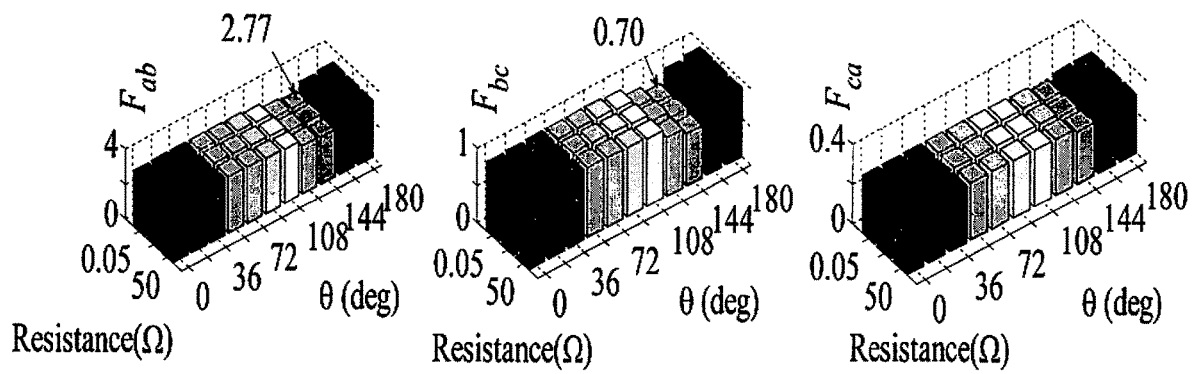
FIG. 43A  FIG. 43B  FIG. 43C
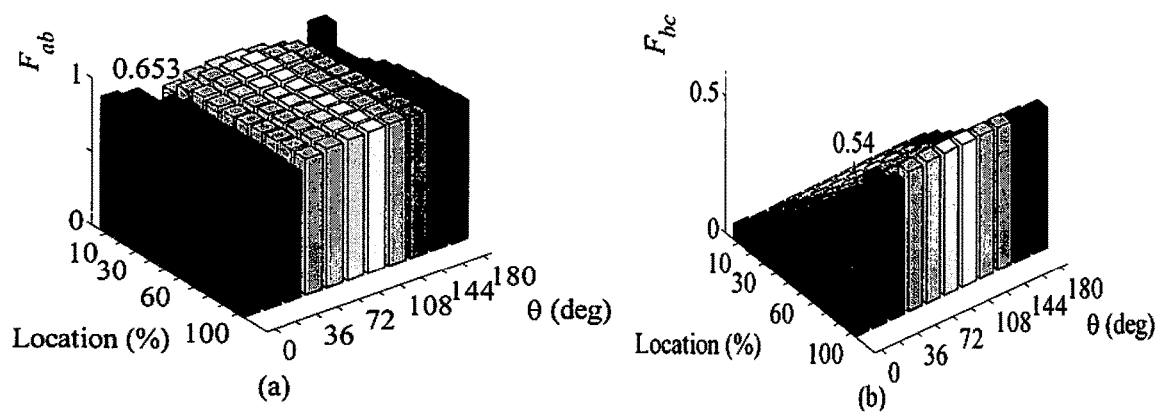
FIG. 44A  FIG. 44B

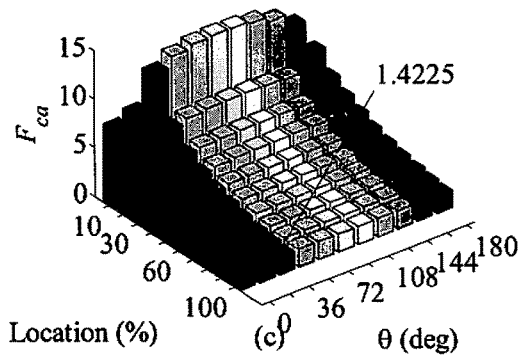
FIG. 44C
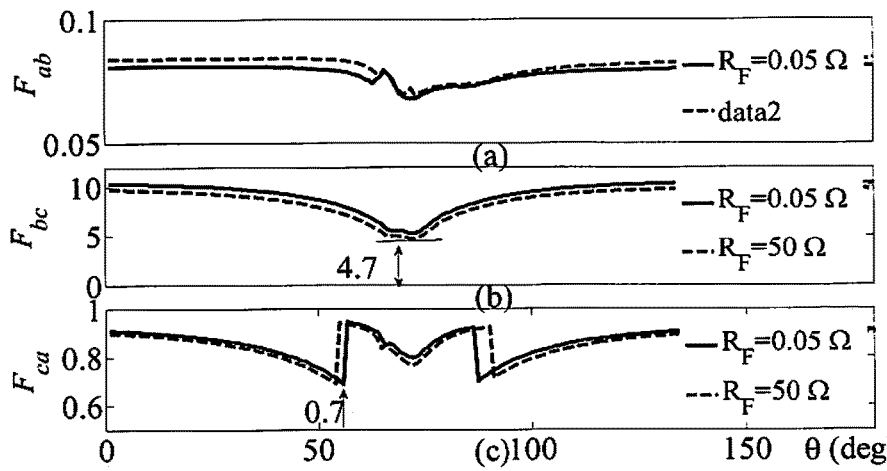
FIG. 45A
FIG. 45B
FIG. 45C
FIG. 46A
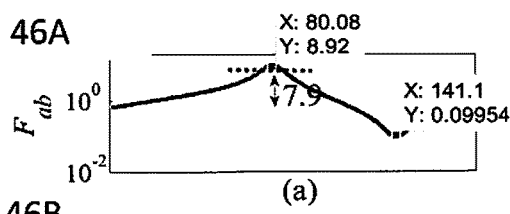
FIG. 46B
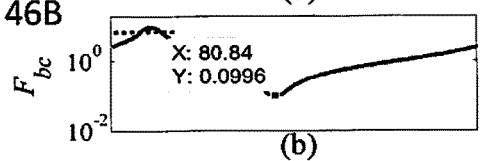
FIG. 46C
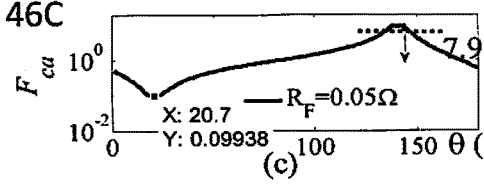
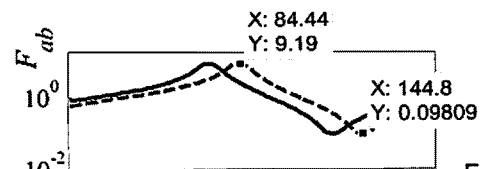
FIG. 46D
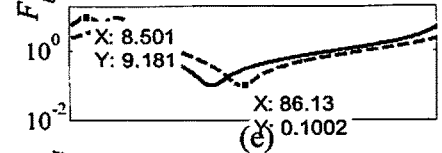
FIG. 46E
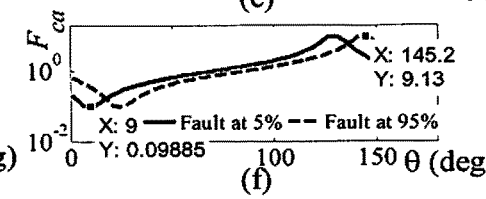
FIG. 46F

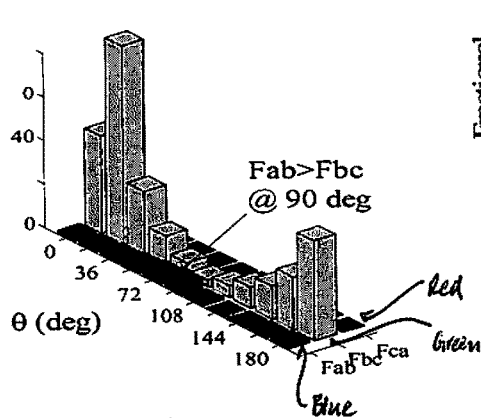
FIG. 47A
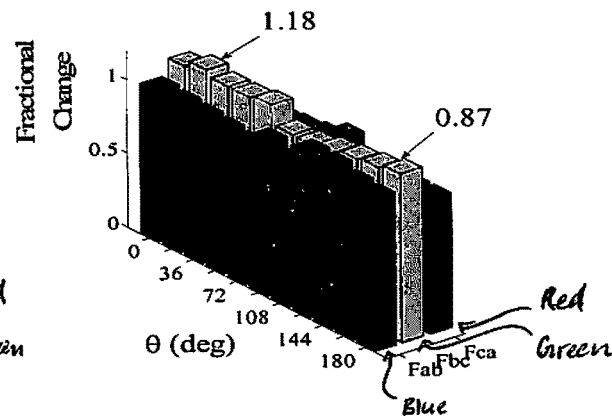
FIG. 47B
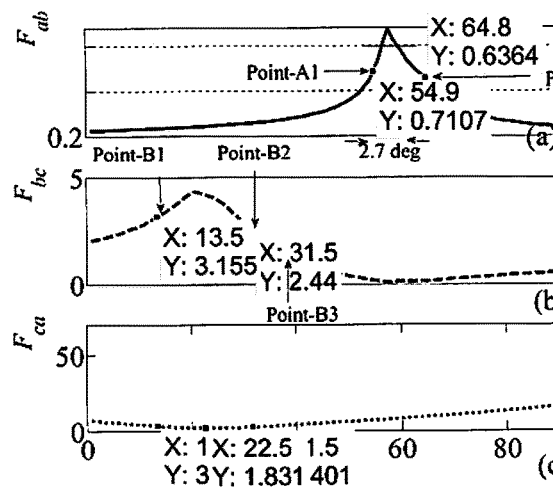
FIG. 48A
FIG. 48B
FIG. 48C
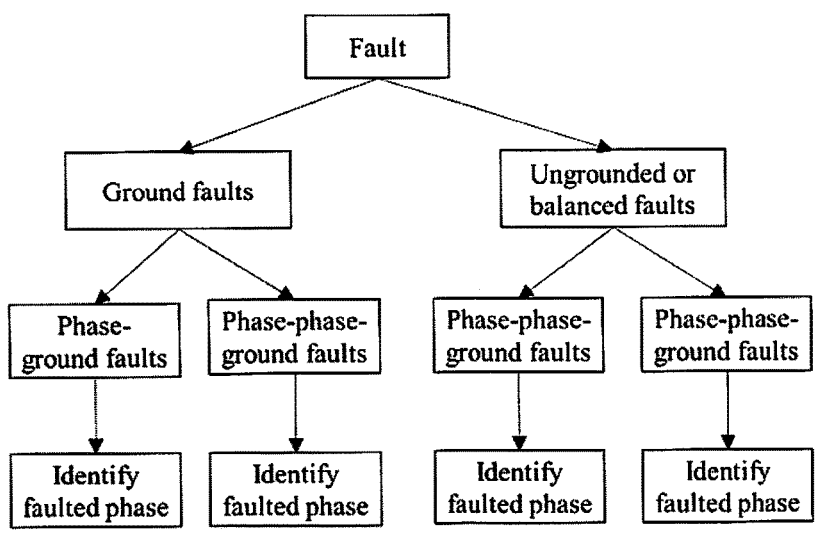
FIG. 49

METHOD FOR DETERMINING CONDUCTORS INVOLVED IN A FAULT ON A POWER TRANSMISSION LINE AND FAULT LOCATION USING LOCAL CURRENT MEASUREMENTS

This application is a continuation of U.S. patent application Ser. No. 17/287,786, filed Apr. 22, 2021, which is a national phase filing of PCT/CA2019/051556, filed Nov. 1, 2019 and which claims the benefit of U.S. Provisional Application Ser. No. 62/754,005, filed Nov. 1, 2018.

FIELD OF THE INVENTION

The present invention relates generally to power transmission systems, and more particularly to methods for determining conductors which are involved in a fault on a power transmission line and for fault location, using local current measurements.

BACKGROUND

The power industry is actively investigating HVDC grids for various applications such as transporting remote and offshore renewable energy, flexible power flow control for meeting economic and market requirements, and overcoming technical constraints in HVAC transmission systems [1]. Many traditional line commutated converter (LCC) based high capacity HVDC links are in service all over the world. Relatively new multi-level modular converter (MMC) based voltage source converter (VSC) technology is considered as the candidate for building multi-terminal HVDC (MT-HVDC) grids. Although currently there are very few multi-terminal VSC-HVDC systems in operation, the industry trend clearly indicates the expansion of MT-HVDC grids in the near future. However, challenges in DC side protection in VSC based HVDC systems is an important aspect of these systems that hinder the expansion of point-to-point DC links to VSC based MT-HVDC grids [2]-[4].

A practical HVDC transmission system can have the monopole configuration, which is realized either asymmetrically using one high voltage conductor (+ or − polarity) and a dedicated metallic return (DMR) conductor or symmetrically with two high voltage conductors. Generally, high capacity HVDC transmission systems have the bipole configuration where two conductors are operated under opposite voltage polarities, with or without a DMR conductor [5]. The advantage of the bipole configuration is the capability of temporarily switching to the monopole configuration to transmit power using the healthy pole during a single pole fault [6]. The DMR conductor in a bipole system does not carry any current under normal balanced operation, but is needed when operating in monopole mode. The DMR conductor can be omitted if temporary use of a ground return path is allowed. However, ground return operation is often restricted due to its adverse effects [7].

Prompt identification of the conductors involved in a fault is vital to exploit this redundancy in the bipole HVDC transmission configuration to minimize the disruption to power flow in the healthy parts of the system[6]. The speed of fault type identification is particularly important in VSC based bipole MT-HVDC transmission systems where fault clearing needs to be performed within several milliseconds due to rapidly rising fault currents and limited overcurrent capacity of semiconductor switching devices used in VSCs [2]. Furthermore, the extent of interruption needs to be minimized when clearing the faults in MT-HVDC grids. A number of techniques have been recently proposed to detect DC faults and identify the faulted section in MT-HVDC grids within a sub-millisecond time frame [3], [4]. These techniques, however do not explicitly address the issue of fault type identification.

Indicators such as rate of change of current (ROCOC) [8], voltage across the terminal inductor [2], [3] or rate of change of voltage (ROCOV) [4], [9] have been proposed to detect and discriminate faults in HVDC transmission systems. Although the selective isolation of the faulty pole is vital for exploiting the redundancy in bipole HVDC systems, the faulty pole identification mechanism is often implicit, and achieved by implementing the protection on a pole by pole basis [2], [10], [11]. This approach can face difficulties due to electromagnetic coupling between the conductors of a bipolar HVDC transmission system; a close-up pole-to-ground short circuit can cause a strong induced transient on the conductor of the healthy pole [11]. Since the high frequency components pass easily on to the healthy line, independent pole by pole fault detection schemes based on the high frequency current components or the derivative of voltages [9], [11], are more prone to false operation during the faults on the other pole. A typical approach to avoid false responses is to use less sensitive thresholds. In addition, various techniques such as additional filtering, modal transformation, and supervisory logic are used in practice to improve the robustness of protection schemes. The use of higher thresholds to prevent false operations (as in [3], [4]) will lower the sensitivity and selectivity. If a reliable fault type discrimination algorithm is available to supervise the main protection functions, more sensitive settings can be applied improving the protection performance.

Successful identification of the faulty pole is only part of the information required to make a protection decision. When a DMR conductor is present, if a pole-to-DMR fault cannot be discriminated from a pole-to-ground fault, it is not possible to decide whether monopole operation is safe [6]. This is also important to identify potential safety hazards for the repair crews [13]. However, discriminating a pole-to-ground fault from a pole-to-DMR fault is very challenging due to similar electrical characteristics [6]. Aerial and ground current components estimated using a transformation has been successfully used in [14], to discriminate pole-to-pole faults from pole-to-ground faults. However, a similar approach has not been developed to discriminate the pole-to-DMR faults from the pole-to-ground faults. Due to the challenging nature of the problem, artificial intelligence based fault classifiers are often proposed for HVDC transmission systems.

In delivering bulk power from large renewable resources to load centres that are separated by several hundredths to more than a thousand of kilometres, HVdc transmission is preferred option over HVac transmission. Due to cost factor, cables are avoided as much as possible and only used in highly populated urban areas or when crossing water bodies. Therefore, overhead HVdc transmission lines spanned over thousands kilometres, such as [26, 27], are not uncommon. Long distance HVdc transmission lines are very susceptible to faults as they are exposed to harsh weather conditions and inevitably passing through inaccessible terrains. Therefore, automatic fault location helps to minimize the down time and improves the system reliability by directing the repair crews to fault location immediately after a permanent transmission line fault. Bipole transmission configuration is used in many HVDC transmission systems due to the capability of delivering half of the rated power during a single pole fault. In bipole HVDC transmission systems, single pole to ground faults are more likely [29]. There are proposed HVdc fault locating schemes for only single pole faults, such as [30].

Travelling wave based fault location schemes are very common in HVDC transmission [28]. An accurate travelling wave based fault location requires precise wave front arrival time detection as well as sample measurements at higher rates. Two-terminal travelling wave fault location is considered to be more reliable as secondary reflection is not required [31]. However, in addition to challenges faced by single end travelling wave fault location, precisely synchronized measurements taken at both terminals are required. Necessity of two high bandwidth sensors at two terminals and GPS clocks to synchronize measurements increases the cost for two-terminal travelling wave based fault location. However, cost of GPS can be eliminated by using two-terminal fault location schemes works with unsynchronised measurements such as [32].

To avoid disadvantages of two-terminal travelling wave based fault location, efforts of using distinct propagation characteristics of transmission lines or behaviours of terminal voltage and/or current during a DC side fault in fault location can be found in literature. The unique relationship between the distance to fault and natural frequency has been utilized in to develop a single end fault location that needs only local current measurements. In [34], phase distortion characteristics is shown to be unique for each fault location and this property is used to develop a fault location scheme relied on single end voltage measurements. As depicted in [35], despite of fault resistance and pre-fault current, the overall shape of the voltage measurements are almost same for a specific fault location. Therefore, fault location is carried by correlating pre-stored voltage patterns recorded during faults along the line with the measured voltage pattern during a fault to be located [35]. Fault location is often carried by correlating complex features of pre-stored voltage/current measurements taken during DC side faults with the help of tools such as machine learning/artificial intelligence, examples are [36, 37]. Main drawbacks of such fault location methods are the requirement of long measurement windows, typically taken with high bandwidth sensors, and measurements for many fault scenarios to extract features.

Transient-based protection techniques offer certain advantages over the traditional fundamental frequency phasor based protection algorithms, and are being actively investigated [38]. Types of decisions made in a transient based protection relay includes detecting the presence of a fault, identifying the phases involved in the fault, and making sure that the fault is within the protected zone. Identifying phases involved in the fault, often-called phase selection, is a challenging task as it has to be completed within the sub-cycle period during which the fault transients exist. A fault generated transient signal is influenced by many factors such as the fault inception angle, fault resistance, and the location of fault in addition to the fault type itself [39]. If traditional power frequency based phase selection algorithms are employed with transient based fault detection and discrimination schemes, the speed advantage of transient based protection will be lost [40]. Therefore, high frequency fault generated transients that contains information of fault type among others, is often used in fault classification as proposed in [38]-[41]. Rapid development of hardware such as high speed digital signal processing (DSP) chips and high speed microprocessor chips makes it possible to implement such algorithms at low cost [38].

Wavelet transform (WT) is a tool that is often used to capture the high-frequency traveling waves for fault detection, classification, and phase selection [41], and examples can be found in [38] and [42]. Due to challenging nature of complex feature extraction and classification, WT based systems are often used with tools like artificial neural networks (ANN) [38, 39], or fuzzy logic in fault classification. Design of systems with customized fault classifiers using such techniques is a very complicated task as they demand large sets of training data and time consuming training [41].

SUMMARY OF THE INVENTION

According to an aspect of the invention there is provided a method for identifying one or more faulted conductors when a fault event has occurred in a power transmission system in which at least two of the conductors transmit power, the method comprising:

monitoring current signals which are representative of currents in the conductors at a generally common location within the power transmission system;

filtering the current signals to produce filtered current signals;

determining a maximum rate of change of each filtered current signal within a predetermined time interval after the fault event has commenced;

calculating a ratio of a pair of the maximum rates of change of the filtered current signals; and comparing the ratio against a discrimination factor to identify the one or more faulted conductors.

In one arrangement this method further includes disconnecting the identified one or more faulted conductors so as to interrupt fault currents generated as a result of the fault event.

In one arrangement this method further determining a rate of change of the filtered current signal of at least one of the conductors and comparing a sum thereof to a fixed threshold value to validate that the fault event has occurred.

In one arrangement the predetermined time interval has a duration between about 0.2 and about 2.0 milliseconds.

Preferably, in such an arrangement, the predetermined time interval is about 1.0 milliseconds.

In an arrangement, when the power transmission system is a high voltage direct current (HVDC) transmission system having two power-transmitting conductors and no return conductor, the power-transmitting conductors being operably connected between two sets of power converter stations so as to transmit the power along the power-transmitting conductors from a first one of the two sets of power converter stations to a second one of the two sets of power converter stations:

monitoring the current signals comprises measuring the current in each one of the power-transmitting conductors at or generally in proximity to a common selected one of the first and second sets of power converter stations;

the ratio of a pair of the maximum rates of change of the filtered current signals is formed by dividing the maximum rate of change of the filtered current signal of a first one of the power-transmitting conductors assuming a positive current direction through the first power-transmitting conductor so as to be assigned a positive value, by the maximum rate of change of the filtered current signal of a second one of the power-transmitting conductors assuming a negative current direction through the second power-transmitting conductor so as to be assigned a negative value, where the positive current direction through the first power-transmitting conductor is taken as flowing out of the selected set of power converter stations and the negative current direction through the second power-transmitting conductor is taken as flowing into the selected set of power converter stations; and comparing the ratio against a discrimination factor to identify the one or more faulted conductors comprises:

checking whether the ratio is greater than or equal to the discrimination factor or less than or equal to an inverse of the discrimination factor, and if the ratio is greater than or equal to the discrimination factor then determining that the first conductor is the only faulted conductor, or if the ratio is less than or equal to the inverse of the discrimination factor then determining that the second conductor is the only faulted conductor.

In one such arrangement, when the discrimination factor is greater than one, if the ratio is neither greater than or equal to the discrimination factor nor less than or equal to the inverse thereof then determining that both the first and second conductors are faulted.

In one arrangement, when the power transmission system is a high voltage direct current (HVDC) transmission system having two power-transmitting conductors and a return conductor, the power-transmitting conductors and the return conductor being operably connected between two sets of power converter stations so as to transmit the power along the power-transmitting conductors from a first one of the two sets of power converter stations to a second one of the two sets of power converter stations with the return conductor defining a return path for the current from the second set of power converter stations to the first set of power converter stations:

monitoring the current signals comprises measuring the current in each one of the conductors at or generally in proximity to a common selected one of the first and second sets of power converter stations;

the ratio of a pair of the maximum rates of change of the filtered current signals comprises (i) a first ratio formed by dividing the maximum rate of change of the filtered current signal of a first one of the power-transmitting conductors assuming a positive current direction through the first power-transmitting conductor so as to be assigned a positive value, by the maximum rate of change of the filtered current signal of a second one of the power-transmitting conductors assuming a negative current direction through the second power-transmitting conductor so as to be assigned a negative value, where the positive current direction through the first power-transmitting conductor is taken as flowing out of the selected set of power converter stations and the negative current direction through the second power-transmitting conductor is taken as flowing into the selected set of power converter stations; (ii) a second ratio formed by dividing the maximum rate of change of the filtered current signal of the first power-transmitting conductor assuming the positive current direction therethrough by the maximum rate of change of the filtered current signal of the return conductor assuming a negative current direction through the return conductor so as to be assigned a negative value, where the negative current direction through the return conductor is taken as flowing into the selected set of power converter stations; and (iii) a third ratio formed by dividing the maximum rate of change of the filtered current signal of the return conductor assuming a positive current direction through the return conductor so as to be assigned a positive value, by the maximum rate of change of the filtered current signal of the second power-transmitting conductor assuming the negative current direction therethrough, where the positive current direction through the return conductor is taken as flowing out of the selected set of power converter stations; and comparing the ratio against a discrimination factor to identify the one or more faulted conductors comprises:

checking whether the first ratio is greater than or equal to a first discrimination factor, and if true then determining that the one or more faulted conductors includes the first power-transmitting conductor, or if false then determining that the one or more faulted conductors includes the second power-transmitting conductor.

In one such arrangement, if it is determined that the one or more faulted conductors includes the first power-transmitting conductor, the step of comparing the ratio against a discrimination factor further comprises:

checking whether the second ratio is less than or equal to a second discrimination factor, and if true then determining that the first power-transmitting conductor and the return conductor are faulted but not to ground, or if false then determining the first power-transmitting conductor is faulted to ground.

In one such arrangement, if it is determined that the first power-transmitting conductor is faulted to ground, the step of comparing the ratio against a discrimination factor further comprises:

calculating a fourth ratio formed by dividing the maximum rate of change of the filtered current signal of the return conductor assuming the negative current direction therethrough by the maximum rate of change of the filtered current signal of the second power-transmitting conductor assuming the negative current direction therethrough; and checking whether the fourth ratio is less than or equal to a third discrimination factor, and if true then determining that the first power-transmitting conductor is the only faulted conductor which is faulted to ground, or if false then determining that the first power-transmitting conductor and the return conductor are faulted to ground.

In one such arrangement, if it is determined that the one or more faulted conductors includes the second power-transmitting conductor, the step of comparing the ratio against a discrimination factor further comprises:

checking whether the first ratio is less than or equal to an inverse of the first discrimination factor, and if false then determining that both the first and second power-transmitting conductors are faulted; or if true then determining that the first power-transmitting conductor is not faulted.

In one such arrangement, if it is determined that the first power-transmitting conductor is not faulted, the step of comparing the ratio against a discrimination factor further comprises:

checking whether the third ratio is greater than or equal to an inverse of the second discrimination factor, and if true then determining that the second power-transmitting conductor and the return conductor are faulted but not to ground, or if false then determining that the second power-transmitting conductor is faulted to ground.

In one such arrangement, if it is determined that the second power-transmitting conductor is faulted to ground, the step of comparing the ratio against a discrimination factor further comprises:

calculating a fifth ratio formed by dividing the maximum rate of change of the filtered current signal of the first power-transmitting conductor assuming the positive current direction therethrough by the maximum rate of change of the filtered current signal of the return conductor assuming the positive current direction therethrough; and checking whether the fifth ratio is greater than or equal to an inverse of the third discrimination factor, and if true then determining that the second power-transmitting conductor is the only faulted conductor which is faulted to ground, or if false then determining that the second power-transmitting conductor and the return conductor are faulted to ground.

In one of the foregoing arrangements, when the power transmission system is HVDC with a return conductor, the first, second and third discrimination factors are greater than one.

In one of the foregoing arrangements, when the power transmission system is HVDC, and when only one of the power-transmitting conductors is faulted such that said only one power-transmitting conductor is faulted to ground, and wherein the currents in the power-transmitting conductors are measured at connection terminals thereof located at the selected set of power converter stations, the method further includes:

providing predetermined calibration data which comprises a plurality of ratios of maximum rates of change of current of the first and second power-transmitting conductors, each ratio being representative of a fault at a corresponding distance from the connection terminal of the faulted conductor; and comparing the calculated first ratio against the calibration data to predict the distance from the connection terminal of the faulted conductor to fault location.

In one such arrangement, when the faulted conductor comprises (i) a first length thereof spanning from the connection terminal of the faulted conductor where the current therein was measured to an opposite remote connection terminal at a remote location within the power transmission system and (ii) a subsequent series of lengths of the faulted conductor operatively connected to the remote connection terminal of the first length so as to transmit power beyond the remote connection terminal of the first length to a farther location within the power transmission system, the method further includes:

checking whether the predicted distance is less than the first length of the faulted conductor between the opposite connection terminals thereof, and if true then determining that the fault is located along the first length of the faulted conductor, or if false then determining that the fault is located along the subsequent series of lengths of the faulted conductor;

and if the fault is determined to be located along the first length of the faulted conductor, disconnecting the first length of the faulted conductor so as to interrupt fault currents generated as a result of the fault event.

In such arrangements, the method may further include dispatching a fault-clearing crew to the predicted fault location to repair the faulted conductor.

In one such arrangement, the calibration data is derived from a computer simulation model of the power transmission system.

In one such arrangement, comparing the first ratio against the calibration data comprises checking the first ratio against a lookup table containing the calibration data.

In one arrangement, when the power transmission system is a high voltage direct current (HVDC) transmission system, filtering the current signal of each one of the conductors comprises applying a low pass filter having a cut-off frequency between about 300 Hz and 1 kHz to the current signal of each one of the conductors.

In one such arrangement, the cut-off frequency of the low pass filter is in the order of about 500 Hz.

In one arrangement, when the power transmission system is a three-phase high voltage alternating current (HVAC) transmission system having three power-transmitting conductors, the power-transmitting conductors being operably connected between two sets of nodes so as to transmit the power along the power-transmitting conductors from a first one of the two sets of nodes to a second one of the two sets of nodes:

monitoring the current signals comprises measuring the current in each one of the power-transmitting conductors at or generally in proximity to a common selected one of the first and second sets of nodes;

the ratio of a pair of the maximum rates of change of the filtered current signals comprises (i) a first ratio formed by dividing the maximum of an absolute value of the rate of change of the filtered current signal of a first one of the power-transmitting conductors by the maximum of an absolute value of the rate of change of the filtered current signal of a second one of the power-transmitting conductors; (ii) a second ratio formed by dividing the maximum of an absolute value of the rate of change of the filtered current signal of the second power-transmitting conductor by the maximum of an absolute value of the rate of change of the filtered current signal of a third one of the power-transmitting conductors; and (iii) a third ratio formed by dividing the maximum of an absolute value of the rate of change of the filtered current signal of the third power-transmitting conductor by the maximum of an absolute value of the rate of change of the filtered current signal of the first power-transmitting conductor;

the method further includes determining a residual current at the selected set of nodes, the residual current being defined as a sum of the currents in the three power-transmitting conductors; and comparing the ratio against a discrimination factor to identify the one or more faulted conductors comprises:

checking whether the residual current is less than a prescribed threshold, and if true then determining that the one or more faulted conductors comprise at least two faulted conductors, or if false then determining that the one or more faulted conductors comprise no more than two conductors which are faulted to ground.

In one such arrangement, if it is determined that the one or more faulted conductors comprise at least two faulted conductors, the step of comparing the ratio against a discrimination factor further comprises:

checking whether (i) the first ratio is greater than or equal to a first discrimination factor, (ii) the first ratio is less than or equal to a second discrimination factor, (iii) the second ratio is greater than a third discrimination factor, and (iv) the third ratio is less than a fourth discrimination factor, and if true then determining that the first and second conductors are faulted but not to ground, or if false then determining that another set of the conductors is faulted.

In one such arrangement, if it is determined that the one or more faulted conductors comprise at least two faulted conductors, the step of comparing the ratio against a discrimination factor further comprises:

checking whether (i) the second ratio is greater than or equal to the first discrimination factor, (ii) the second ratio is less than or equal to the second discrimination factor, (iii) the third ratio is greater than the third discrimination factor, and (iv) the first ratio is less than the fourth discrimination factor, and if true then determining that the second and third conductors are faulted but not to ground, or if false then determining that another set of the conductors is faulted.

In one such arrangement, if it is determined that the one or more faulted conductors comprise at least two faulted conductors, the step of comparing the ratio against a discrimination factor further comprises:

checking whether (i) the third ratio is greater than or equal to the first discrimination factor, (ii) the third ratio is less than or equal to the second discrimination factor, (iii) the first ratio is greater than the third discrimination factor, and (iv) the second ratio is less than the fourth discrimination factor, and if true then determining that the first and third conductors are faulted but not to ground, or if false then determining that another set of the conductors is faulted.

In one such arrangement, if it is determined that the one or more faulted conductors comprise at least two faulted conductors, the step of comparing the ratio against a discrimination factor further comprises:

checking whether (i) the first ratio is greater than or equal to a first discrimination factor, (ii) the first ratio is less than or equal to a second discrimination factor, (iii) the second ratio is greater than a third discrimination factor, (iv) the third ratio is less than a fourth discrimination factor, (v) the second ratio is greater than or equal to the first discrimination factor, (vi) the second ratio is less than or equal to the second discrimination factor, (vii) the third ratio is greater than the third discrimination factor, (viii) the first ratio is less than the fourth discrimination factor, (ix) the third ratio is greater than or equal to the first discrimination factor, (x) the third ratio is less than or equal to the second discrimination factor, (xi) the first ratio is greater than the third discrimination factor, and (xii) the second ratio is less than the fourth discrimination factor, and if false then determining that the first, second and third conductors are faulted.

In one such arrangement, if it is determined that the one or more faulted conductors comprise no more than two conductors which are faulted to ground, the step of comparing the ratio against a discrimination factor further comprises:

checking whether (i) the second ratio is greater than or equal to a fifth discrimination factor, (ii) the second ratio is less than or equal to a sixth discrimination factor, (iii) the first ratio is greater than a seventh discrimination factor, and (iv) the third ratio is less than an eighth discrimination factor, and if true then determining that the first conductor is the only faulted conductor which is faulted to ground, or if false then determining that another set of no more than two conductors is faulted to ground.

In one such arrangement, if it is determined that the one or more faulted conductors comprise no more than two conductors which are faulted to ground, the step of comparing the ratio against a discrimination factor further comprises:

checking whether (i) the third ratio is greater than or equal to the fifth discrimination factor, (ii) the third ratio is less than or equal to the sixth discrimination factor, (iii) the second ratio is greater than the seventh discrimination factor, and (iv) the first ratio is less than the eighth discrimination factor, and if true then determining that the second conductor is the only faulted conductor which is faulted to ground, or if false then determining that another set of no more than two conductors is faulted to ground.

In one such arrangement, if it is determined that the one or more faulted conductors comprise no more than two conductors which are faulted to ground, the step of comparing the ratio against a discrimination factor further comprises:

checking whether (i) the second ratio is greater than or equal to a fifth discrimination factor, (ii) the second ratio is less than or equal to a sixth discrimination factor, (iii) the first ratio is greater than a seventh discrimination factor, (iv) the third ratio is less than an eighth discrimination factor, (v) the third ratio is greater than or equal to the fifth discrimination factor, (vi) the third ratio is less than or equal to the sixth discrimination factor, (vii) the second ratio is greater than the seventh discrimination factor, (viii) the first ratio is less than the eighth discrimination factor, (ix) the first ratio is greater than or equal to the fifth discrimination factor, (x) the first ratio is less than or equal to the sixth discrimination factor, (xi) the third ratio is greater than the seventh discrimination factor, and (xii) the second ratio is less than the eighth discrimination factor, and if false then additionally checking whether the first ratio is greater than each of the second and third ratios, and if true then additionally checking whether the second ratio is greater than one, and if true then determining that the first and second conductors are faulted to ground, or if false then determining that the first and third conductors are faulted to ground;

and if the first ratio is not greater than each of the second and third ratios then additionally checking whether the second ratio is greater than each of the first and third ratios, and if true then additionally checking whether the third ratio is greater than one, and if true then determining that the second and third conductors are faulted to ground, or if false then determining that the first and second conductors are faulted to ground;

and if the second ratio is not greater than each of the first and third ratios then additionally checking whether the first ratio is greater than one, and if true then determining that the first and third conductors are faulted to ground, or if false then determining that the second and third conductors are faulted to ground.

In one of the foregoing arrangements, when the power transmission system is HVAC, the first, fourth, fifth and eighth discrimination factors are less than one.

In one of the foregoing arrangements, when the power transmission system is HVAC, the second, third, sixth and seventh discrimination factors are greater than one.

In one arrangement, when the power transmission system is a three-phase high voltage alternating current (HVAC) transmission system having three power-transmitting conductors, the power-transmitting conductors being operably connected between two sets of nodes so as to transmit the power along the power-transmitting conductors from a first one of the two sets of nodes to a second one of the two sets of nodes:

monitoring the current signals comprises:
measuring the current in each one of the conductors at or generally in proximity to a common selected one of the first and second sets of nodes;
determining for each one of the conductors a pair of modal current components based on predetermined weightings of the currents measured in the three conductors such that the current signals that are representative of the currents in the conductors are substantially free of mutual coupling between the power-transmitting conductors;
determining a modal residual current component defined as one-third of a residual current at the selected set of nodes, the residual current being defined as a sum of the currents in the three conductors;
the ratio of a pair of the maximum rates of change of the filtered current signals comprises a plurality of ratios for each one of the conductors including (i) a first ratio formed by dividing the maximum of an absolute value of the rate of change of the modal residual current component by the maximum of an absolute value of the rate of change of a first one of the modal current components of said each one of the conductors; (ii) a second ratio formed by dividing the maximum of the absolute value of the rate of change of the first modal current component of said each one of the conductors by the maximum of an absolute value of the rate of change of a second one of the modal current components of said each one of the conductors; and (iii) a third ratio formed by dividing the maximum of the absolute value of the rate of change of the second modal current component of said each one of the conductors by the maximum of the absolute value of the rate of change of the first modal current component of said each one of the conductors;
comparing the ratio against a discrimination factor to identify the one or more faulted conductors comprises:
checking whether the first ratio of any one of the three conductors is greater than a first discrimination factor, and
if true then determining that the one or more faulted conductors comprise no more than two conductors which are faulted to ground, or
if false then determining that the one or more faulted conductors comprise at least two faulted conductors.

In one such arrangement, if it is determined that the one or more faulted conductors comprise no more than two conductors which are faulted to ground, the step of comparing the ratio against a discrimination factor further comprises:
checking whether a sum of the second ratios of the three conductors is greater than a second discrimination factor, and
if true then determining that only one of the conductors is faulted to ground, or
if false then determining that two of the conductors are faulted to ground.

In one such arrangement, if it is determined that only one of the conductors is faulted to ground, the step of comparing the ratio against a discrimination factor further comprises:
checking whether (i) the second ratio of a first one of the conductors is greater than a third discrimination factor, (ii) the second ratio of a second one of the conductors is less than the third discrimination factor, and (iii) the second ratio of a third one of the conductors is less than the third discrimination factor, and
if true then determining that the first conductor is the only conductor faulted to ground, or
if false then determining that another one of the conductors is faulted to ground.

In one such arrangement, if it is determined that one of the conductors is faulted to ground, the step of comparing the ratio against a discrimination factor further comprises:
checking whether (i) the second ratio of the first conductor is less than the third discrimination factor, (ii) the second ratio of the second conductor is greater than the third discrimination factor, and (iii) the second ratio of the third conductor is less than the third discrimination factor, and
if true then determining that the second conductor is the only conductor faulted to ground, or
if false then determining that another one of the conductors is faulted to ground.

In one such arrangement, if it is determined that one of the conductors is faulted to ground, the step of comparing the ratio against a discrimination factor further comprises:
checking whether (i) the second ratio of the first conductor is less than the third discrimination factor, (ii) the second ratio of the second conductor is less than the third discrimination factor, and (iii) the second ratio of the third conductor is greater than the third discrimination factor, and
if true then determining that the third conductor is the only conductor faulted to ground, or
if false then determining that another one of the conductors is faulted to ground.

In one such arrangement, if it is determined that two conductors are faulted to ground, the step of comparing the ratio against a discrimination factor further comprises:
checking whether (i) the second ratio of the first conductor is greater than the second ratio of the third conductor and (ii) the second ratio of the second conductor is greater than the second ratio of the third conductor, and
if true then determining that the first and second conductors are the only conductors faulted to ground, or
if false then determining that another set of the conductors is faulted to ground.

In one such arrangement, if it is determined that two of the conductors are faulted to ground, the step of comparing the ratio against a discrimination factor further comprises:
checking whether (i) the second ratio of the first conductor is greater than the second ratio of the second conductor and (ii) the second ratio of the third conductor is greater than the second ratio of the second conductor, and
if true then determining that the first and third conductors are the only conductors faulted to ground, or
if false then determining that another set of the conductors is faulted to ground.

In one such arrangement, if it is determined that two of the conductors are faulted to ground, the step of comparing the ratio against a discrimination factor further comprises:
checking whether (i) the second ratio of the second conductor is greater than the second ratio of the first conductor and (ii) the second ratio of the third conductor is greater than the second ratio of the first conductor, and
if true then determining that the second and third conductors are the only conductors faulted to ground, or
if false then determining that another set of the conductors is faulted to ground.

In one such arrangement, if it is determined the one or more faulted conductors comprise at least two faulted conductors, the step of comparing the ratio against a discrimination factor further comprises:
checking whether a sum of the third ratios of the three conductors is greater than the second discrimination factor, and
if true then determining only two of the conductors are faulted but not to ground, or
if false then determining that the first, second and third conductors are faulted.

In one such arrangement, if it is determined that only two of the conductors are faulted but not to ground, the step of comparing the ratio against a discrimination factor further comprises:
checking whether (i) the third ratio of the first conductor is less than the third discrimination factor, (ii) the third ratio of the second conductor is less than the third discrimination factor, and (iii) the third ratio of the third conductor is greater than the third discrimination factor, and
if true then determining that the first and second conductors are faulted but not to ground, or
if false then determining that another set of the conductors is faulted but not to ground.

In one such arrangement, if it is determined that only two of the conductors are faulted but not to ground, the step of comparing the ratio against a discrimination factor further comprises:
checking whether (i) the third ratio of the first conductor is greater than the third discrimination factor, (ii) the third ratio of the second conductor is less than the third discrimination factor, and (iii) the third ratio of the third conductor is less than the third discrimination factor, and
if true then determining that the second and third conductors are faulted but not to ground, or
if false then determining that another set of the conductors is faulted but not to ground.

In one such arrangement, if it is determined that only two of the conductors are faulted but not to ground, comparing the ratio against a discrimination factor further comprises:
checking whether (i) the third ratio of the first conductor is less than the third discrimination factor, (ii) the third ratio of the second conductor is greater than the third discrimination factor, and (iii) the third ratio of the third conductor is less than the third discrimination factor, and
if true then determining the first and third conductors are faulted but not to ground, or
if false then determining another set of the conductors is faulted but not to ground.

In one such arrangement the first discrimination factor lies in a range from about 0.85 to about 0.95.

In one such arrangement the second discrimination factor lies in a range from about 50 to about 150.

In one such arrangement the third discrimination factor lies in a range from about 1 to about 10.

In one of the foregoing arrangements, when the power transmission system is a three-phase high voltage alternating current (HVAC) transmission system, filtering the current signal of each one of the conductors comprises applying a band pass filter having a lower cut-off frequency between about 250 Hz and about 500 Hz and an upper cut-off frequency between about 1000 Hz and about 2000 Hz to the current signal of each one of the conductors.

According to another aspect of the invention there is provided a method for determining fault location when a fault event has occurred along one of a pair of power-transmitting conductors of a power transmission system, the method comprising:
monitoring current signals which are representative of currents in the conductors at adjacent connection terminals which are located at a generally common location within the power transmission system;
filtering the current signal of each conductor to produce a filtered current signal of each conductor;
determining a maximum rate of change of the filtered current signal of each conductor within a predetermined time interval after the fault event has commenced;
calculating a ratio of the maximum rates of change of the filtered current signals;
providing predetermined calibration data which comprises a plurality of ratios of maximum rates of change of current of the pair of conductors, each ratio being representative of a fault at a corresponding distance from the connection terminal of the faulted conductor;
comparing the calculated ratio against the calibration data to determine the distance from the connection terminal of the faulted conductor to the fault location.

In one arrangement, when the faulted conductor comprises (i) a first length thereof spanning from the connection terminal of the faulted conductor where the current therein was measured to an opposite remote connection terminal at a remote location within the power transmission system, and (ii) a subsequent series of lengths of the faulted conductor operatively connected to the remote connection terminal of the first length so as to transmit power beyond the remote connection terminal of the first length to a farther location within the power transmission system, the method further includes:
checking whether the predicted distance is less than the first length of the faulted conductor between the opposite connection terminals thereof, and
if true then determining that the fault is located along the first length of the faulted conductor; or
if false then determining that the fault is located along the subsequent series of lengths of the faulted conductor;
and if the fault is determined to be located along the first length of the faulted conductor, disconnecting the first length of the faulted conductor so as to interrupt fault currents generated as a result of the fault event.

In one arrangement the calibration data is derived from a computer simulation model of the power transmission system.

In one arrangement comparing the calculated ratio against the calibration data comprises checking the calculated ratio against a lookup table containing the calibration data.

In one arrangement the method further includes dispatching a fault-clearing crew to the predicted fault location to repair the faulted conductor.

BRIEF DESCRIPTION OF THE DRAWINGS

The invention will now be described in conjunction with the accompanying drawings in which:

FIGS. 3A through 3D show changes in the conductor currents at the ungrounded MMC for $F_1$, $F_2$, $F_3$, and $F_4$, respectively, as shown in FIG. 1B;

FIGS. 4A through 4D show changes in the conductor currents at the grounded MMC for $F_1$, $F_2$, $F_3$, and $F_4$, respectively, as shown in FIG. 1B;

FIGS. 8B and 8C show conductors and tower configuration of two-conductor and three-conductor overhead transmission lines, respectively, in relation to test systems 1 and 2;

FIGS. 8D and 8E show cable configuration and dimension of each cable, respectively, of the cable design in relation to test systems 1 and 2;

FIG. 9A shows a variation of $F_{PN}$ with LPF cut-off frequency $f_c$ for N pole-to-ground faults in Test System-1, in relation to the arrangement of FIG. 5;

FIG. 9B shows a variation of $F_{PN}$ with distance for N pole-to-ground faults in Test System-1, in relation to the arrangement of FIG. 5;

FIGS. 13A through 13C show $F_{PN}$ and $F_{PR}$ for Sc-3 at R34, and more specifically show Current measurements, where $I_r$ is the DMR current; ROCOC values for band limited signals; and $F_{PN}$ and $F_{PR}$, respectively, in relation to the arrangement of FIG. 5;

FIG. 14 shows. ROCOC values and indices at R34, for P-pole-to-DMR fault on Line 34 (Sc-4);

FIG. 15 shows. $F_{PN}$ at bus-3 for N-pole faults on OHL-34 of Test System-2;

FIGS. 16A and 16B show ROCOC values and indices for faults on cable, and more specifically at R14, for a P-pole-to-ground fault on Cable-14 (Sc-5); and at R14, for a P-pole-to-DMR fault on Cable-14 (Sc-6), respectively;

FIG. 17 shows $F_{PN}$ at bus-1 for faults on Cable-14 of the Test System-2;

FIGS. 18A and 18B show ROCOCs and $F_{RN}$ values for N-pole faults, and more specifically a solid N-pole-to-DMR fault at 1000 km on Line-34; and A solid N-pole-to-DMR-to-ground fault at 1000 km on Line-34, respectively;

FIGS. 28A and 28B show estimated ROCOC for P-pole to ground faults, and more specifically for a metallic fault at 312 km away from rectifier, and a 60Ω fault at 236 km away from rectifier, respectively;

FIGS. 29A and 29B show estimated ROCOC for a P-pole to ground fault at 430 km away from rectifier, and more specifically for a metallic fault, and A 100 $2 fault, respectively;

FIG. 30 is a $K^{-1}_{np}$ curve estimated with metallic faults and estimated $K^{-1}_{np}$ for some randomly selected faults;

FIGS. 38A through 38F show responses for Phase-A-to-Phase-B fault at 95% of the length from the relay, and more specifically that for phase voltages, phase currents, ROCOC values, $F_{ab}$, $F_{bc}$, $F_{ca}$, respectively;

FIGS. 39A through 39F show responses for a Phase-B-to-ground fault at 75% away from the relay, and more specifically that for phase voltages, phase currents, ROCOC values, $F_{ab}$, $F_{bc}$, $F_{ca}$, respectively;

FIGS. 42A through 42C show fault indices $F_{ab}$, $F_{bc}$, and $F_{ca}$, respectively, for Phase B-to-Phase-C faults on 95% simulated for every 0.9 deg;

FIGS. 43A through 43C show fault indices $F_{ab}$, $F_{bc}$, and $F_{ca}$, respectively, for Phase-A-to-ground faults at 60%;

FIGS. 44A through 44C show fault indices $F_{ab}$, $F_{bc}$, and $F_{ca}$, respectively, for solid Phase-C-to-ground faults along the line;

FIGS. 45A through 45C show indices $F_{ab}$, $F_{bc}$, and $F_{ca}$, respectively, for Phase-B-to-ground faults at 85%;

FIGS. 46A through 46C show indices for solid and 50 Ω 3-phase faults at 50%, and FIGS. 46D through 46F show indices for solid faults at 5% and 95% of the line;

FIGS. 47A and 47B show fault indices for a 0.05Ω fault, and per unit change in indices for 50 Ωfaults, respectively, for Phase-A-to-Phase-B-to-ground faults at 45%;

FIGS. 48A through 48C show fault indices $F_{ab}$, $F_{bc}$, and $F_{ca}$, respectively, for Phase-B-to-Phase-C-to-ground faults at 45% at every 0.9 deg.;

FIG. 49 shows a fault classification algorithm particularly suited for HVAC power transmission systems according to another arrangement of the present invention;

In the drawings like characters of reference indicate corresponding parts in the different figures.

DETAILED DESCRIPTION

Figure 1A:
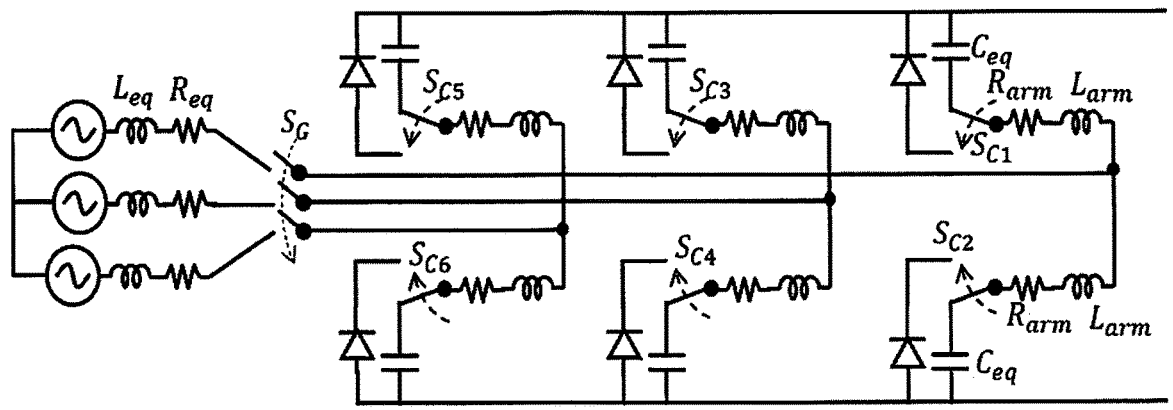
FIG. 1A is a simplified representation of a MMC.

In one aspect the invention described herein relates to a method for identifying one or more faulted conductors when a fault event has occurred in a power transmission system in which at least two of the conductors transmit power. The method generally comprises the steps of:

monitoring current signals which are representative of currents in the conductors at a generally common location within the power transmission system;

filtering the current signals to produce filtered current signals;

determining a maximum rate of change of each filtered current signal within a predetermined time interval after the fault event has commenced;

calculating a ratio of a pair of the maximum rates of change of the filtered current signals; and comparing the ratio against a discrimination factor to identify the one or more faulted conductors.

Additionally the method includes a step of disconnecting the identified one or more faulted conductors so as to interrupt fault currents generated as a result of the fault event.

Additionally the method includes a step of determining a rate of change of the filtered current signal of at least one of the conductors and comparing a sum thereof to a fixed threshold value to validate that the fault event has occurred.

Typically, the predetermined time interval of the step of determining a maximum rate of change of each filtered current signal typically has a duration between about 0.2 and about 2.0 milliseconds, and preferably is about 1.0 milliseconds.

FIGS. 1A through 22B relate to arrangements of the present invention for identifying faulted conductors in a high voltage direct current (HVDC) transmission system. In relation to the foregoing figures there is described a new, more generic, more reliable, simpler and yet fast method for accurately identifying the poles and the conductors involved in a DC fault. It is generic in the sense that the method is applicable to bipole two-wire or three-wire systems, LCC or VSC systems, overhead lines or cables, or two terminal or multi-terminal systems. Furthermore, it is generic in the sense that the method is applicable to discriminate between all possible type of faults in a given transmission configuration. Notably the proposed method is applicable of discriminating pole-to-ground faults from pole-to-DMR faults. The scheme is simple because it uses only local current measurements through all of the conductors accessible at the DC line terminal, and depends on only low frequency components (<1 kHz) for fault type discrimination. The decisions are based on a simple set of indices computed considering a pair of conductors at a time. Each index, computed as the ratio between the maximum rates of change of currents observed in the corresponding conductor pair, is used to test whether the fault is between them. Therefore, implementation is straightforward compared to the method in [6] and does not involve the laborious training phases required in the machine learning based methods [15]. It is reliable, because these indices are more or less independent from the fault resistance, unlike the parameters proposed in [6]. Since the local current measurements are required for both converter control and fault detection [17], the proposed low frequency current measurement based fault discrimination algorithm can be implemented with little or no additional cost using already available measurements. As the proposed method relies only on local measurements, communication links are not necessary as in the current differential schemes [6] and therefore it operates faster. Since it is fast, the method can be used for supervising protection, blocking converter poles. It can also be used for control purposes and also in addition can be used to warn repair crews. The method was verified for both overhead transmission lines and underground cables in a three-terminal three-conductor bipole VSC based MT-HVDC grid. In addition, performance of the proposed approach was evaluated for two-conductor and three-conductor bipole line commutated converter (LCC)-HVDC transmission systems.

Proposed Techniques for Fault Detection in HVDC System

In order to understand the challenges for fault type identification and the basis for the proposed solution, it is necessary to analyze the propagation of the fault currents along the sections of HVDC transmission line.

A. Modelling the Behaviour of Faulted MMC-HVDC Systems

Figure 1B:
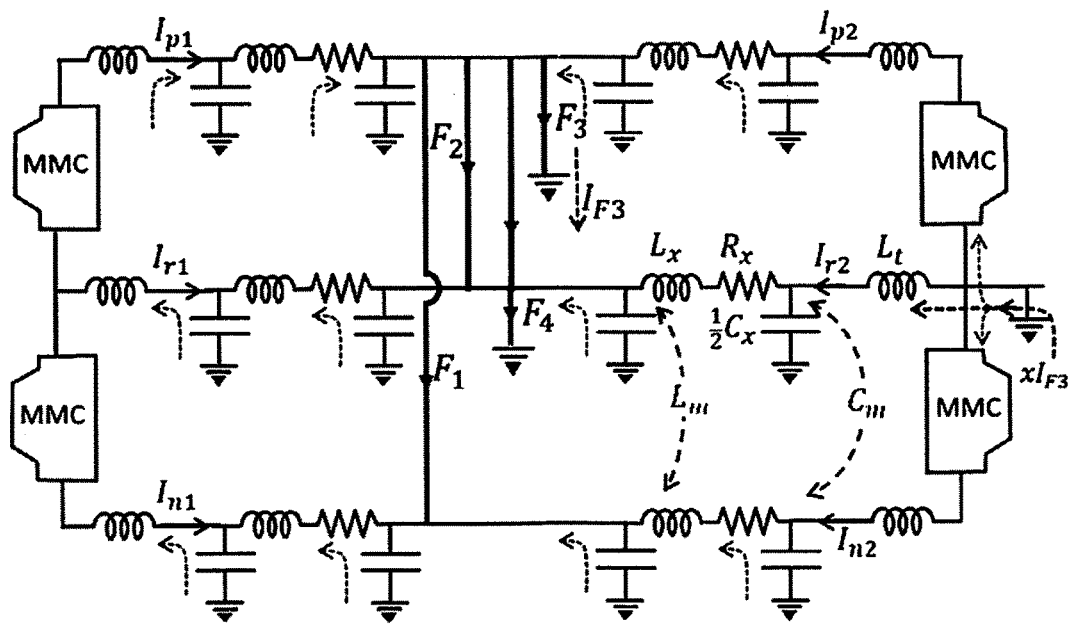
FIG. 1B is a simplified representation of a faulted MMC HVDC transmission system having three conductors and including the MMC as represented by FIG. 1A.

For this discussion, a MMC converter with half-bridge submodules is considered. The behavior of the converter after a fault can be modeled considering three distinct stages as described in [18]. Immediately after a DC fault, the DC capacitors of connected submodules discharge rapidly causing very a high rate of change of current. During this stage, the converter can be represented as a series RLC circuit as shown in FIGS. 1A and 1B [18], with the capacitors having an initial charge depending on the respective pre-fault DC voltages. The rapid rise of current activates the low-level internal protection and causes the IGBT switches to turn-off, blocking all submodule capacitors. The second stage starts at this point and the stored energy in the arm inductors discharge through the IGBT anti-parallel diodes, effectively shorting the lower and upper arms of the converter. Eventually the MMC becomes an uncontrolled rectifier and reaches stage-3 where the fault current becomes steady, and contains only the contribution from the AC grid.

The MMC, in stages-2 and -3, can be modeled by changing the position of switches SCN (N=1 ... 6) and closing SG at the end of stage one, as shown in FIG. 1($a$). The duration of stage-1 could be less than 1 ms (2 pu current threshold is typical [19]), while stage-2 could extend well over 100 ms [18]. The simplified HVDC transmission system shown in FIG. 1($b$), consists of a 3-conductor transmission line, which is modeled as two sections represented using π-equivalent circuits. All conductors are assumed to be terminated with series di/dt limiting inductors [20]. Typically, the dedicated metallic return (DMR) conductor is grounded only at one point, in this example at end-2, which is the inverter side.

B. Basis of Identifying Conductors Involved in a Fault

Figures 2A, 2B:
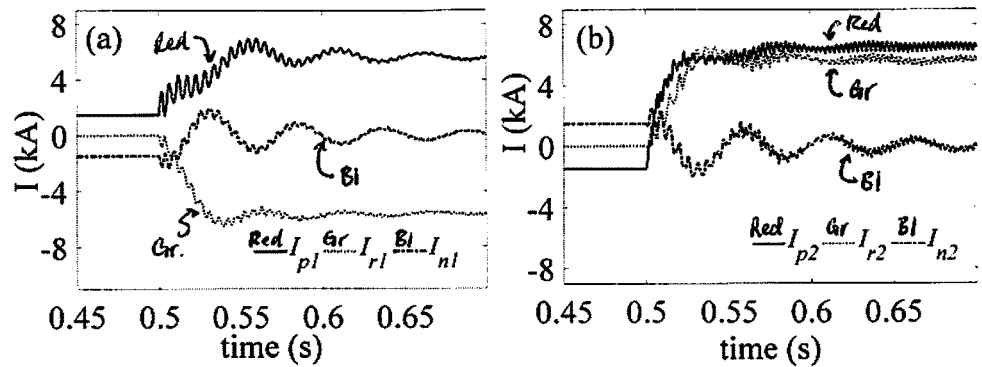
FIGS. 2A and 2B show current waveforms during a P-pole to ground fault (a) at ungrounded MMC (b) at grounded MMC.

The response of the network modeled in FIG. 1B for a solid P-pole-to-ground fault is shown in FIGS. 2A and 2B. For this fault, only the IGBTs in P-pole were blocked. The possible paths for the ground fault currents are indicated in FIG. 1B. The fault current contribution from the ungrounded converter can come through both the N-pole and DMR conductors as well as through the line capacitances during stage-1 and at the start of stage-2. The fault currents shown in FIGS. 2A and 2B demonstrate the typical variations observed immediately after a ground fault. Although only the P-pole conductor is involved in the fault, currents in all three conductors are subjected to transient variations, making it difficult to determine the type of fault. In a longer time scale, the currents in the healthy pole will be restored by the converter controls, which are not modeled in this simplified representation.

In FIGS. 3A-3D, the changes in the currents, i.e. $\Delta I_{p1}$, $\Delta I_{n1}$, $\Delta I_{r1}$, computed as the fault current minus the respective pre-fault current, are shown for the ungrounded MMC (rectifier) side for four different types of faults.

The faults considered are (i) P-pole-to-N-pole, $F_2$, (ii) P-pole-to-DMR, $F_2$, (iii) P-pole-to-ground, $F_3$, and (iv) P-pole-to-DMR-to-ground, $F_4$, faults. The plots show the variations of current changes immediately after the faults, over a much shorter period (about 3 ms). The plots in FIGS. 3A-3D show three different curves for the same quantity, obtained using three different line models: (i) distributed parameter line model, noted as "tl", (ii) coupled I-model, noted as 'π1", and (iii) uncoupled I-model, noted as 'π2".

The parameters used for the simulations are given in Tables AI and AII. FIGS. 4A-4D show the corresponding changes in currents observed at the grounded MMC (inverter side $\Delta I_{p2}$, $\Delta I_{n2}$, $\Delta I_{r2}$) for the same faults.

Based on the results shown in FIGS. 3A-3D and 4A-4D, the following conclusions can be made:

During the pole-to-pole faults, such as $F_1$ shown in FIGS. 3A and 4A, the initial changes in the faulted conductor currents follow the same pattern, but in opposite directions. The healthy conductor (DMR) current remains unchanged. These observations are true, regardless of (i) whether the MMC is grounded or not, or (ii) the line model used. Although, the line model causes differences in the actual variations, for example the distributed parameter line model clearly shows wave travel delays, the general observation is still true.

During the pole-to-DMR faults, such as the P-pole-to-DMR fault ($F_2$) shown in FIGS. 3B and 4B, the initial changes in the faulted conductor currents follow the same pattern, but in opposite directions. The healthy conductor (N-pole in the case of $F_2$) current remains more or less unchanged during the initial period. Again, the observations are true for both grounded and ungrounded MMCs, regardless of the line model used.

During the pole-to-ground faults, such as the P-pole-to-ground fault ($F_3$) shown in FIGS. 3C and 4C, the initial changes in the healthy conductor currents follow the same pattern and vary in the same direction. The faulted conductor (P-pole in the case of $F_3$) current changes faster than the healthy conductor currents in the opposite direction. The grounded and ungrounded MMCs show the same initial direction of variation for the healthy conductor currents, when the distributed line model or coupled π-model is used. If the coupling between the conductors is ignored, the directions of the initial current variations are different for the grounded MMC.

During the pole-to-DMR-to-ground faults, such as P-pole-to-DMR-to-ground fault ($F_4$) shown in FIGS. 3D and 4D, the faulty pole conductor (P-pole in the case of $F_4$) current changes much faster than the healthy pole conductor (N-pole) current, regardless of whether the MMC is grounded or not. The DMR current changes in the direction opposite to that of the faulted pole-conductor current, both at the grounded and ungrounded MMCs, if the coupling between conductors is considered. When the inter-conductor coupling is ignored, the DMR current at the grounded MMC remains unchanged.

The reasons for the above observations arise from the paths of the fault currents during stage-1 and at the start of stage-2. The possible paths for the P-pole-to-ground fault currents are indicated in FIG. 1B. Most of the fault current entering through the system grounding point flows through the P-pole converter. For rest of the current, two parallel paths are provided: (i) through the N-pole converters and conductor, (ii) through the DMR conductor. The currents are distributed between these two paths according to the impedances of the respective paths. There is also some current flowing through the loops consisting of the line capacitances, which particularly affect the very initial part of the fault currents. During a pole-to-pole or a pole-to-DMR fault, the voltage driving the current in the loop consisting of the healthy conductor is very small compared to the voltages driving the loops consisting of faulted conductors. Therefore, the current flowing through the healthy conductor is much smaller compared to the currents in the faulted conductors.

C. ROCOC Based Fault Type Indices

Based on the above observations, a procedure can be formulated to identify the conductors involved in a fault, considering the initial change of conductor currents after the fault. The rate of change of current (ROCOC) facilitates detecting the trend of a current variation faster than the magnitude of the current could, and therefore, the initial rate of change of conductor currents can be used in place of the magnitudes of the current changes. In fact, ROCOC has been commonly used as a fault indicator in HVDC systems [8], [16].

The fault resistance and the fault location can influence the actual magnitudes of the initial rate of change of conductor currents. However, the conclusions made in Section II-B are all about relative variations in change of currents, and therefore hold true regardless of the fault resistance or the fault location. In order to formulate the necessary logic using relative rate of change in currents, the index $F_{XY}$ is defined to express the rate of change of current in Conductor-X relative to that of Conductor-Y.

$$F_{XY} = \frac{\left|\frac{d\Delta I_x}{dt}\right|_{initial}}{\left|\frac{d\Delta I_y}{dt}\right|_{initial}} = \frac{\left|\frac{dI_x}{dt}\right|_{initial}}{\left|\frac{dI_y}{dt}\right|_{initial}} \quad (1)$$

The pre-fault currents are assumed constant. According to the observations presented in Section II-B, $F_{XY}$ is closer to unity when the fault is between Conductor-X and Conductor-Y (Criterion for faulty conductors during inter-conductor faults) or when both Conductor-X and Conductor-Y are not involved in the fault, for example during a ground fault on the remaining conductor (Criterion for healthy conductors in single conductor faults). Furthermore, $F_{XY}$ is greater than unity if Conductor-X is involved in the fault while Conductor-Y is not; and $F_{XY}$ is less than unity when Conductor-X is not involved in the fault while Conductor-Y is involved. This approach of pair wise comparison can also be viewed as testing whether a fault is inside the loop made by two terminals measurements or if both conductors are not involved in the fault. The pairwise comparison approach using an index such as the one defined in (1) greatly simplifies faulty conductor identification logic, as it avoids the impact of fault resistance and mitigates the influence of fault location to a certain extent. It is important to recognize that in the above discussion, the transient period immediately after the fault is considered. During this period, involving stage-1 and the initial period of stage-2 after a fault, conducting paths are provided for changes in currents ($\Delta I$) through (i) faulty pole converters in either direction, (ii) healthy pole converter in either direction, and (iii) ground and coupling capacitances. The observations made considering the initial changes in currents may not hold for the steady state fault currents. Although the above analysis considered a MMC-HVDC scheme, the observations are applicable to LCC-HVDC systems as well. The DC side filters in LCC stations provide fault current paths similar to those observed during stage-1 of faulted MMCs [21].

The ratio defined in Equation (1) represents a function that varies with time during a fault transient, and only its initial values are valid for use in the decision logic. The index should not be affected by measurement noise during the inception of the fault transient. Therefore, in order to arrive at robust decisions, the index defined in Equation (2) is proposed.

$$F_{XY}(t) = \frac{\max(dI'_x/dt)}{\max(dI'_y/dt)} \quad (2)$$

The currents $I'_x$ and $I'_y$ in Equation (2) are obtained by low pass filtering the currents $I_x$ and $I_y$ in Conductors-X and -Y respectively. The maximum rates of change of $I'_x$ and $I'_y$ are obtained considering a short window of time after the detection of the fault. The cutoff frequencies of the filters should be carefully selected so that the right degree of variation in the currents due to mutual coupling between the conductors are captured. Conductor coupling at higher frequencies (>5 kHz) makes it difficult to discriminate the faulty pole, while complete elimination of mutual coupling may make fault type discrimination at the grounded converter impossible. Recall that the initial direction of the change of current observed at the grounded MMC was different when the mutual coupling is ignored. Selection of the cutoff frequency will be presented with more details later in Section IV-A.

Figure 5:
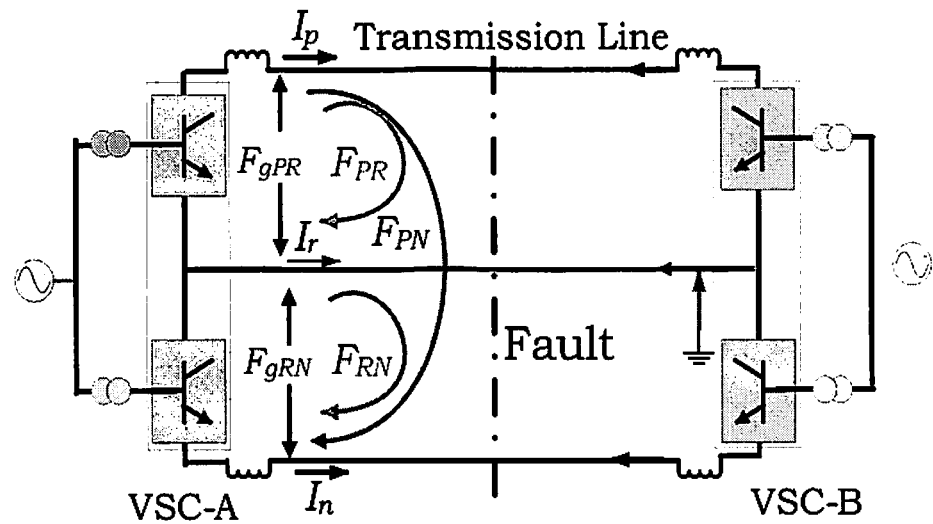
FIG. 5 shows current measured considered for different indices according to one arrangement of the present invention.

Several indices can be defined for a given system configuration (i) considering a pair of current measurements in a possible fault current loop, or (ii) considering a pair of current measurements in healthy conductors, as illustrated in FIG. 5. As defined in Equation (2), the index aims to capture the ratio between positive peaks, and therefore the measurement directions are important. Different indices defined hereafter are based on the assumption that all currents are measured from a converter toward the line, as indicated in FIG. 5.

D. Faulty Conductor Identification Logic

The criteria used for faulted conductor identification is developed in this section.

1) Logic for Identification of Faulty Pole(s)

The index $F_{PN}$ is defined using equation (3) which is $$F_{PN} = \frac{\text{Max}(dI'_p/dt)}{\text{Max}(-dI'_n/dt)} \quad (3)$$

is used to identify the faulty pole(s). According to the discussion in above section A, the following criteria hold:

Criterion-A1: for a P-pole-to-N-pole fault, $$(1 - k_1) \le F_{PN} \le (1 + k_2)$$

Criterion-A2: for P-pole-to-ground or P-pole-to-DMR faults, $$F_{PN} \ge (1 + k_2)$$

Criterion-A3: for N-pole-to-ground or N-pole-to-DMR faults, $$F_{PN} \le (1 - k_1)$$

where $k_1$ to $k_2$ are positive tolerance settings. Criterion-A1 helps to discriminate a P-pole-to-N-pole fault from a single-pole-to-ground fault or a single-pole-to-DMR fault.

2) Logic for Identification of a Pole-to-DMR Fault

A P-pole-to-DMR fault can be identified with the help of index $F_{PR}$ defined in Equation (4) which compares the loop current through a P-pole and DMR conductor.

$$F_{PR} = \frac{\text{Max}(dI_p'/dt)}{\text{Max}(-dI_r'/dt)} \quad (4)$$

Note that the negative of the DMR current is considered as a P-pole-to-DMR fault causes a fault current that flows along the DMR conductor into the converter. Similarly, the index to identify an N-pole-to-DMR fault, $F_{RN}$, is defined as $$F_{RN} = \frac{\text{Max}(dI_r'/dt)}{\text{Max}(-dI_n'/dt)}. \quad (5)$$

The following criteria hold for a pole-to-DMR fault:

Criterion-B1: for a P-pole-to-DMR fault, $$(1-k_3) \le F_{PR} \le (1+k_4)$$

Criterion-B2: for an N-pole-to-DMR fault, $$(1-k_3) \le F_{RN} \le (1+k_4)$$

where $k_3$ and $k_4$ are positive tolerance settings.

3) Logic for identification of a pole-to-ground fault

According to Section-II-A, the criterion for healthy conductors during a single pole-to-ground fault can be used to identify the conductors which are not involved in the fault. Two indices, $F_{gRN}$ and $F_{gPR}$, which compare the maximum rates of change of currents through the healthy conductors, can be defined to identify P-pole-to-ground faults and N-pole-to-ground faults respectively.

$$F_{gRN} = \frac{\text{Max}(-dI_r'/dt)}{\text{Max}(-dI_n'/dt)} \quad (6)$$

$$F_{gPR} = \frac{\text{Max}(dI_p'/dt)}{\text{Max}(dI_r'/dt)} \quad (7)$$

Criterion-C1: for a P-pole-to-ground fault, $$(1-k_5) \le F_{gRN} \le (1+k_6)$$

Criterion-C2: for an N-pole-to-ground fault, $$(1-k_5) \le F_{gPR} \le (1+k_6)$$

where $k_5$ and $k_6$ are positive tolerance settings.

E. Application of the Proposed Technique

1) Signal Processing and Calculation of Indices

Figure 6:
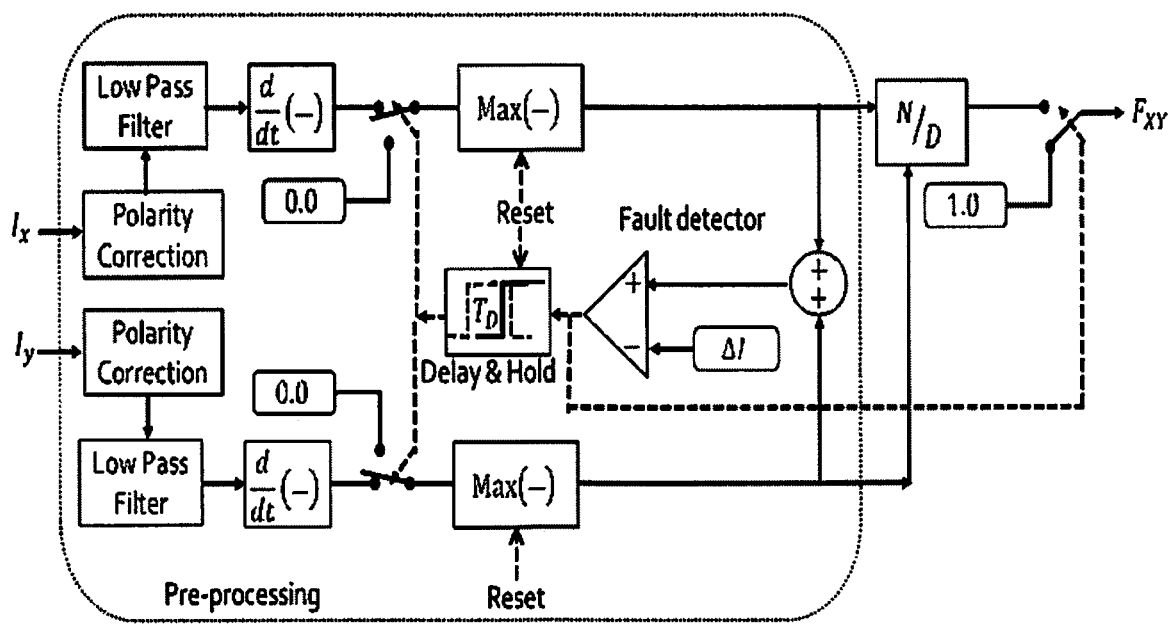
FIG. 6 illustrates signal processing involved in calculating $F_{XY}$ according to the arrangement of FIG. 5.

The processing involved in computation of the indices is shown in FIG. 6. First, the input current measurements are low pass filtered and the maximum rate of change of the filtered signals are computed. When the sum of two maximum di/dt values exceeds a pre-set threshold, ΔI, the output of the fault detector is set and a timer is started. A simple |di/dt| detection is included to trigger the algorithm. However, this trigger signal can be replaced with the output of a fault detection and faulty section identification method such as [3], [4]]. After a short time delay of TD, delay and hold output is set to high, making the inputs to the maximum detector zero, freezing the outputs of the maximum di/dt detectors at their current values. The fault detector also directs the ratio of the outputs of two maximum detectors to the final output as the value of $F_{XY}$.

2) Application to Two-Conductor HVDC System

In the case of a two-conductor transmission system, only the index $F_{PN}$ can be computed. Criterion-A1 can be used to identify faults between the two conductors, and Criteria-A2 and -A3 can be used identify P-pole-to-ground faults and the N-pole-to-ground faults respectively.

In other words, when the power transmission system is a HVDC transmission system having two power-transmitting conductors P-pole and N-pole and no return conductor, in which the power-transmitting conductors are operably connected between two sets of power converter stations, such as those indicated at VSC-A and VSC-B in FIG. 5, so as to transmit the power along the power-transmitting conductors from a first set of power converter stations VSC-A to a second set of power converter stations VSC-B, then in relation to the previously generally recited method:

the step of monitoring the current signals comprises measuring the current $I_p$ and $I_n$ in each one of the power-transmitting conductors at or generally in proximity to a common selected one of the first and second sets of power converter stations, for example VSC-A;

the ratio of a pair of the maximum rates of change of the filtered current signals, which in this case is referred to as $F_{PN}$, is formed by dividing the maximum rate of change of the filtered current signal of a first power-transmitting conductor, normally P-pole which is at the top of FIG. 5, assuming a positive current direction through the first power-transmitting conductor so as to be assigned a positive value, by the maximum rate of change of the filtered current signal of a second power-transmitting conductor, normally N-pole which is at the bottom of FIG. 5, assuming a negative current direction through the second power-transmitting conductor so as to be assigned a negative value, where the positive current direction through the first power-transmitting conductor P-pole is taken as flowing out of the selected set of power converter stations VSC-A and the negative current direction through the second power-transmitting conductor N-pole is taken as flowing into the selected set of power converter stations VSC-A, and thus having opposite direction to $I_n$ as shown in FIG. 5; and the step of comparing the ratio against a discrimination factor to identify the one or more faulted conductors comprises:

checking whether the ratio, $F_{PN}$, is greater than or equal to the discrimination factor $(1+k_2)$ or less than or equal to an inverse of the discrimination factor $(1-k_1)$ (that is, evaluating criteria A2 and A3), and if the ratio is greater than or equal to the discrimination factor (that is, criterion A2 is satisfied) then determining that the first conductor is the only faulted conductor, or if the ratio is less than or equal to the inverse of the discrimination factor (that is, criterion A3 is satisfied) then determining that the second conductor is the only faulted conductor.

For clarity, in this case the expression $(1+k_2)$ is considered the discrimination ratio, and $(1-k_1)$ is considered the inverse thereof.

When the discrimination factor is greater than one, if the ratio is neither greater than or equal to the discrimination factor nor less than or equal to the inverse thereof, that is criterion A1 is satisfied, then it is determined that both the first and second conductors P-pole and N-pole are faulted.

3) Application to a Bipole HVDC Transmission System with a DMR

Figure 7:
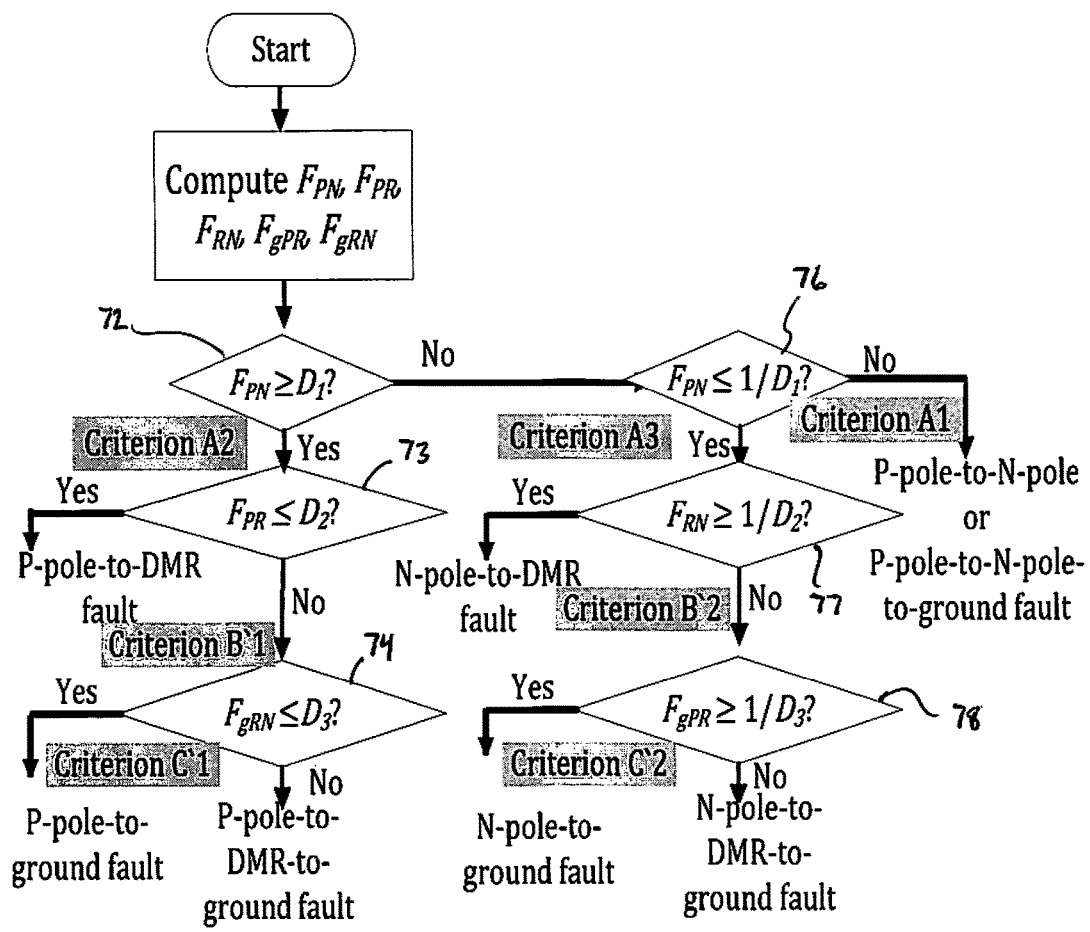
FIG. 7 illustrates a proposed fault classification algorithm according to the arrangement of FIG. 5.

The criteria presented in Section II can be simplified to reduce the number of comparisons and threshold settings, if testing of criteria are performed in an orderly manner as presented in the flow chart of FIG. 7. Criteria A1-A3 allow identification of P-pole-to-N-pole faults, and determination of the pole involved in a fault, when it is not a pole-to-pole fault. Once the faulty pole is identified, pole-to-DMR faults can be identified by considering only one side of Criteria-B1 and -B2 (right hand side of B1 and left hand side of B2). This is because, for example, a P-pole-to-ground or P-pole-to-DMR-to-ground fault causes a larger $Max(dI'_p/dt)$ compared to $Max(dI'_r/dt)$, therefore, making $F_{PR}$ greater than unity for any fault involving P-pole and ground. Thus, it is only necessary to check whether $F_{PR}$ is less than a threshold which is higher than 1.0 to identify P-pole-to-DMR faults. Similarly, it is only necessary to check whether $F_{RN}$ is greater than a threshold which is slightly less than 1.0 to identify N-pole-to-DMR faults. These modified criteria are denoted as Criterion-B'1 and Criterion-B'2 in FIG. 7. This one sided comparison also helps to identify the deviations in $F_{PR}$ and $F_{RN}$ from their ideal value, unity, during pole-to-DMR faults due to asymmetry in the terminations. The DMR conductor may have smaller series inductors than those on the pole conductors or no series inductors, leading to an asymmetry in the terminations. Therefore, the rate of change of current in DMR could be higher than that of P- or N-conductors, making the index $F_{PR}$ slightly less than unity during a P-pole-to-DMR fault, and the index $F_{RN}$ slightly higher than unity during an N-pole-to-DMR fault.

After eliminating the possibility of other fault types, the last set of comparisons discriminate between pole-to-ground faults and pole-to-DMR-to-ground faults. During a P-pole-to-DMR-to-ground fault, $Max(dI'_r/dt)$ is higher than that of the healthy pole, i.e. $Max(dI'_n/dt)$, therefore checking the right hand side of Criterion-C1 is sufficient to distinguish between P-pole-to-DMR-to-ground faults and P-pole-to-ground faults. Using a similar argument, the right hand side of the Criterion-C2 can be omitted. These modified criteria are shown as Criterion-C'1 and Criterion-C'2 in FIG. 7. The thresholds in the modified criteria can be related to kt values in the original criteria as: $D_1=1+k_2$; $1/D_1=1-k_1$; $D_2=1+k_4$; $1/D_2=1-k_3$; $D_3=1+k_6$; and $1/D_3=1-k_5$.

In other words, and with reference to FIG. 5 and particularly to FIG. 7, when the power transmission system is a HVDC transmission system having two power-transmitting conductors P-pole and N-pole and a return conductor DMR, in which the power-transmitting conductors are operably connected between two sets of power converter stations, such as those indicated at VSC-A and VSC-B in FIG. 5, so as to transmit the power along the power-transmitting conductors from a first set of power converter stations VSC-A to a second set of power converter stations VSC-B, with the return conductor defining a return path for the current from the second set of power converter stations to the first set of power converter stations, then in relation to the previously generally recited method:

the step of monitoring the current signals comprises measuring the current in each one of the conductors, that is $I_p$ and $I_n$ and $I_r$, at or generally in proximity to a common selected one of the first and second sets of power converter stations, for example VSC-A;

the ratio of a pair of the maximum rates of change of the filtered current signals comprises (i) a first ratio, referred to herein as $F_{PN}$, formed by dividing the maximum rate of change of the filtered current signal of a first power-transmitting conductor, normally P-pole, assuming a positive current direction through the first power-transmitting conductor so as to be assigned a positive value, by the maximum rate of change of the filtered current signal of a second power-transmitting conductor, normally N-pole, assuming a negative current direction through the second power-transmitting conductor so as to be assigned a negative value, where the positive current direction through the first power-transmitting conductor is taken as flowing out of the selected set of power converter stations and the negative current direction through the second power-transmitting conductor is taken as flowing into the selected set of power converter stations; (ii) a second ratio, referred to herein as $F_{PR}$, formed by dividing the maximum rate of change of the filtered current signal of the first power-transmitting conductor assuming the positive current direction therethrough by the maximum rate of change of the filtered current signal of the return conductor assuming a negative current direction through the return conductor so as to be assigned a negative value, where the negative current direction through the return conductor is taken as flowing into the selected set of power converter stations; and (iii) a third ratio, referred to herein as $F_{RN}$, formed by dividing the maximum rate of change of the filtered current signal of the return conductor assuming a positive current direction through the return conductor so as to be assigned a positive value, by the maximum rate of change of the filtered current signal of the second power-transmitting conductor assuming the negative current direction therethrough, where the positive current direction through the return conductor is taken as flowing out of the selected set of power converter stations, as per the direction of $I_r$ shown in FIG. 5; and the step of comparing the ratio against a discrimination factor to identify the one or more faulted conductors comprises:

checking whether the first ratio, $F_{PN}$, is greater than or equal to a first discrimination factor $D_1$, as shown at reference numeral 72, and if true then determining that the one or more faulted conductors includes the first power-transmitting conductor P-pole, or if false then determining that the one or more faulted conductors includes the second power-transmitting conductor N-pole.

If it is determined at 72 that the one or more faulted conductors includes the first power-transmitting conductor, the step of comparing the ratio against a discrimination factor in the previously generally recited method further comprises:

checking whether the second ratio $F_{PR}$ is less than or equal to a second discrimination factor $D_2$, as shown at 73, and
    if true then determining that the first power-transmitting conductor P-pole and the return conductor DMR are faulted but not to ground, or
    if false then determining the first power-transmitting conductor P-pole is faulted to ground.

If it is determined at 73 that the first power-transmitting conductor is faulted to ground, that is the determination at 73 is 'false', the general step of comparing the ratio against a discrimination factor further comprises:

calculating a fourth ratio, referred to herein as $F_{gRN}$, formed by dividing the maximum rate of change of the filtered current signal of the return conductor DMR assuming the negative current direction therethrough by the maximum rate of change of the filtered current signal of the second power-transmitting conductor N-pole assuming the negative current direction therethrough; and
  checking whether the fourth ratio $F_{gRN}$ is less than or equal to a third discrimination factor $D_3$, as shown at 74, and
    if true then determining that the first power-transmitting conductor P-pole is the only faulted conductor which is faulted to ground, or
    if false then determining that the first power-transmitting conductor P-pole and the return conductor DMR are faulted to ground.

If it is determined at 72 that the one or more faulted conductors includes the second power-transmitting conductor, that is the determination at step 72 is 'false', the general step of comparing the ratio against a discrimination factor further comprises:

checking whether the first ratio $F_{PN}$ is less than or equal to an inverse of the first discrimination factor, that is $1/D_1$, as shown at 76, and
    if false then determining that both the first and second power-transmitting conductors P-pole and N-pole are faulted, which may or may not be faulted to ground; or
    if true then determining that the first power-transmitting conductor P-pole is not faulted.

If it is determined at 76 that the first power-transmitting conductor is not faulted, that is the determination at 76 is 'true', the general step of comparing the ratio against a discrimination factor further comprises:

checking whether the third ratio $F_{RN}$ is greater than or equal to an inverse of the second discrimination factor, that is $1/D_2$, as shown at 77, and
    if true then determining that the second power-transmitting conductor N-pole and the return conductor DMR are faulted but not to ground, or
    if false then determining that the second power-transmitting conductor N-pole is faulted to ground.

If it is determined at 77 that the second power-transmitting conductor N-pole is faulted to ground, that is the determination at 77 is 'false', the general step of comparing the ratio against a discrimination factor further comprises:

calculating a fifth ratio, referred to herein as $F_{gPR}$, formed by dividing the maximum rate of change of the filtered current signal of the first power-transmitting conductor P-pole assuming the positive current direction therethrough by the maximum rate of change of the filtered current signal of the return conductor DMR assuming the positive current direction therethrough; and
  checking whether the fifth ratio $F_{gPR}$ is greater than or equal to an inverse of the third discrimination factor, that is $1/D_3$, as shown at 78, and
    if true then determining that the second power-transmitting conductor N-pole is the only faulted conductor which is faulted to ground, or
    if false then determining that the second power-transmitting conductor N-pole and the return conductor DMR are faulted to ground.

Typically, the first, second and third discrimination factors are greater than one, that is they are positive constants greater than unity.

Test Systems and Parameters for Fault Classification in HVDC System

The proposed fault type identification technique is verified for the following transmissions configurations: an LCC based bipole two-conductor configuration (Test System-1), a VSC based bipole-three conductor configuration (Test System-2), and an LCC based bipole-three conductor configuration. The method is evaluated using PSCAD for the second configuration with a three-terminal VSC-HVDC grid.

In test system-1, a twelve-pulse 1 GW LCC is simulated at each pole with AC and DC side harmonic filters. The two-conductor overhead transmission line design used in Manitoba Hydro Bipole-II is considered. Test system-1 details are given in Table I. The transmission line design parameters are given in Tables AI and AII.

Figure 8A:
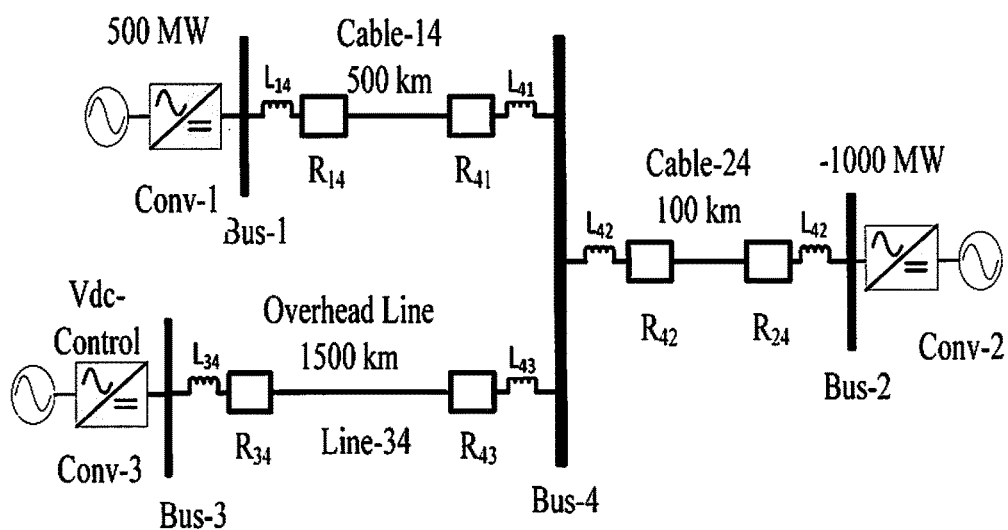
FIG. 8A shows a three-conductor three-terminal VSC HVDC test grid model.

In test system-2, a three-terminal VSC based MT-HVDC grid presented in is used. As depicted in FIG. 8A, this test system is comprised of both overhead transmission lines and underground cables.

All lines are of three-conductor configuration, and the DMR conductor is grounded at station VSC-3 which controls the DC voltage of the grid. Parameters of test System-2 are given in Table II.

The two-conductor overhead transmission line used Chukar conductors in two conductor bundles, while the three-conductor overhead transmission lines used Chukar conductors in three conductor bundles. The conductors have a DC resistance of 0.010714 $\Omega$/km and their radius is 0.0406 m. The shielding wires were high strength steel type having radius of 0.00825 m and DC resistance 0.034 $\Omega$/km. The shunt conductance is $1.0 \times 10^{-11}$ $\Omega$/m and the relative permeability is 1 for the conductors and shield wire. In both cases, a 10 m maximum sag and a 100 $\Omega$-m ground resistivity were assumed. The two-conductor and three-conductor line configuration are illustrated in FIGS. 8B and 8C.

The configuration of three conductor cable system used in Test System-2 and the cable cross section are shown in FIGS. 8D and 8E.

The conductors and sheath have respectively DC resistance of 0.0282 m$\Omega$/km and 0.0186 m$\Omega$/km. The relative permeability of both the conductors and sheath are considered as 1. The relative permeability and relative permittivity of first insulation layer are considered as 3 and 2.5 respectively. Relative permeability and the relative permittivity of the second insulation layer are considered as 1 and 2.3 respectively.

The frequency dependent phase model of PSCAD is used to simulate the transmissions line and cables. The converters are simulated using the model described in [24]. As it can be seen in Table I and Table II, to avoid voltage stability issues, a significantly smaller DC reactor is used in VSC based Test System-2 when compared with the size of the DC reactor used in LCC based Test System-1 [25].

To demonstrate the capability of applying the method in systems with highly asymmetric conductor terminations, the method is applied for discriminating ground faults from DMR faults in an LCC HVDC system with a DMR. This test system is created by replacing the two-conductor transmission line in Test System-1 with a three-conductor overhead transmission line, with only the rectifier end of DMR grounded.

Results of Fault Classification Technique for HVDC Systems

First, the impact of frequency dependence on the coupling and the selection of a suitable signal frequency band is presented considering an N-pole-to-ground short circuit. Thereafter, verifications of (i) the method of identifying the faulted pole(s) using $F_{PN}$, (ii) the method of discriminating a pole-to-DMR fault from the ground faults, and (iii) the method of discriminating a pole-to-ground fault from a pole-to-DMR-to-ground fault are presented. Then, practical issues are discussed.

A. Selection of LPF Cut-Off Frequency

The frequency dependent nature was investigated by $F_{PN}$ values computed with different cut-off frequencies of the low pass filter shown in FIGS. 9A and 9B. In the simulations, the rates of change of currents were computed using the derivative transfer function (sT) with a time constant of 0.01 s. The tracking period, $T_D$, was set to 1 ms to enable tracking the first peak of any signal having a frequency of 250 Hz or higher. The trigger level 41 shown in FIGS. 9A and 9B was set to 20 A/ms. To satisfy Criteria A1-A3 with a satisfactory discrimination margin, i.e. to have a smaller $1/D_1$, the value of $F_{PN}$ should be sufficiently smaller than 1.0 for far end faults. As per FIG. 9A which shows the frequency plots of $F_{PN}$, in order to set $1/D_1$ to ½, i.e. to have least 100% margin for discriminating a solid N-pole-to-ground fault at line end (~850 km) from a P-pole-to-N-pole fault (which result in $F_{PN}$~1.0), the bandwidth should be limited to about 500 Hz.

According to FIG. 9B, which shows the variation of $F_{PN}$, with distance to fault, with a 500 Hz cut-off, $F_{PN}$ is about 0.5 for a fault at the far end (900 km). Thus, 500 Hz is considered acceptable since lower frequency bands require longer tracking times to capture peak ROCOC values.

That is, filtering the current signal of each one of the conductors comprises applying a low pass filter having a cut-off frequency between about 300 Hz and 1 kHz to the current signal of each one of the conductors, and preferably the cut-off frequency of the low pass filter is in the order of about 500 Hz.

B. Faulty Pole Identification Using Index $F_{PN}$

The basic features and operation of the proposed method and identification of pole(s) involved in a fault are demonstrated with the fault scenarios listed in Table III.

The results of the fault scenario Sc-1 simulated for Test System-1 is shown in FIGS. 10A-10D.

Figures 10A, 10B, 10C, 10D:
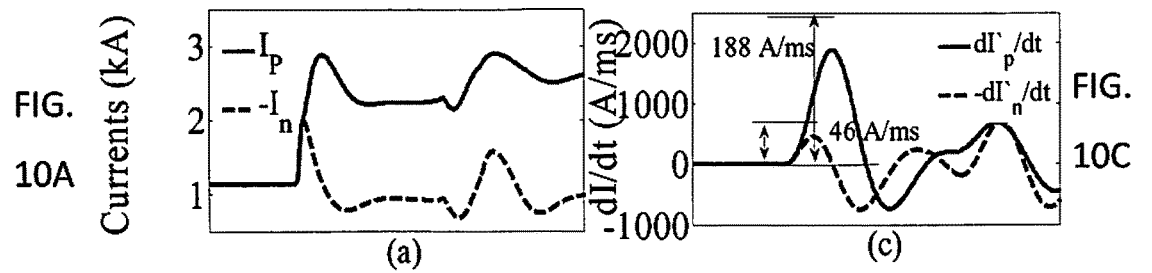
FIGS. 10A through 10D show computations of $F_{PN}$ for a P-pole-to-ground fault in a bipole two conductor system, and more specifically show P-pole current, $I_p$, and N-pole current $I_n$; ROCOC values; ROCOC values for band limited measurements $\Gamma_p$ and $\Gamma_n$; and $F_{PN}$, respectively, in relation to the arrangement of FIG. 5.
Figures 11A, 11B, 11C, 11D:
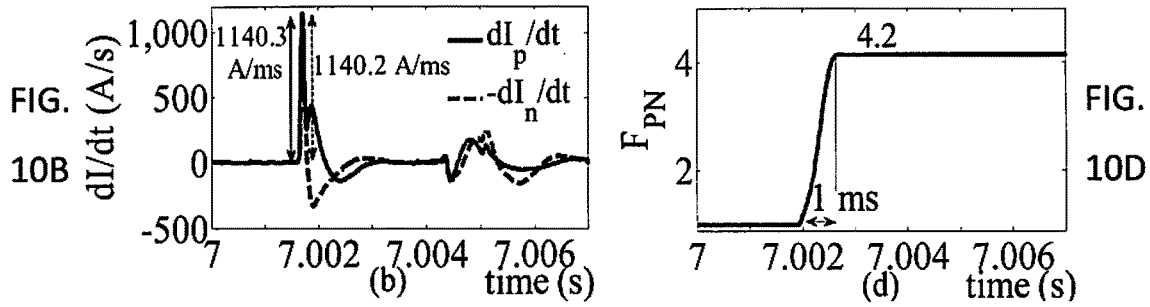
FIGS. 11A through 11D show $F_{PN}$ for a N-pole-to-ground fault in bipole, two-conductor system, Sc-2, and more specifically show Currents, ROCOC values, ROCOC values for band limited signals, and $F_{PN}$, respectively, in relation to the arrangement of FIG. 5.

FIG. 10A shows the P- and N-pole conductor currents measured at the rectifier end. As depicted in FIG. 10B, the peak ROCOC values calculated with unfiltered input signals (bandwidth >10 kHz with the simulation time step used) are almost equal for both P- and N-pole conductors. However, as can be seen from FIG. 10C, the peak ROCOC values computed using the low pass filtered (cut-off frequency 500 Hz) current signals show a large difference.

As per FIG. 10D which shows variation of $F_{PN}$ computed using the waveforms in FIG. 7C, the algorithm tracks the ratio between the maximum ROCOC values of P- and N-conductors, and freezes its value 1 ms after the detection of fault. Fulfilment of Criterion-A2 with a large margin ($4.2 \gg D_1$) indicates P-pole is involved in the fault.

FIGS. 11A-11D shows responses for fault scenario Sc-2, a solid N-pole-to-ground fault. As per FIG. 11A-11D, although the first peaks of the ROCOC values of the unfiltered measurements are almost equal, with the filtered signals it is possible to identify the involvement of N-pole in the fault due to fulfilment of Criterion-A3 with a good margin ($0.13 \ll 1/D_1$). The very small difference between the calculated peak di/dt values for the healthy and the faulty conductors shown in FIG. 10B and FIG. 11B indicate possibility of false tripping in typical HVDC line protections schemes based on di/dt.

Figure 12:
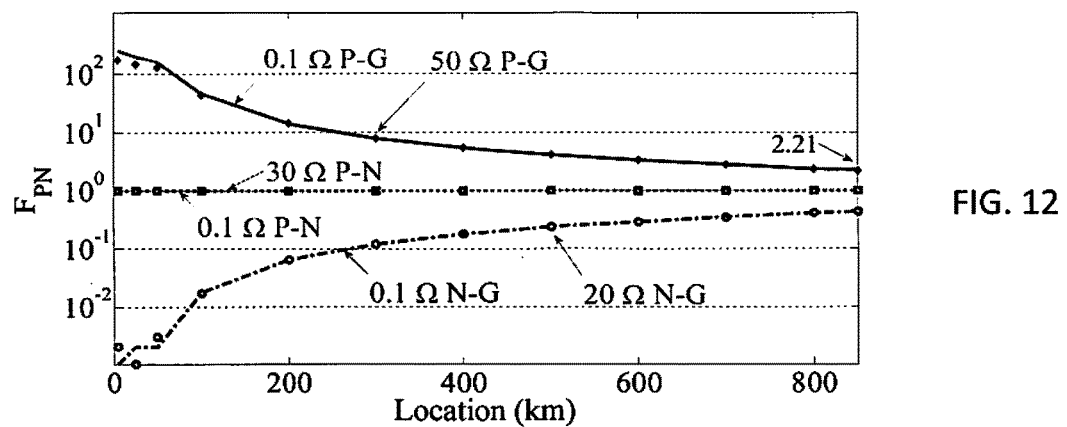
FIG. 12 shows estimated $F_{PN}$ for bipole two-conductor test system (Test System-1)

FIG. 12 shows $F_{PN}$ for the bipole-two conductor test system for different fault types. Note that '0.1Ω P-G' and '0.1Ω P-N' in the legend indicate 0.1Ω P-pole-to-ground faults and 0.10 P-pole-to-N-pole faults respectively. As per FIG. 12, a few conclusions that can be made are: (i) $F_{PN}$ is only dependent on the fault location and the type, (ii) $F_{PN}$ is not affected by the fault resistance, and (iii) the poles involved in the fault can be determined with a sufficient margin and therefore the thresholds can be easily set.

A prompt faulty pole identification feature can be used to initiate converter protection actions of the respective pole such as IGBT blocking, AC breaker opening, etc. The earth return mode is not allowed in most parts of the world, however, there are some jurisdictions where it is allowed on a temporarily basis during contingencies. In such locations, faulty pole identification helps utilize the 50% redundancy during single-pole-to-ground faults.

FIGS. 13A-13C shows the currents, ROCOC values and the index $F_{PN}$ (and $F_{PR}$) for a P-pole-to-ground fault on Line-34 (scenario Sc-3) measured at relay R34 of Test System-2. The value of $F_{PN}(=3.4)$ satisfies Criterion-A2, and confirms that P-pole is involved in the fault. Satisfying Criterion-A2 means Criterion-A3 is automatically violated, and that rules out involvement of N-pole in the fault.

FIG. 14 shows variations of ROCOC values for Sc-4, a P-pole-DMR fault on Line-34, which led to $F_{PN}=63.5$. Therefore, it can be concluded that regardless of the fault type, a pole-to-ground or a pole-to-DMR fault, the faulty pole can be identified with a large margin.

FIG. 15 shows the variation of $F_{PN}$ for various N-pole faults along Line-34. Note that '0.01Ω N-R' indicates 0.01Ω N-pole-to-DMR faults. The corresponding curves for P-pole faults are mirror images of the N-pole faults (as observed in FIG. 12) and are omitted for clarity. Simulation studies showed that the maximum observed value of $F_{PN}$ was 0.47. The minimum observed value of $F_{PN}$ for P-pole faults was 2.14. P-pole-to-N-pole faults resulted in $F_{PN}$ values within 1+0.02. Therefore, $D_1$ can be fixed to 1.5 for Line-34. This value of $D_1$ sets, $k_1$ to 0.33 and $k_2$ to 0.5.

FIG. 16A shows the variations of ROCOC values for a P-pole-to-ground fault on Cable-14. It is evident from FIG. 16A that the observed peak ROCOC values are significantly higher for cables when compared with those of the overhead lines (see FIG. 13B) and the DMR conductor ROCOC variation does not closely follow that of the healthy pole conductor as in overhead lines. However, this does not hinder the faulty pole identification, as $F_{PN}(=5.7)$ is still well above 1.0. FIG. 16B shows the estimated indices for P-pole-to-DMR fault on Cable-14, for Sc-6. According to FIGS. 16A-16B, the faulty pole can be identified using $F_{PN}$ for any type of fault on the cable.

FIG. 17 shows the variation of $F_{PN}$ for faults on Cable-14. For N-pole faults simulated on the cable, the maximum observed value of $F_{PN}$ was 0.47. The minimum observed $F_{PN}$ for different P-pole faults simulated in the cable was 4.7. Therefore, $D_1$ can be fixed to 1.2 for Cable 14. In summary, the results presented in this section confirms the possibility of identifying the faulted pole using $F_{PN}$ for both overhead lines and cables, during all types of faults, including high resistance faults.

C. Identifying Pole-to-DMR Faults Using $F_{PR}$ or $F_{PN}$

FIG. 14 and FIG. 18A show variations of ROCOC values for a P-pole-to-DMR fault and an N-pole-to-DMR fault respectively on Line-34.

Figure 18B:
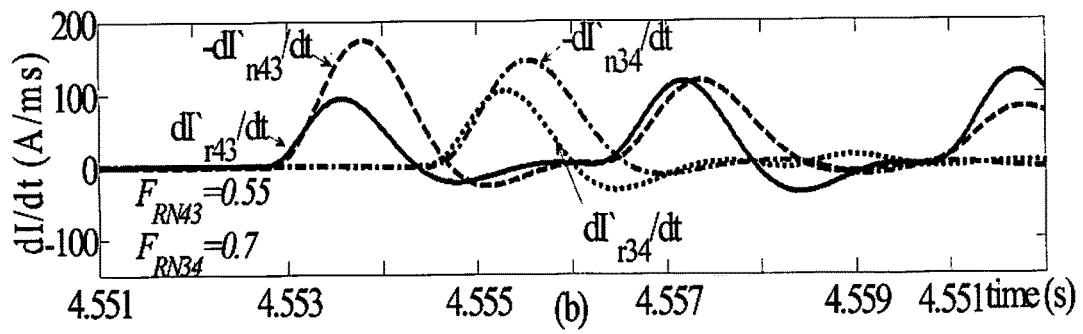

The faulted poles and the DMR conductors have almost equal ROCOC values in both cases, thereby satisfying Criterion-B1 for P-pole-to-DMR fault and Criterion-B2 N-pole-to-DMR fault. However, pole-to-ground faults resulted in considerably larger peak ROCOC on the faulty pole compared to the peak ROCOCs in the other two conductors as seen in FIG. 13(b). Therefore, Criterion-B1 or Criterion-B2 is not satisfied for a pole-to-ground fault. Furthermore, as depicted in FIG. 18(b), $F_{RN}$ is less than 1.0 for an N-pole-to-DMR-to-ground fault. As it can be seen from FIG. 16A and FIG. 16B, calculated value for $F_{PR}$ for the cable is smaller for P-pole-to-DMR faults compared with P-pole-to-ground fault. Therefore, Criterion-B'1 successfully discriminate a P-pole-to-DMR fault on a cable from a P-pole-to-ground fault.

Figure 19A:
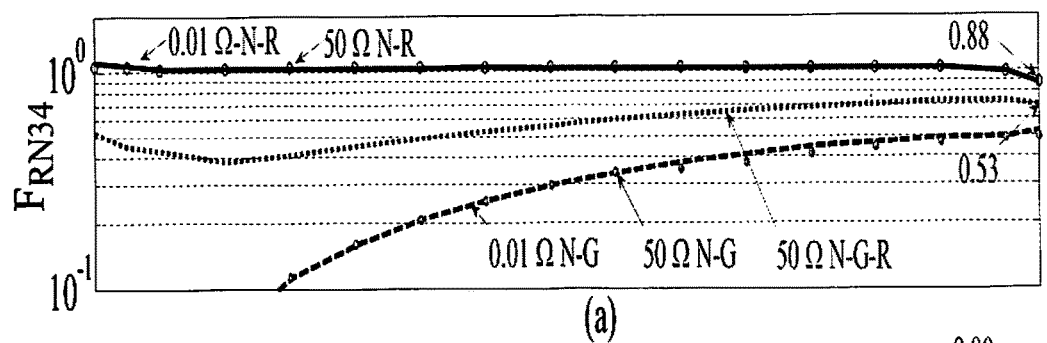
FIGS. 19A and 19B show $F_{RN}$ for N-pole faults on overhead Line-34, and more specifically the same computed from measurements at relay R34, and at relay R43, respectively.
Figure 19B:
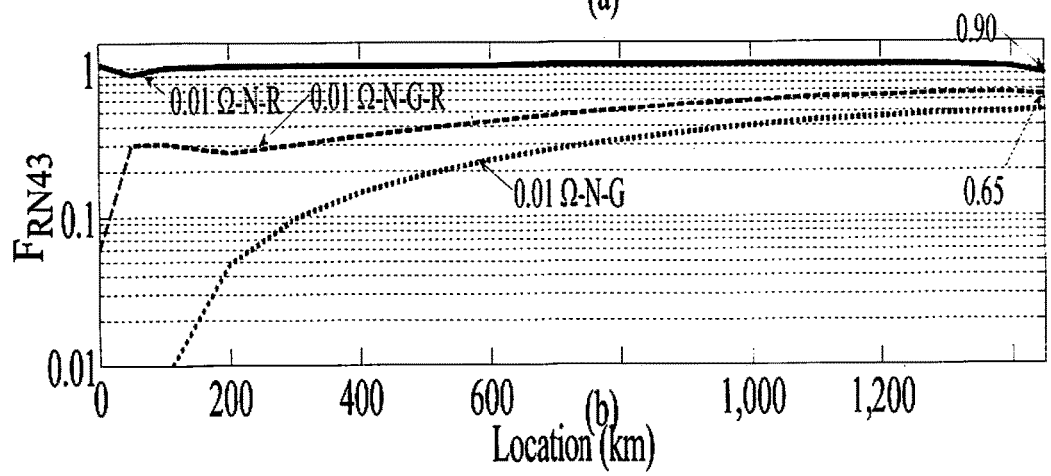

FIGS. 19A-19B show the values of $F_{RN}$ for faults along Line-34, with FIG. 19A as observed at relay R34 and FIG. 19B as observed at relay R43. The curve corresponding to N-pole-to-DMR faults is clearly separated from and stays above the curves of other types of faults including N-pole-to-DMR-to-ground faults. Therefore, having identified the faulty pole using Criterion-A3, any N-pole-to-DMR fault can be identified with the help of Criterion-B2 and any P-pole-to-DMR faults can be identified with the help of Criterion-B'1.

Results in FIGS. 19A-19B also confirm the fact that the proposed method is applicable at grounded converter connected buses (bus-3) as well as at non-grounded buses that do not have converter support (bus-4) without any modifications.

As depicted in FIGS. 19A-19B, for N-pole-to-DMR faults on Line-34, the observed minimum value of $F_{RN}$ calculated for relay R34 is 0.88 and for N-pole-to-ground-to-DMR faults, the maximum value of $F_{RN}$ is 0.53. For P-pole-to-DMR faults, the observed maximum value of $F_{PR}$ is 1.14 and for P-pole-to-ground-to-DMR faults, the minimum value of $F_{PR}$ is 1.48. Therefore, the threshold $D_2$ can be set to 1.3. This value of $D_2$ sets $k_3$ to 0.23 and $k_4$ to 0.3.

D. Identifying Pole-to-Ground Faults Using $F_{gRN}$ or $F_{gPR}$

Figure 20A:
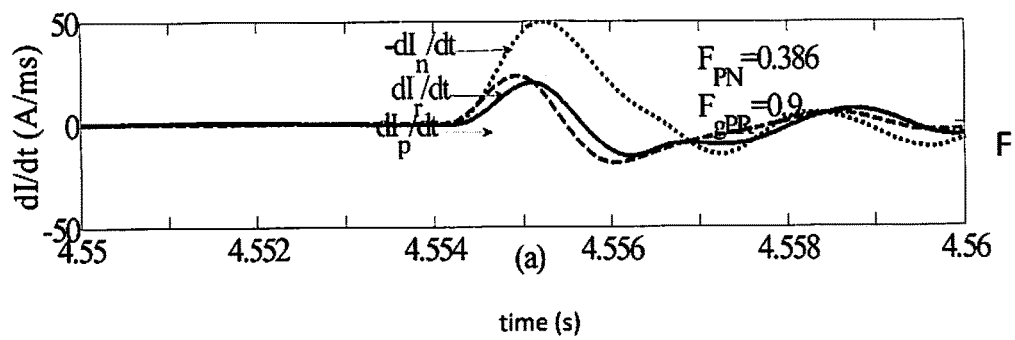
FIGS. 20A and 20B show ROCOCs at R43 for faults on Line-34, and more specifically an N-pole-to-ground fault at 1200 km; and a N-pole-to-DMR-to-ground fault at 750 km, respectively.
Figure 20B:
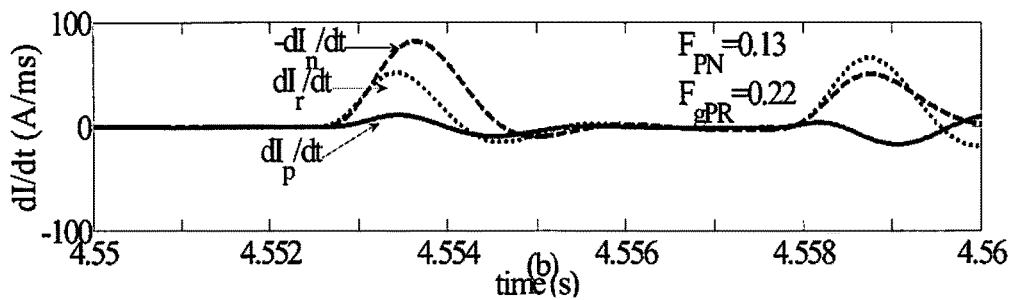

FIGS. 13B and 20A demonstrate the results for a P-pole-to-ground and an N-pole-to-ground fault. Nearly equal magnitudes of peak ROCOC values of the DMR current and the healthy pole currents shown in FIG. 13B and FIG. 20A demonstrate the fulfilment of Criteria-C1 and C2 for healthy conductors during a P-pole-to ground fault and an N-pole-to-ground fault respectively (for faults on overhead transmission lines in VSC systems). As per FIG. 20B, an N-pole-to-DMR-to-ground fault does not satisfy Criterion-C2 since estimated $F_{gPR}$ is considerably smaller than unity.

Figure 21A:
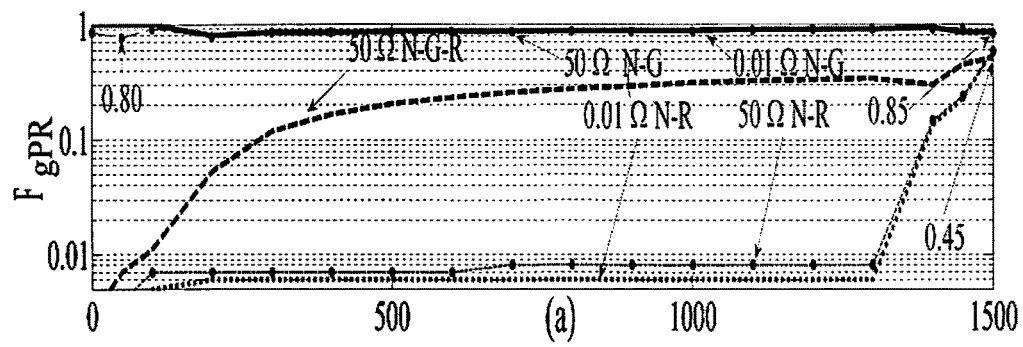
FIGS. 21A and 21B show ground fault discrimination at R34, and more specifically $F_{gPR}$ for different types of N-pole faults; and $F_{gRN}$ for different types of P-pole faults on Line-34, respectively.
Figure 21B:
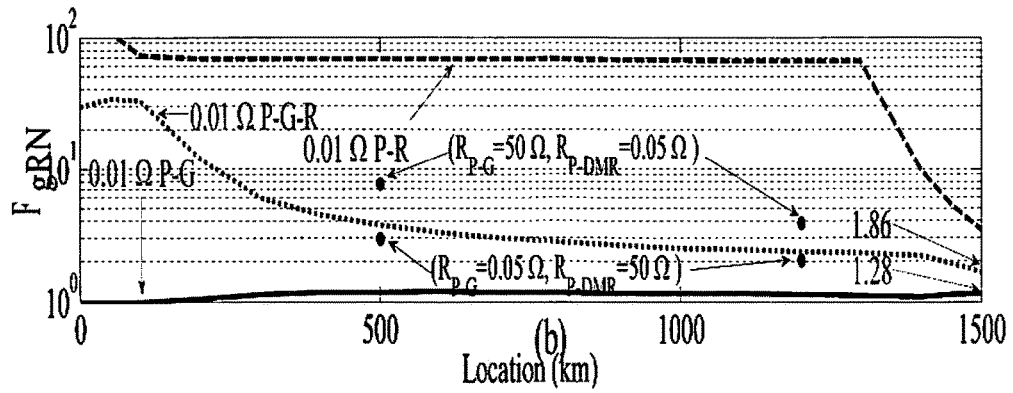

FIG. 21A shows that $F_{gPR}$ is close to 1.0 for solid and high resistance N-pole-to-ground faults on Line-34, while N-pole-to-DMR faults and N-pole-to-DMR-to-ground faults, $F_{gPR}$ is lower than 1.0 (Criterion-C'2). Fulfillment of Ctririon-C'I for P-pole-to-ground faults can be verified from FIG. 21B which shows $F_{gRN}$ for P-pole faults at relay R34.

For Line-34, the minimum observed $F_{gPR}$ for N-pole-to-ground faults and the maximum observed $F_{gRN}$ for P-pole-to-ground faults were 0.85 and 1.28 respectively. For pole-to-ground-to-DMR faults, the maximum observed $F_{gPR}$ was 0.45 and the minimum $F_{gRN}$ was 1.86. Therefore, $D_3$ can be set between 1.28 and 1.86, and $D_3=1.6$ will satisfy the requirements. This value of $D_3$ sets $k_5$ to 0.375 and $k_6$ to 0.6.

E. Discriminating DMR Faults and Ground Faults in LCC-HVDC Transmission Systems with DMR The presence of a large DC reactor in pole conductors of LCC-HVDC systems causes noticeably lower di/dt in the pole conductor compared to DMR conductors when subjected to similar conditions (in the LCC HVDC example used, there is no reactor installed on the DMR conductor to simulate the worst case for fault type discrimination, although inductors may be installed on the DMR conductor in some systems). Therefore, when compared with VSC systems, calculated indices for LCC systems tend to deviate from the ideal values of indices, 1, sometimes violating the criteria presented in Section-II.B. However, the algorithm in FIG. 7 with modified criteria is still capable of correctly identifying the faulted conductors. The results presented in this section confirm this. The calculated values of $F_{RN}$ and $F_{gPR}$ at the LCC rectifier for N-pole faults are shown in FIGS. 22A-22B.

Figure 22A:
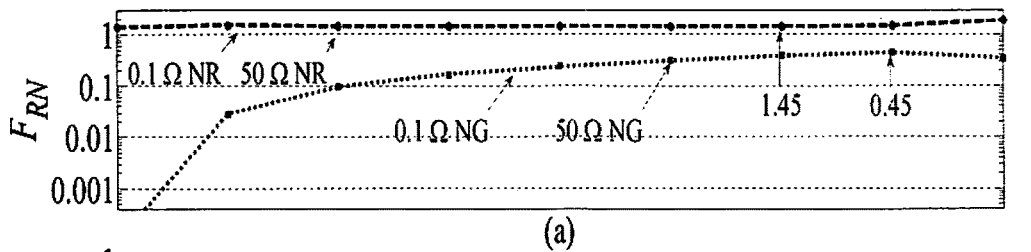
FIGS. 22A and 22B show discriminating N-pole-to-DMR faults from N-pole-ground faults in an LCC-HVDC system with DMR, and more specifically $F_{RN}$ for N-pole-to-ground faults and N-pole-to-DMR faults; and $F_{gPR}$ for N-pole-to-ground faults and N-pole-to-DMR faults, respectively.
Figure 22B:
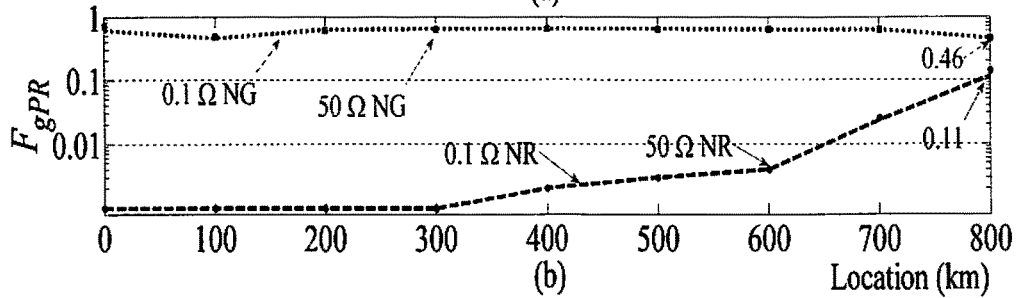

As seen in FIG. 22A, the calculated $F_{RN}$ is slightly higher than unity for N-pole-to-DMR faults due to large asymmetry in the terminations. However, this does not hinder the ability to distinguish N-pole-to-DMR faults from N-pole-to-ground faults using Criterion-B'2 since there is a sufficient margin between the values of $F_{RN}$ calculated for these two types of faults. On the other hand, as depicted in FIG. 22B, $F_{gPR}$ is slightly less than unity for N-pole-to-ground faults due to terminal asymmetry, although the expected value is 1. But, any N-pole-to-ground fault can be distinguished from a fault where the DMR conductor is involved with the help of the calculated value of $F_{gPR}$ and Criterion-C'2.

F. Discussion of Potential Practical Issues

The proposed faulted conductors identification methodology was thoroughly verified using detailed simulations. However, in real systems measurements are contaminated with (i) noise, and (ii) sensor errors. The effect of high frequency noise is a concern because the indices are computed using time derivatives of the measured currents, however, thanks to the inherent low-pass filtering in the signal processing stage, the effect of noise is largely eliminated. Simulation experiments showed that addition of up to 10% Gaussian noise to raw current signals has no significant impact. More concerning are the possible bias errors in current sensors. Bias errors in opposite directions can cause a particular index to deviate from its expected range. The insurance against this is the discrimination margin: the thresholds ($D_x$ values) must be selected considering the sensor tolerance levels. In extreme scenarios, it may not be possible to find threshold values to satisfy all situations. Fault discrimination at a grounded converter is more challenging than fault discrimination at an ungrounded converter station, particularly the discrimination between pole-to-ground and pole-to-DMR-to-ground faults at remote ends. The applicability of the proposed method may have limitations for systems in which the DMR is grounded at a point along the transmission line. Finally, the proposed method is not designed to detect DMR-to-ground faults, which generally needs an active method involving injection of test currents.

Conclusions Regarding Fault Classification for HVDC Systems

The ratios between the maximum rates of change of band limited current measurements for different conductor pairs can provide information on fault types in HVDC transmission systems. Based on those ratios for different conductor pairs, five indices were defined to aid fault type discrimination. The proposed indices were shown to be dependent on the fault type and location, but independent of the fault resistance. For two-conductor systems, only one index can be defined, but it is sufficient to distinguish between three possible fault types. For three-conductor systems, all five indices are necessary to distinguish all possible fault types. A set of decision criteria and a systematic procedure for using those criteria for fault type identification was developed. The proposed method was evaluated rigorously for a LCC HVDC based bipole two-conductor and three-conductor system as well as for a three-conductor VSC based multi-terminal HVDC grid through detailed simulations in PSCAD. The method can provide fast and reliable fault type decisions using only local current measurements for existing and future VSC based point-to-point HVDC systems including MT-HVDC grids having overhead lines and cables. The fault type information can be used to supervise protection functions and control functions. Furthermore, maintenance crews can be informed whether a DMR conductor is involved in a fault, which can be critical for safety. The method can be easily implemented at low cost since (i) the threshold settings can be easily set as indices are almost independent from fault resistance; and (ii) uses only locally measured low frequency current measurements.

A simple and yet dependable technique for fault type identification in HVDC transmission systems is described hereinbefore. A set of indices is defined for pairs of rate of change of current measurements to identify the pole(s) involved in the fault, and to discriminate the ground faults from those involved with the dedicated metallic return conductor. The proposed fault discrimination method will identify the faulty pole within a 1 ms window, and therefore, it can be used to improve the sensitivity and reliability of DC fault protection. Furthermore, the knowledge whether or not the dedicated return conductor is involved in the fault is useful for determining the post-fault configuration of bipole grids. Considerable discrimination margins are observed during the rigorous evaluation of the technique for two-conductor and three-conductor HVDC systems under various fault scenarios, for both considerably long overhead transmission lines and cables. The indices can be computed using local current measurements made using low bandwidth sensors. They are independent of the fault resistance and therefore, settings can be found easily.

FIGS. 23 through 34 relate to an arrangement of another aspect of the invention described herein which relates to a method for determining fault location when a fault event has occurred along one of a pair of power-transmitting conductors of a power transmission system. Such a method generally comprises the steps of:

monitoring current signals which are representative of currents in the conductors at adjacent connection terminals which are located at a generally common location within the power transmission system;

filtering the current signal of each conductor to produce a filtered current signal of each conductor;

determining a maximum rate of change of the filtered current signal of each conductor within a predetermined time interval after the fault event has commenced;

calculating a ratio of the maximum rates of change of the filtered current signals;

providing predetermined calibration data which comprises a plurality of ratios of maximum rates of change of current of the pair of conductors, each ratio being representative of a fault at a corresponding distance from the connection terminal of the faulted conductor;

comparing the calculated ratio against the calibration data to determine the distance from the connection terminal of the faulted conductor to the fault location.

The arrangement of fault location scheme described in further detail hereinafter uses coupling characteristics of transmission line estimated using local current measurements. The coupling coefficient defined in this paper is a smooth single valued function of fault location and independent of fault resistance. Therefore, fault can be located easily with the help simple two dimensions cubic interpolation using a few pre-fault current measurements. Hence, as the proposed coupling coefficient is independent from fault resistance, the scheme can be employ easily with very few data sets when compared to [33, 35]. As proposed fault location avoids high bandwidth current sensors, scheme can be implemented without additional cost by using available current measurement for converter controls. Fault location is not impacted by fault clearing process that initiates after detecting a fault (which happens within a couple of milliseconds after fault created wave hits the converter terminal) since the method needs only a short window of measurements, 1 ms, when compared with 10 ms in [33, 35] or time to arrive active pulse after reflecting from fault as in [30]. When compared with active pulse based single pole fault location method in [30], no access is needed to converter controls. The method can be applied for line commutated converters (LCC) as well as voltage source converter based HVdc transmission systems. This scheme is only applicable for locating single pole faults as fault location is carried out with the help of coupling of fault created disturbance to the other conductor.

Principle of Fault Location

Figure 23:
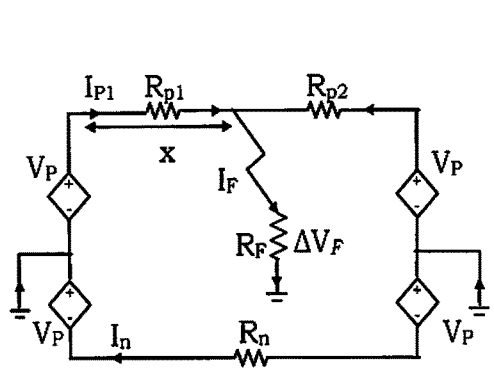
FIG. 23 illustrates an equivalent circuit representing a power transmission system with a pair of power-transmitting conductors immediately after a fault event, where there is a step change in voltage at fault.

A DC side fault creates a step change in voltage at the point of fault and travel away from the point of fault towards the terminals. As per FIG. 23 representing the equivalent circuit just after the fault, the magnitude of the step change $\Delta V_F$ can be found by Equation (5):

$$\Delta V_F(t = 0^+, x) = V_p \frac{R_F}{R_F + R_T} \quad (5)$$

where $R_T$ is the parallel equivalent of total series resistance from each terminal to the point of fault, $R_{p1}$ and $R_{p2}$.

This step change in voltage travels along the line which has series inductance and resistance along the line and shunt capacitance which represents electrostatic coupling between the lines. Change in voltage at any point along the faulty conductor creates a change in voltage across the shunt capacitance $C_{CC}$ shown in FIG. 24.

This causes a change in current through the healthy pole which is governed by Equation (6):

$$i_{sh}(t = 0^+, x) = C_{cc} \frac{dV_{pn}}{dt} \quad (6)$$

As this current $i_{sh}$ forces a change in current through series inductor, change in voltage across the shunt capacitance limit by the series inductance. Therefore, $\Delta v_{pn}$ decreases along the line. However, according to Equation (7) and Equation (8), change in current through healthy pole with respect to the faulty pole keeps increasing towards the terminal.

$$\Delta i_p^+ = \Delta i_p^- - C_{cc}\frac{dv_{pn}}{dt} \quad (7)$$

$$\Delta i_n^+ = \Delta i_n^- + C_{cc}\frac{dv_{pn}}{dt} \quad (8)$$

As contribution from shunt current $i_{sh}$ adds at each infinitesimally small section of line, the ratio between change in current through the healthy pole to faulty pole determined is function of distance to the fault from the terminal. Therefore, observed change in current or voltage at the terminals of healthy pole due to coupling is an indicator of distance to the fault. However, in addition to the distance to the fault, magnitude of the change in terminal current also depends on magnitude $\Delta V_F$ which is determined by the fault resistance as per Equation (5). This dependency can be removed as described below. Change in current at the terminals due to change voltage at a point in transmission line can be characterised by Equation (9).

$$\begin{bmatrix} \Delta i_{pt}(s) \\ \Delta i_{nt}(s) \end{bmatrix} = \begin{bmatrix} G_{pk}(s) & G_{pnk}(s) \\ G_{npk}(s) & G_{nk}(s) \end{bmatrix} \begin{bmatrix} \Delta V_{pf}(s) \\ \Delta V_n f(s) \end{bmatrix} \quad (9)$$

If change in voltage due to a low resistance p-pole to ground is $\Delta V_F$, then for a high resistance faults, it is $\Delta V_F/k$. Where k is greater than unity. Then expected variation of changes in currents at the terminals are given by Equations (10) and (11)

$$\begin{bmatrix} \Delta i_{pt}(s) \\ \Delta i_{nt}(s) \end{bmatrix} = \begin{bmatrix} G_{pk}(s, l)\Delta V_F/s \\ G_{npk}(s, l)\Delta V_F/s \end{bmatrix} \quad (10)$$

$$\begin{bmatrix} \Delta i_{pt}(s) \\ \Delta i_{nt}(s) \end{bmatrix} = \begin{bmatrix} G_{pk}(s, l)\Delta V_F/ks \\ G_{npk}(s, l)\Delta V_F/ks \end{bmatrix} \quad (11)$$

According to Equations (10) and (11), expected changes in terminal currents increase in the same proportion. Therefore, the ratio between changes in currents is independent of fault resistance and determined by the distance to the fault. Therefore, coupling between conductors estimated during a single pole fault can be used for automatic fault location. Coupling on n-pole conductor due to a fault in p-pole conductor, defined in Equation (12), can be used to locate p-pole faults.

$$K_{np}(l) = \frac{di_{nt}}{di_{pt}} \quad (12)$$

Proposed Fault Location Method

Figure 25:
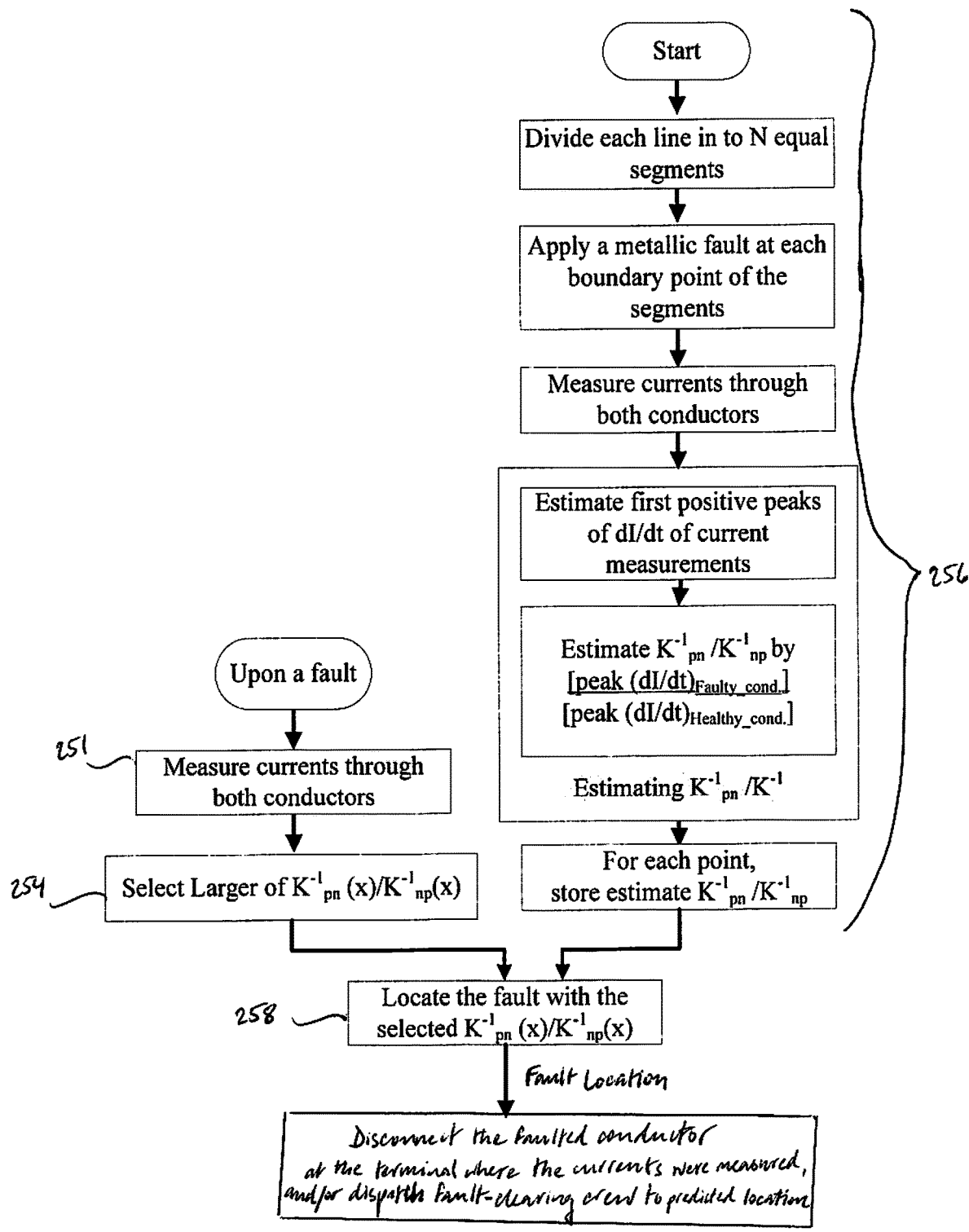
FIG. 25 shows a proposed single pole fault location scheme.

By applying metallic faults, inverse coupling coefficients are estimated for a number of test points separated by equal space. The pre-calculated coefficients, $K^{-1}_{pn}(x)$ and $K^{-1}_{np}(x)$ for faults in each conductor are stored in an array. Select the larger of $K^{-1}_{pn}$ or $K^{-1}_{np}$ which are estimated with the help current measurements taken during the fault. As depicted in FIG. 25, calculate the fault location for selected coefficient using nonlinear interpolation.

Figure 26:
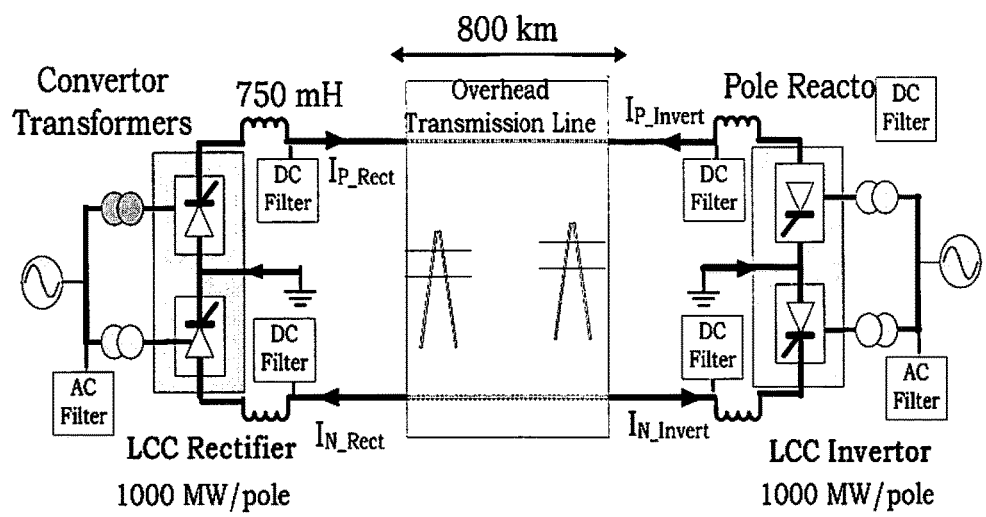
FIG. 26 shows a bipole LCC based two-terminal HVdc test grid for evaluating performance of the scheme illustrated in FIG. 25.

Thus it is at reference numeral 251 in FIG. 25 where the step of monitoring the current signals, which are representative of currents in the conductors such as P-pole and N-pole conductors on the top and bottom of FIG. 26, at adjacent connection terminals which are located at a generally common location within the power transmission system, for example at the LCC rectifier in FIG. 26, is performed. The step of filtering the current signal of each conductor to produce a filtered current signal of each conductor may also be considered as being performed at 251.

At 254 is performed the step of determining a maximum rate of change of the filtered current signal of each conductor within a predetermined time interval after the fault event has commenced. The step of calculating a ratio of the maximum rates of change of the filtered current signal is also considered as being performed at 254. In the illustrated arrangement, two ratios which are inverses of one another and which use the same measured quantities are calculated, and the ratio which is greater than one is used in remaining steps of the method. Alternatively, it may be considered that a single ratio is calculated and if it is greater than one then it is used in subsequent steps of the method; otherwise, that is if the calculated ratio is less than one, then the compared ratio is the inverse of the initially calculated ratio.

Generally on the right-hand side of FIG. 25 at 256 is shown the step of providing predetermined calibration data which comprises a plurality of ratios of maximum rates of change of current of the pair of conductors, each ratio being representative of a fault at a corresponding distance from the connection terminal of the faulted conductor. Typically, the calibration data is derived from a computer simulation model of the power transmission system.

At 258 is performed the step of comparing the calculated ratio against the calibration data to determine the distance from the connection terminal of the faulted conductor to the fault location. Typically, the step of comparing the calculated ratio against the calibration data comprises checking the calculated ratio against a lookup table containing the calibration data.

Once the distance to the fault location is determined using the foregoing method, a fault-clearing crew can be dispatched to the predicted fault location in order to repair the faulted conductor.

When the power transmission system has cascaded transmission lines, such that the faulted conductor has a first length thereof spanning from the connection terminal of the faulted conductor where the current therein was measured to an opposite remote connection terminal at a remote location within the power transmission system, and a subsequent series of lengths of the faulted conductor operatively connected to the remote connection terminal of the first length so as to transmit power beyond the remote connection terminal of the first length to a farther location within the power transmission system, the method further includes a step of checking whether the predicted distance is less than the first length of the faulted conductor between the opposite connection terminals thereof, and if true then determining that the fault is located along the first length of the faulted conductor; or if false then determining that the fault is located along the subsequent series of lengths of the faulted conductor;

and if the fault is determined to be located along the first length of the faulted conductor, disconnecting the first length of the faulted conductor so as to interrupt fault currents generated as a result of the fault event.

Note that coupling coefficient defined in Equation (12) lies between 0 and 1. Therefore, for the convenience of fitting and handling, inverse of the coupling coefficient defined in Equation (13) is utilised herein.

$$K_{np}^{-1}(l) = \frac{\max(di_{pt}/dt)}{\max(di_{nt}/dt)} \quad (13)$$

For N number of metallic faults applied at equal distance along the line is used to model coupling characteristics of the transmission line. In locating fault, both $K_{np}^{-1}$ and $K_{pn}^{-1}$ are estimated and the one greater than unity is selected for fault location. With the help of nonlinear interpolation, fault is located via estimating possible distance in which the estimated inverse coupling coefficient for the fault could be fit in pre-calculated coupling characteristics.

Test System for Fault Location Method

Figure 27:
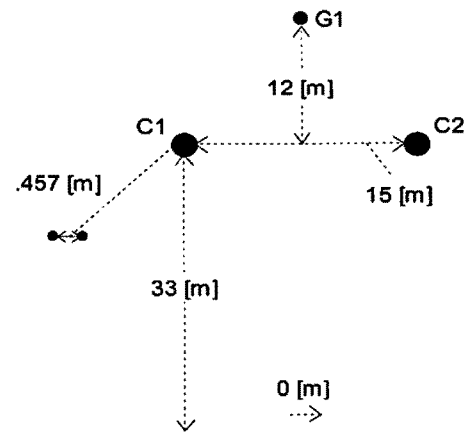
FIG. 27 shows a design of the two conductor based overhead transmission line of FIG. 26.
Figure 24:
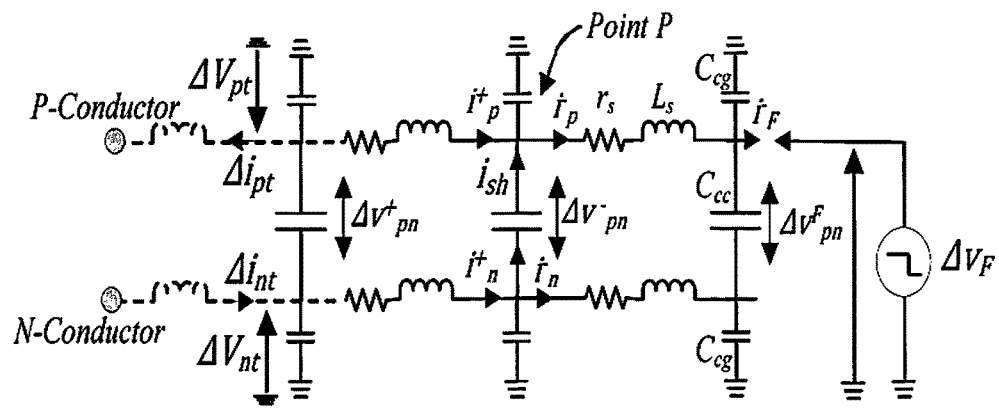
FIG. 24 shows the fault represented by the circuit in FIG. 23 as creating wave propagation.

With the help of a detailed electromagnetic transient (EMT) model for LCC based bipole HVdc transmission system that modelled using PSCAD/EMTDC, performance of the proposed fault location scheme is evaluated. A twelve pulse LCC based two-terminal HVdc transmission system shown in FIG. 26 is simulated. Rectifier and inverters are respectively assumed to be operated under current controlled mode and constant extinction angle control mode. The simulation time step is set to 20 μs. Important converter parameters are given in Table IV. The overhead transmission line design is shown in FIG. 27. The transmission line is modelled with frequency dependent phase model in PSCAD. As in Manitoba Bipole-II HVdc link [26], two-conductor configuration with no return wire is considered. As monopole operation is expected for short time after single line pole failures, both converter stations are grounded.

The ability of using proposed fault location scheme in monopole transmission configuration is investigated under the above test conditions. In this case, the second conductor of the transmission line shown in FIG. 27 is used as the metallic return wire. A single twelve pulse LCC converter with all parameters given in Table IV is used except 500 km is considered as the length.

Results of Test of Fault Location

Use of Coupling Coefficients in Fault Location

For metallic faults applied at intervals of 50 km, first peaks of rate of change of current (ROCOC) are recorded for the current measurements taken from both terminals. Although fault location can be done using the rectifier end or inverter end terminal current measurements, only fault location using rectifier end measurements is given in this paper. The estimated inverse coupling coefficients, $K^{-1}_{mp}$ and $K^{-1}_{pn}$, at the rectifier end of bipole two-conductor tests systems are shown Table V. Fault location is computed by applying cubic interpolation using the estimated coefficient for the given fault and pre-calculated coefficients shown in Table V.

For a metallic P-pole to ground fault applied at 312 km away from the rectifier, calculated ROCOCs for current through P-pole and N-pole conductors are shown in FIG. 28A. The coefficient $K^{-1}_{np}$, the ratio between first peaks of ROCOC observed at P-conductor and N-conductor currents, is 7.4687. The estimated fault location with the help of interpolation is 311.879 km which is just 210 m away from the actual fault. The ROCOC peaks shown in FIG. 28B are for a 60Ω P-pole to ground fault applied at 236 km. The value of $K^{-1}_{np}$ is 10.6715 and the corresponding location is 239.9792 km.

Possible degree of changes in inverse coupling coefficient with the fault resistance is demonstrated with the help of peak ROCOC values shown in FIGS. 29A and 29B. FIGS. 29A-29B which show computed ROCOC values for a metallic fault and a 100Ω fault applied at 430 km. Although first peak of ROCOC observed at P-pole conductor reduces from 18.87 kA/ms to 12.39 kA/ms when the fault resistance increases to 100Ω, as first peak of ROCOC measured at N-pole current also decreases, $K^{-1}_{np}$ or the ratio remains almost the same (4.97 vs. 4.99). Therefore, as $K^{-1}_{pn}$ and $K^{-1}_{np}$ can be practically considered as independent from fault resistance, the pre-calculated fitting estimated with metallic faults can be used estimate the distance to high resistance faults.

FIG. 30 further elaborates the ability of using proposed pre-calculated fitting curve of $K^{-1}_{np}$ for fault location. As depicted in FIG. 30, despite of fault resistance, the estimated inverse coupling coefficients for selected fault scenarios coincides with the $K^{-1}_{mp}$ curve estimated for metallic faults. This shows that the inverse coupling coefficient proposed in this paper can be used locate the single pole faults conveniently by avoiding need of many training data sets or complex features searching/mining techniques.

Locating Faults Using $K^{-1}_{pn}$ and $K^{-1}_{mp}$

Table VI show the estimated fault locations for P-pole to ground faults applied on some randomly selected locations. For each of the fault scenario described in first two columns of Table VI, the estimated inverse coupling coefficients $K^{-1}_{np}$ μsing transient current measurements are shown in column 3. As the rate of change of $K^{-1}_{np}$ with the distance is lower for far fault, four decimal points precision values are used to maintain the accuracy. Fault location is estimated using pre calculated $K^{-1}_{np}$ given in Table V and $K^{-1}_{np}$ calculated for the given fault using the Matlab interpolation function with the cubic interpolation option. Fourth and fifth columns indicate estimated distance to the fault and error in kilometres. The percentage error is calculated using Equation (14).

$$\text{Error } (\%) = \frac{\text{Esti. Fault Loc.} - \text{Act. Fault Loc.}}{\text{Transmission Line Length}} \times 100 \quad (14)$$

Estimated fault locations for N-pole to ground faults are given Table VII. The inverse coupling coefficient $K^{-1}_{pn}$ shown in Table II is used to estimate the fault location. The results given in Table VI and VII are taken when each pole delivers 700 MW.

As per Table VI and VII, an average error of about 0.12% or 0.95 km can be expected. Therefore, it is possible to locate low resistance faults at a level of 99.88% accuracy with the proposed scheme. Therefore, if three tower spans are assumed to be spread along 1 km, actual fault could be expected within three spans of located span. The error is higher for faults near converters when compared with faults away from the converters.

Possibility of locating faults in monopole HVdc transmission systems using the estimated coupling between pole conductor and metallic return conductor, $K^{-1}_{rp}$, is investigated. Table VIII shows estimated fault locations for 500 km long monopole HVDC configuration. The estimated average error, about 1.4 km, is higher than the estimated error, 0.95 km, for bipole configuration.

Locating Faults Using Ground Coupling

Figure 31:
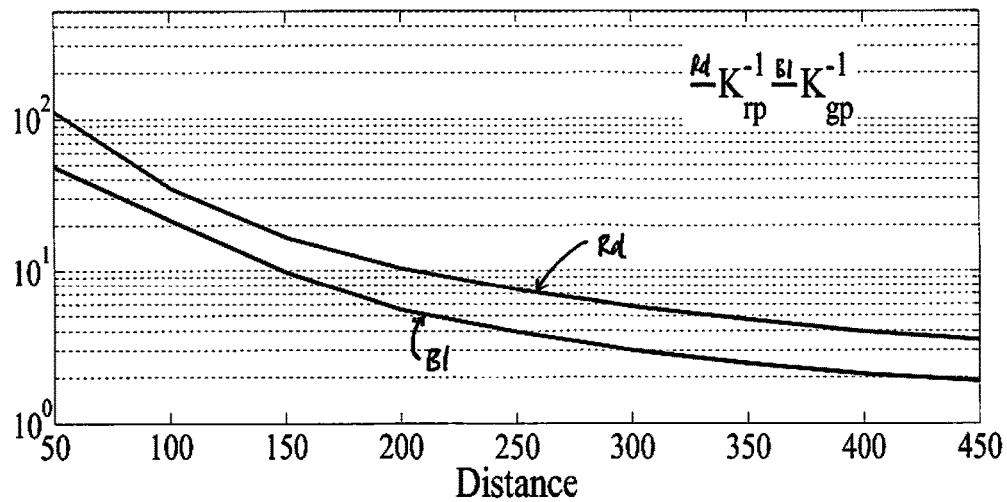
FIG. 31 shows the inverse coupling coefficient estimated for pole conductor to ground.
Figure 32:
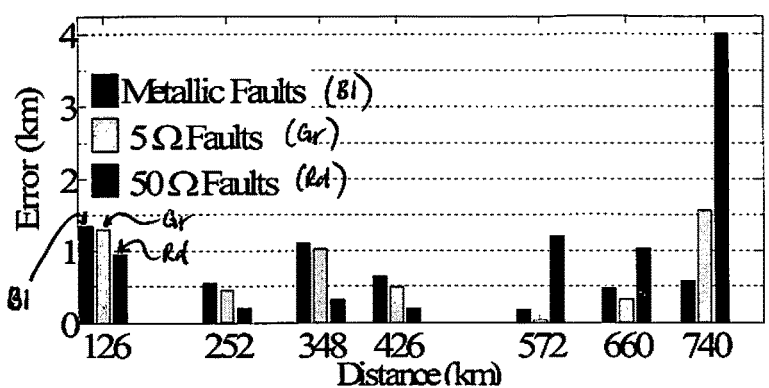
FIG. 32 shows variation of error with fault resistance.

The possibility of locating faults using coupling between pole conductors and the ground is investigated. FIG. 31 shows the calculated inverse coupling coefficient between pole conductor and ground current, $K^{-1}{}_{gp}$, together with inverse coupling coefficient $K^{-1}{}_{rp}$. As shown in FIG. 32, the variation of $K^{-1}{}_{gp}$ with distance resembles very closely to the variation of $K^{-1}{}_{rp}$ with the distance.

Coefficients $K^{-1}{}_{gp}$ calculated for metallic faults applied at the intervals of 50 km are used to locate faults in monopole HVdc transmission system. Estimated fault locations for some selected random faults are given in Table IX. The calculated average error in fault location is about 2.166 km or 0.433%.

High Resistance Faults and Change in Power Flow

The degree of impact of fault resistance is evaluated by applying faults having resistance between 5Ω-70Ω and are some randomly selected results given in Table X. The estimated error, about 1.22 km or 0.15%, is slightly higher than the observed error for low resistance fault.

Estimated locations for metallic faults, 5Ω faults, and 50Ω faults applied at some fault locations are depicted in FIG. 32. According to FIG. 32, although estimated fault locations are not significantly different for metallic faults and 5Ω, the estimated fault location for 50 $2 fault are considerably different from the other two.

Figure 33:
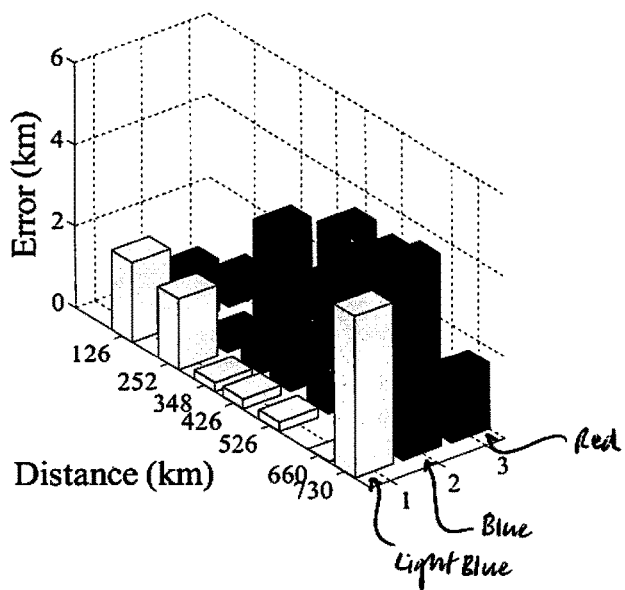
FIG. 33 shows variation of error with changes in converter power level.

FIG. 33 shows the estimated fault locations for some metallic faults when power flow is 0.35 pu, 0.7 pu (fitting data is taken at this operating point), and 0.9 pu. Although difference between average errors when operating at 0.7 pu and 0.9 pu is not noticeable (1.2 km and 1.5 km), the average error increases up to about 1.9 km when operating at lower power levels such as 0.35 pu. This may be due to presence of higher harmonic content at larger firing angles.

Conclusions about Fault Location Method

The association between coupling coefficient and the fault location is illustrated. A single pole fault location scheme based on inverse coupling coefficient is proposed and evaluated in this paper. The observed average error percentages for bipole test system and monopole test systems are not worse than respectively 0.15% and 0.25%. This accuracy is good enough to expect the actual fault within 3 or 4 tower spans from the located span. With slight expense of accuracy, the method works even at high resistance faults and at different converter power levels. The method is easy to implement as large set of simulations results are not needed as the coupling coefficient is independent from fault resistance and only interpolation is required in locating faults. A short measurement window, 1 ms, is enough to estimate the coupling coefficient, fault can be located promptly and can be used to develop a distance protection scheme.

A method to locate faults via estimating the coupling coefficient with the help of single end current measurements taken within the first mille-second after the fault created wave reach the terminal is described hereinbefore. Coupling coefficient between conductors is demonstrated as a superior indicator for single pole fault location. As the coupling coefficient is not dependent on fault resistance, the single pole fault location can be done with the help of pre-calculated inverse coupling coefficients estimated for some metallic faults applied at regular intervals. The performances of the proposed single end fault location scheme are evaluated in long bipole line commutated converter based HVdc transmission system as well as in a medium length monopole HVdc transmission configuration. Higher accuracy is observed despite of simplicity of the proposed scheme.

FIGS. 34 through 48C relate to another arrangement of the first aspect of the invention described herein that is particularly suited for high voltage alternating current (HVAC) power transmission systems. This arrangement is provides comprehensive and fast approach of classifying the fault type and identifying the faulty phases based on the initial part of fault generated current transient. Three indices are defined considering different combinations of two phase currents. Each of these indices reflects relative magnitudes of the rate of change of current through the two phases considered. The prosed method has many advantages. It relies only on current measurements and avoids the need of specially designed transducers for voltage measurements, as traditional CVTs distort the transients [44]. As these indices are almost independent from fault resistance, the proposed fault type classification and phase selection algorithm is robust and can be implemented as simple threshold based comparison. Therefore, the method is simple and transparent, when compared with algorithms that use tools such as fuzzy logic or machine learning techniques. The proposed method is rigorously evaluated for different fault locations and fault inception angles. Since it is based on initial current transient, phase selection can be done within in a very short time span. Furthermore, as the proposed method uses only locally measured current transients, need of communication is avoided.

Fault Created Waves and Identification of Faulty Phases in HVAC System

Figure 34:
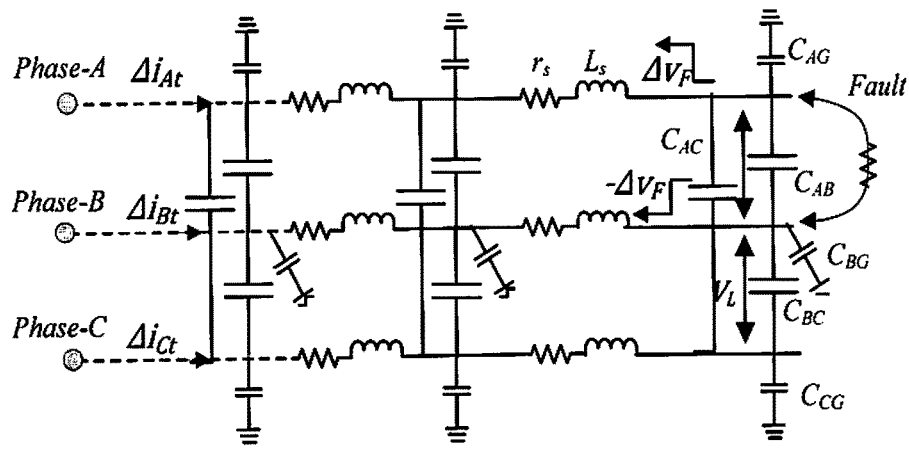
FIG. 34 shows fault wave propagation in a high voltage alternating current (HVAC) power transmission system.

In three-phase systems, voltages across the capacitances between lines remain at line voltage while the voltages across the capacitances to ground vary. A fault in a transmission line creates a step change and rapid redistribution of charges among the capacitances at the location of fault. For example, consider a fault between two lines, the voltage between them becomes zero or very small at the fault. The step change in the voltage between the faulted lines can be represented as the sum of a negative step and a positive step having equal magnitudes, as depicted in FIG. 34 for a fault between Phases-A and B. These step voltages applied at the fault propagate along the lines towards the terminals.

The changes in terminal currents due to propagated voltage surges can be evaluated by Equation 15 below:

$$\begin{bmatrix} \Delta i_A(s) \\ \Delta i_B(s) \\ \Delta i_C(s) \end{bmatrix} = \begin{bmatrix} G_{AFk}(s) & G_{BAk}(s) & G_{CAk}(s) \\ G_{ABk}(s) & G_{BFk}(s) & G_{BCk}(s) \\ G_{ACk}(s) & G_{CBk}(s) & G_{CFk}(s) \end{bmatrix} \begin{bmatrix} \Delta V_f(s) \\ -\Delta V_f(s) \\ 0 \end{bmatrix} \quad (15)$$

where $G_{PFk}$ (s) is the forward transfer function of Phase-P, i.e. change in terminal current in Phase-P due to a change in voltage of Phase-P at the location of fault. $G_{PQk}$ (s) is the mutual coupling between Phase-P and Phase-Q, i.e. change in terminal current of Phase-Q due to a change in Phase-P voltage at the location of fault. The forward and mutual transfer functions have different frequency characteristics, and the forward transfer function has a greater magnitude than that of the coupling function over certain frequency range (lower frequencies). Within this frequency range, the magnitudes of change in terminal current signals ($\Delta i_p s$) of the phases involved in the fault would be larger than the change in the terminal current of the remaining phase. Moreover, the magnitudes of the changes in terminal current signals will be approximately the same for the two phases involved in the fault, due to similar excitation functions ($\Delta V_f(s)$ and $-\Delta V_f(s)$). For the case shown in FIG. 34, $|\Delta i_A(s)|$ and $|\Delta i_B(s)|$ will be larger than $|\Delta i_C(s)|$ and $|\Delta i_A(s)| \approx |\Delta i_B(s)|$ within the particular frequency band. Therefore, the phases involved in a line-to-line fault can be identified as the two phases having highest magnitudes of change in terminal currents.

During a line-to-ground fault, the step change in voltage happens in only one phase. According to Equation (16), which considers a Phase-A-to-ground fault, the expected change in current through two remaining phases (Phases-B and C) are govern by the coupling terms.

$$\begin{bmatrix} \Delta i_A(s) \\ \Delta i_B(s) \\ \Delta i_C(s) \end{bmatrix} = \begin{bmatrix} G_{AFk}(s) & G_{BAk}(s) & G_{CAk}(s) \\ G_{ABk}(s) & G_{BFk}(s) & G_{BCk}(s) \\ G_{ACk}(s) & G_{CBk}(s) & G_{CFk}(s) \end{bmatrix} \begin{bmatrix} \Delta V_f(s) \\ 0 \\ 0 \end{bmatrix} \quad (16)$$

Therefore, for the frequency band in which the forward transfer function has greater magnitude than the coupling terms in Equation (16), a larger change in current is expected in the faulty phase. Moreover, the changes in terminal currents of the phases not involved in the fault will be similar in magnitude. For the case considered in Equation (16), $|\Delta i_A(s)|$ will be larger than $|\Delta i_B(s)|$ and $|\Delta i_C(s)|$ while $|\Delta i_B(s)| \approx |\Delta i_C(s)|$, within the particular frequency band.

The changes in currents through two-phases are comparable in magnitudes for two phases during both line-to-line and line-to-ground faults. However, a line-to-ground fault can be discriminated from a line-to-line fault by considering whether the magnitude of the change of current in the remaining phase is higher or lower, as explained above. Alternatively, a line-to-ground fault can be reliably recognized from the presence of residual ($3I_0$) current. Although a fast faulty phase selection algorithm can be developed considering the comparison of the changes in terminal currents ($|\Delta i_p(s)|$ values), they depend on three factors: fault inception angle, fault location, and fault resistance. Therefore, intelligence based approach such as [38], are often used. The change in resistance causes the magnitude of the voltage step in Equations (15) and (16) to change. However, as Equations (15) and (16) represent a linear system, all terminal currents change proportionally. Therefore, influence of fault resistance in comparison of current transient can be mitigated by using the index $F_{pq}$ defined in Equation (17), which express the change of current in Phase-P relative to that of Phase-Q.

$$F_{pq}(s) = \frac{\Delta i_P(s)}{-\Delta i_Q(s)} \quad (17)$$

As the index defined in Equation (17 is in the frequency domain, it represents a function that varies with the time. In practical implementation, it is convenient to work with time domain signals with proper filtering. The indices defined as in (18) were found to provide the information required for identifying faulted phases.

$$F_{pq} = \frac{\max|di'_p(t)/dt|}{\max|-di'_q(t)/dt|} \quad (18)$$

In Equation (18), $i'_p(t)$ and $i'_q(t)$, are band limited signals obtained from the currents in Phases P and Q respectively. This is to ensure that signals are in the frequency range where magnitudes of forward transfer functions are greater than those of the coupling terms. In order to mitigate the influence of reflected waves on the index, the maximum is calculated considering a short window of time after detecting a fault. Three indices ($F_{ab}$, $F_{bc}$, and $F_{ca}$) can be computed considering two phases at a time. Fault type and the faulty phases can be identified based on the values of three indices and the presence or absence of residual current. The index in Equation (18) is closer to unity when the fault is between Phase-P and Phase-Q or Phase-R and ground, greater than unity when Phase-P is involved in a fault while Phase-Q is not involved, and less than unity if only Phase-Q is involved in the fault.

Proposed Fault Classification Method for HVAC System

Figure 35:
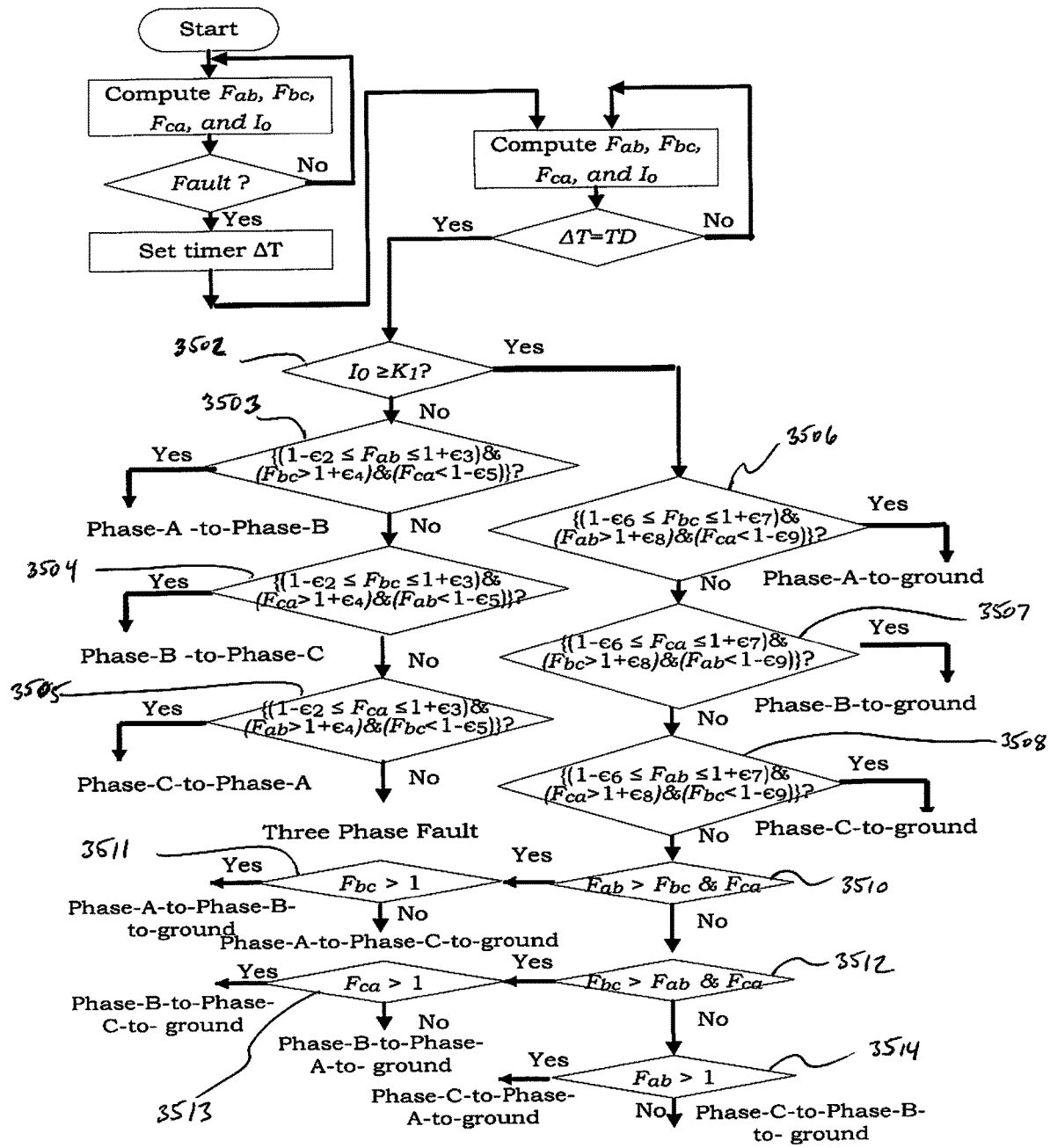
FIG. 35 shows a proposed fault type and faulty phase(s) identification algorithm for a HVAC power transmission system.

Three indices and the instantaneous residual current are calculated continuously until detecting a fault. Upon detecting a fault, values of each index are compared after the time window as depicted in FIG. 35.

For a Phase-P-to-Phase-Q fault, the following three criteria should be satisfied.

Criterion A1: Since the index associated with two faulty phases is close to the unity;

$$(1 - \epsilon_2) \le F_{PQ} \le (1 + \epsilon_3)$$

Criterion A2: Since the index that expresses the max(di/dt) of a faulty phase relative to that of the healthy phase is much larger than unity;

$$(1 + \epsilon_4) \le F_{PR}$$

Criterion A3: Since the index that expresses the max(di/dt) of the healthy phase relative to that of a faulted phase is less than unity;

$$F_{RP} \le (1 - \epsilon_5)$$

where R is the healthy phase, and $\epsilon_1$-$\epsilon_5$ are positive tolerance settings.

As it will be shown later, three phase faults does not stratifies above three criteria. Upon detecting the presence of instantaneous residual current, the fault is considered as a ground fault and the criteria B1-B3 are tested as depicted in the flowchart of FIG. 35. The criteria for single-phase-to-ground faults, say Phase-P-to-ground fault are given below.

Criterion B1: Since the index corresponding to the two phases not involved in the fault is close to unity;

$$(1 - \epsilon_6) \le F_{QR} \le (1 + \epsilon_7)$$

Criterion B2: Since the index that expresses the max(di/dt) of the faulty phase relative to that of the healthy phase is much larger than unity;

$$(1 + \epsilon_8) \le F_{PQ}$$

where $\epsilon_8$ is a positive tolerance setting.

Criterion B3: Since the index that expresses the max(di/dt) of the healthy phase relative to that of a faulted phase is less than unity;

$$F_{RP} \leq (1 - \epsilon_9)$$

where $\epsilon_6$-$\epsilon_9$ are positive tolerance settings.

Figure 36A:
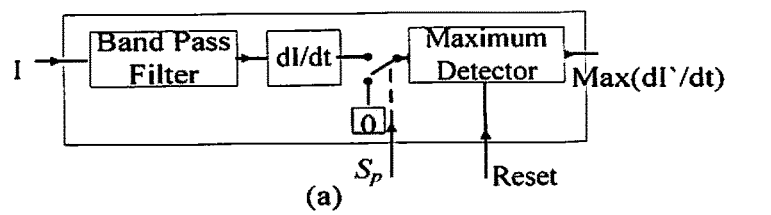
FIGS. 36A and 36B show signal processing involved in calculating indices max(di/dt) detector, and index estimation, respectively.
Figure 36B:
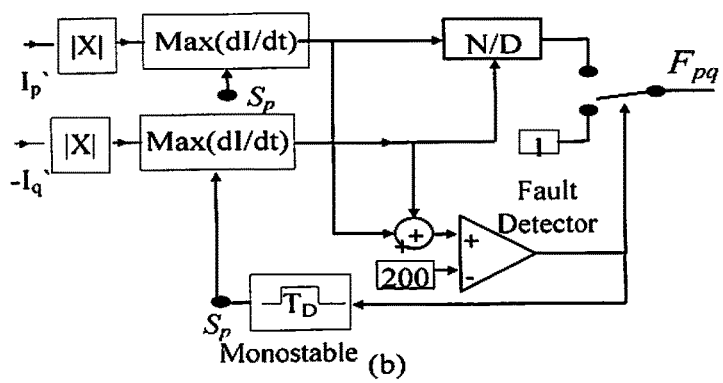

A line-to-line-to-ground fault is identified by the presence of residual current and failure to satisfy the criteria B1-B3. Upon identifying a line-to-line-to-ground fault, the phase involved in the fault is identified by the index having the highest magnitude. As an example if $F_{PQ}$ is the largest index, Phase-P is involved in the fault (criterion C1). Then, the index corresponding to two other phases, $F_{QR}$, is tested to identify the remaining phase involved in the fault (criterion C2). If FOR is greater than unity, Phase-Q is involved in the fault; otherwise Phase-R is involved in the fault. FIGS. 36A and 36B shows the proposed method of processing signals and calculating fault type indices. The lower cut-off frequency of the band pass filter is set to avoid the influence of current at power mains frequency and upper cut-off frequency is set to minimize influence of induced transients from other phases in estimating max(di/dt) values. Process of calculating indices get triggered upon detecting a peak di/dt greater than a certain threshold level and the maximum values of signal di/dt are tracked for a period of $T_D$.

Figure 37:
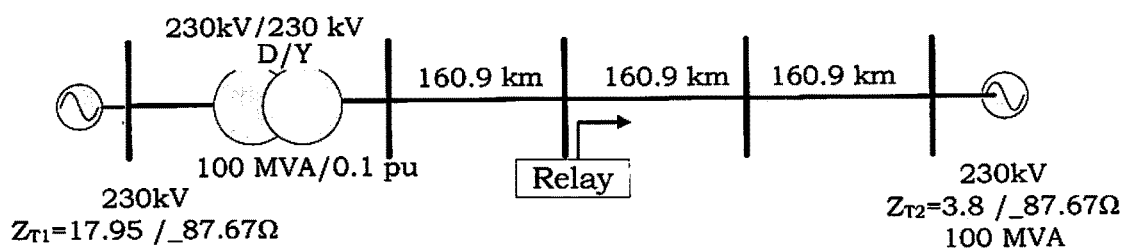
FIG. 37 shows a HVAC test system used for the method shown in FIG. 35.

In other words, and with reference to FIG. 34 and particularly to FIG. 35, when the power transmission system is a three-phase high voltage alternating current (HVAC) transmission system having three power-transmitting conductors Phase-A, Phase-B and Phase-C, in which the power-transmitting conductors are operably connected between two sets of nodes, for example represented as the third-from-the-left and second-from-the-right-most buses in FIG. 37, so as to transmit the power along the power-transmitting conductors from a first set of nodes to a second set of nodes, then in relation to the previously generally recited method:
  the step of monitoring the current signals comprises measuring the current in each one of the power-transmitting conductors at or generally in proximity to a common selected one of the first and second sets of nodes, such as the bus which is second-from-the-left in FIG. 37;
  the ratio of a pair of the maximum rates of change of the filtered current signals comprises (i) a first ratio, referred to herein as $F_{ab}$, formed by dividing the maximum of an absolute value of the rate of change of the filtered current signal of a first power-transmitting conductor, normally phase-A, by the maximum of an absolute value of the rate of change of the filtered current signal of a second power-transmitting conductor, normally phase-B; (ii) a second ratio, referred to herein as $F_{bc}$, formed by dividing the maximum of an absolute value of the rate of change of the filtered current signal of the second power-transmitting conductor phase-B by the maximum of an absolute value of the rate of change of the filtered current signal of a third power-transmitting conductor, normally phase-C; and (iii) a third ratio, referred to herein as Fra, formed by dividing the maximum of an absolute value of the rate of change of the filtered current signal of the third power-transmitting conductor phase-C by the maximum of an absolute value of the rate of change of the filtered current signal of the first power-transmitting conductor phase-A; and there is an additional step of determining a residual current at the selected set of nodes, referred to herein as $I_0$, which is defined as a sum of the currents in the three power-transmitting conductors phase-A through phase-C; and
  the step of comparing the ratio against a discrimination factor to identify the one or more faulted conductors comprises:
    checking whether the residual current $I_0$ is less than a prescribed threshold, which is three times the constant $K_1$, that is $3K_1$, as represented at reference numeral 3502, and
    if true then determining that the one or more faulted conductors comprise at least two faulted conductors, or
    if false then determining that the one or more faulted conductors comprise no more than two conductors which are faulted to ground.

Step 3502 may alternatively be thought of as checking whether one-third of the residual current, which in FIG. 35 is represented simply as $I_0$, is less than a prescribed threshold shown as constant $K_1$ in FIG. 35.

Furthermore, it will be appreciated that the foregoing comparison of the residual current to the prescribed threshold and consequent and subsequent 'true' and 'false' conditions as recited above are opposite yet still equivalent to what is shown in FIG. 35, in which step 3502 shows checking whether the residual current is greater than or equal to the prescribed threshold, and in which the determination that the one or more faulted conductors comprise no more than two conductors which are faulted to ground follows from evaluating this condition as 'true' and the determination that the one or more faulted conductors comprise at least two faulted conductors follows from evaluating this condition as 'false'.

If it is determined at 3502 that the one or more faulted conductors comprise at least two faulted conductors, which in FIG. 35 is shown as the determination of 'false' for the foregoing reasons, the step of comparing the ratio against a discrimination factor in the previously generally recited method further comprises:
  as shown at 3503, checking whether (i) the first ratio $F_{ab}$ is greater than or equal to a first discrimination factor $1-\epsilon_2$, (ii) the first ratio $F_{ab}$ is less than or equal to a second discrimination factor $1+\epsilon_3$, (iii) the second ratio $F_{bc}$ is greater than a third discrimination factor $1+\epsilon_4$, and (iv) the third ratio $F_{ca}$ is less than a fourth discrimination factor 1-85, and
    if true then determining that the first and second conductors, that is phases A and B, are faulted but not to ground, or
    if false then determining that another set of the conductors is faulted.

If it is determined at 3502 that the one or more faulted conductors comprise at least two faulted conductors, which in FIG. 35 is shown as the determination of 'false' as described above, the step of comparing the ratio against a discrimination factor in the previously generally recited method further comprises:
  as shown at 3504, checking whether (i) the second ratio $F_{bc}$ is greater than or equal to the first discrimination factor $1-\epsilon_2$, (ii) the second ratio Fie is less than or equal to the second discrimination factor $1+\epsilon_3$, (iii) the third ratio $F_{ca}$ is greater than the third discrimination factor $1+\epsilon_4$, and (iv) the first ratio $F_{ab}$ is less than the fourth discrimination factor $1-\epsilon_5$, and if true then determining that the second and third conductors, that is phases B and C, are faulted but not to ground, or if false then determining that another set of the conductors is faulted.

If it is determined at 3502 that the one or more faulted conductors comprise at least two faulted conductors, which in FIG. 35 is shown as the determination of 'false' as described above, the step of comparing the ratio against a discrimination factor in the previously generally recited method further comprises:

as shown at 3505, checking whether (i) the third ratio $F_{ca}$ is greater than or equal to the first discrimination factor $1-\varepsilon_2$, (ii) the third ratio $F_{ca}$ is less than or equal to the second discrimination factor $1+\varepsilon_3$, (iii) the first ratio $F_{ab}$ is greater than the third discrimination factor $1+\varepsilon_4$, and (iv) the second ratio $F_{bc}$ is less than the fourth discrimination factor $1-\varepsilon_5$, and if true then determining that the first and third conductors, that is phases A and C, are faulted but not to ground, or if false then determining that another set of the conductors is faulted.

If it is determined at 3502 that the one or more faulted conductors comprise at least two faulted conductors, which in FIG. 35 is shown as the determination of 'false' as described above, the step of comparing the ratio against a discrimination factor in the previously generally recited method further comprises:

as represented by the combination of steps 3503-3505, checking whether (i) the first ratio $F_{ab}$ is greater than or equal to a first discrimination factor $1-\varepsilon_2$, (ii) the first ratio $F_{ab}$ is less than or equal to a second discrimination factor $1+\varepsilon_3$, (iii) the second ratio $F_{bc}$ is greater than a third discrimination factor $1+\varepsilon_4$, (iv) the third ratio $F_{ca}$ is less than a fourth discrimination factor $1-\varepsilon_5$, (v) the second ratio $F_{bc}$ is greater than or equal to the first discrimination factor $1-\varepsilon_2$, (vi) the second ratio $F_{bc}$ is less than or equal to the second discrimination factor $1+\varepsilon_3$, (vii) the third ratio $F_{ca}$ is greater than the third discrimination factor $1+\varepsilon_4$, (viii) the first ratio $F_{ab}$ is less than the fourth discrimination factor $1-\varepsilon_5$, (ix) the third ratio $F_{ca}$ is greater than or equal to the first discrimination factor $1-\varepsilon_2$, (x) the third ratio $F_{ca}$ is less than or equal to the second discrimination factor $1+\varepsilon_3$, (xi) the first ratio $F_{ab}$ is greater than the third discrimination factor $1+\varepsilon_4$, and (xii) the second ratio Fie is less than the fourth discrimination factor $1-\varepsilon_5$, and if false then determining that the first, second and third conductors, that is phases A and B and C, are faulted.

It will be appreciated that FIG. 35 shows the foregoing determination of a three-phase fault as the sequentially 'false' evaluation of three individual conditions, which is equivalent to what is recited above.

It will also be appreciated that the determination of a three-phase fault as described above encompasses both grounded and ungrounded three-phase faults which are electrically indistinguishable to this method.

Steps -3503-3505 may be carried out in the order illustrated in FIG. 35 or in another order.

If it is determined at 3502 that the one or more faulted conductors comprise no more than two conductors which are faulted to ground, which in FIG. 35 is shown as the determination of 'true' for the earlier described reasons, the step of comparing the ratio against a discrimination factor in the previously generally recited method further comprises:

as shown at 3506, checking whether (i) the second ratio $F_{bc}$ is greater than or equal to a fifth discrimination factor $1-\varepsilon_6$ (ii) the second ratio $F_{bc}$ is less than or equal to a sixth discrimination factor $1+\varepsilon_7$, (iii) the first ratio $F_{ab}$ is greater than a seventh discrimination factor $1+\varepsilon_8$, and (iv) the third ratio $F_{ca}$ is less than an eighth discrimination factor 1-89, and if true then determining that the first conductor phase-A is the only faulted conductor which is faulted to ground, or if false then determining that another set of no more than two conductors is faulted to ground.

If it is determined at 3502 that the one or more faulted conductors comprise no more than two conductors which are faulted to ground, which in FIG. 35 is shown as the determination of 'true' for the earlier described reasons, the step of comparing the ratio against a discrimination factor in the previously generally recited method further comprises:

as shown at step 3507, checking whether (i) the third ratio $F_{ca}$ is greater than or equal to the fifth discrimination factor $1-\varepsilon_6$, (ii) the third ratio $F_{ca}$ is less than or equal to the sixth discrimination factor $1+\varepsilon_7$, (iii) the second ratio $F_{bc}$ is greater than the seventh discrimination factor $1+\varepsilon_8$, and (iv) the first ratio $F_{ab}$ is less than the eighth discrimination factor 1-89, and if true then determining that the second conductor phase-B is the only faulted conductor which is faulted to ground, or if false then determining that another set of no more than two conductors is faulted to ground.

If it is determined at 3502 that the one or more faulted conductors comprise no more than two conductors which are faulted to ground, which in FIG. 35 is shown as the determination of 'true' for the earlier described reasons, the step of comparing the ratio against a discrimination factor in the previously generally recited method further comprises:

as shown at step 3508, checking whether (i) the first ratio $F_{ab}$ is greater than or equal to the fifth discrimination factor $1-\varepsilon_6$, (ii) the first ratio $F_{ab}$ is less than or equal to the sixth discrimination factor $1+\varepsilon_7$, (iii) the third ratio $F_{ca}$ is greater than the seventh discrimination factor $1+\varepsilon_8$, and (iv) the second ratio $F_{bc}$ is less than the eighth discrimination factor 1-89, and if true then determining that the third conductor phase-C is the only faulted conductor which is faulted to ground, or if false then determining that another set of no more than two conductors is faulted to ground.

It will be appreciated that steps 3506-3508 may be carried out in the order illustrated in FIG. 35 or in another order.

If it is determined at each of steps 3506-3508 that another set of no more than two conductors is faulted to ground, that is that each of the conditions is evaluated as 'false'- or in other words, in the method the following step is performed:

checking whether (i) the second ratio $F_{bc}$ is greater than or equal to a fifth discrimination factor $1-\varepsilon_6$ (*ii*) the second ratio $F_{bc}$ is less than or equal to a sixth discrimination factor $1+\varepsilon_7$, (iii) the first ratio $F_{ab}$ is greater than a seventh discrimination factor $1+\varepsilon_8$, (iv) the third ratio $F_{ca}$ is less than an eighth discrimination factor 1-89, (v) the third ratio $F_{ca}$ is greater than or equal to the fifth discrimination factor $1-\varepsilon_6$, (vi) the third ratio $F_{ca}$ is less than or equal to the sixth discrimination factor $1+\varepsilon_7$, (vii) the second ratio $F_{bc}$ is greater than the seventh discrimination factor $1+\varepsilon_8$, (viii) the first ratio $F_{ab}$ is less than the eighth discrimination factor 1-89, (ix) the first ratio $F_{ab}$ is greater than or equal to the fifth discrimination factor $1-\varepsilon_6$, (x) the first ratio $F_{ab}$ is less than or equal to the sixth discrimination factor 1+$\varepsilon_7$, (xi) the third ratio $F_{ca}$ is greater than the seventh discrimination factor 1+$\varepsilon_8$, and (xii) the second ratio $F_{bc}$ is less than the eighth discrimination factor 1-89, and if false then—the step of comparing the ratio against a discrimination factor in the previously generally recited method further comprises:

checking whether the first ratio $F_{ab}$ is greater than each of the second and third ratios $F_{bc}$ and $F_{ca}$, as shown at 3510, and
  if true then additionally checking whether the second ratio Fie is greater than unity (in other words, one), as shown at 3511, and
   if true then determining that the first and second conductors phases A and B are faulted to ground, or
   if false then determining that the first and third conductors phases A and C are faulted to ground;
 and if the first ratio $F_{ab}$ is not greater than each of the second and third ratios $F_{bc}$ and $F_{ca}$, that is the determination at step 3510 is 'false', then additionally checking whether the second ratio $F_{bc}$ is greater than each of the first and third ratios $F_{ab}$ and Fra, as shown at 3512, and
  if true then additionally checking whether the third ratio $F_{ca}$ is greater than unity, as shown at 3513, and
   if true then determining that the second and third conductors phases B and C are faulted to ground, or
   if false then determining that the first and second conductors phases A and B are faulted to ground;
 and if the second ratio $F_{bc}$ is not greater than each of the first and third ratios $F_{ab}$ and $F_{ca}$, that is the determination at step 3512 is 'false', then additionally checking whether the first ratio $F_{ab}$ is greater than unity, as shown at 3514, and
  if true then determining that the first and third conductors phases A and C are faulted to ground, or
  if false then determining that the second and third conductors phases B and C are faulted to ground.

Typically, the first and fourth discrimination factors are less than one and the second and third discrimination factors are greater than one.

Also, typically, the fifth and eighth discrimination factors are less than one and the sixth and seventh discrimination factors are greater than one.

Test System for Evaluating HVAC Fault Classification Method

The algorithm is validated using the 230 kV transmission system shown in FIG. 37, simulated in PSCAD electromagnetic transient simulation software with 25 μs time steps. Faulty phase detection by the relay protecting middle span of the long transmission line having three sections is presented here, as it is found to be more challenging during the experiments. The transmission line parameters of the test system are given in Table XI.

The pickup value of the residual current detector is set to 200 A. The lower cut-off frequency of the band pass filter in FIG. 36 is set to 500 Hz. With the help of observed simulation results, upper cut-off frequency is set to 1000 Hz and $T_D$ is set to 1 ms. Finding values for the threshold constants, $\varepsilon_2$-$\varepsilon_9$, is demonstrated in Sections V-B and V-C.

That is, filtering the current signal of each one of the conductors comprises applying a band pass filter having a lower cut-off frequency between about 250 Hz and about 500 Hz and an upper cut-off frequency between about 1000 Hz and about 2000 Hz to the current signal of each one of the conductors.

Results for HVAC Fault Classification Method

A. Demonstration of the Basic Algorithm

FIG. 38A-38C show the voltages, currents, and estimated rate of change of current (ROCOC) or (di/dt) values respectively for a fault between Phase-A and Phase-B. As per FIG. 38C, ROCOC values (of the band pass filtered signals) of Phase-A and Phase-B are comparable in magnitude as explained in Section II and Section III. Fulfilment of criteria A1-A3 for a line-to-line fault is demonstrated in FIGS. 38D-38F.

FIGS. 39A-39F show the responses for a Phase-B-to-ground fault. Presence of residual current can be observed in FIG. 39B.

Short transient period of indices can be clearly seen from FIGS. 6(d)-6(f). FIG. 6(c) shows that the di/dt values of Phases-A and -C are almost equal, which can also be confirmed from FIG. 6(f) that shows Fra. Fulfilment of the criteria B2 and B3 can be observed from FIGS. 6(d) and 6(f). Having demonstrated the basic waveforms and the fulfillment of criteria for two basic types of faults, influence of the fault inception angle, fault location, and the fault resistance on the estimated indices is rigorously evaluated for each fault type as described further below.

B. Identification of Faulty Phase for Line-to-Line Faults

Figures 40A, 40B, 40C:
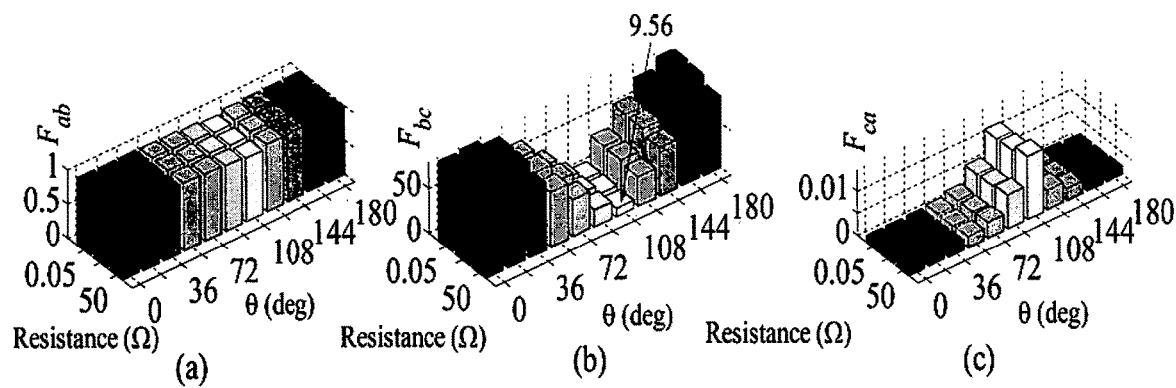
FIGS. 40A through 40C show indices $F_{ab}$, $F_{bc}$, $F_{ca}$, respectively, for Phase A-to-Phase-B faults at 30% under different fault resistances and fault inception angles.

FIGS. 40A-40C show the influence of the fault inception angle and the fault resistance for a fault between Phase-A and Phase-B. Indices are estimated for fault resistances 0.05 Ω, 5Ω, and 50Ω. The fault inception angle is varied from 0° to 180° in 18° steps. According to FIGS. 40A-40C, estimated indices are almost independent from fault resistance. Indices associated with the healthy phase, Phase-C, significantly change with fault inception angle. The minimum value of the $F_{bc}$ is 9.56 and the maximum value of $F_{ca}$ is about 0.01. Therefore, all three criteria, A1-A3, for a line-to-line fault are satisfied for the simulated 33 fault scenarios.

Figures 41A, 41B:
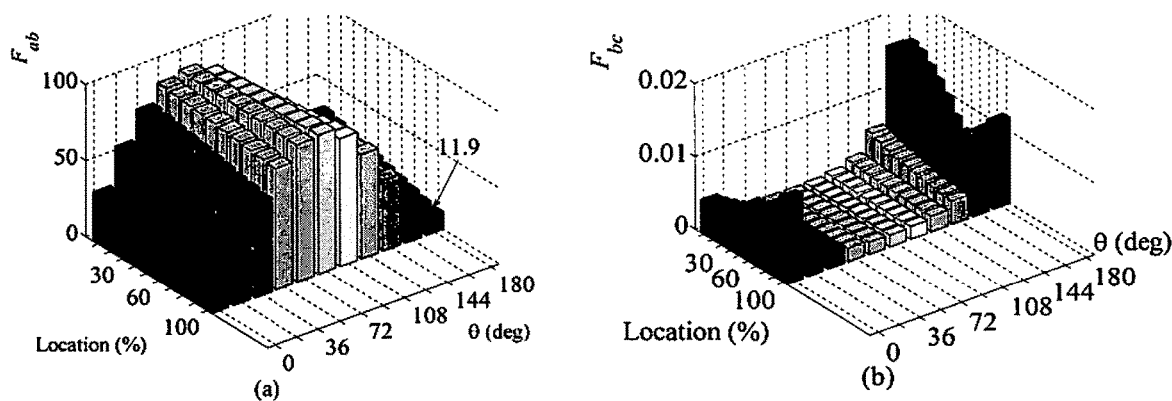
FIGS. 41A through 41C show fault indices $F_{ab}$, $F_{bc}$, and $F_{ca}$, respectively, for a solid Phase-A-to-Phase-C faults along the line simulated for every 10%.
Figure 41C:
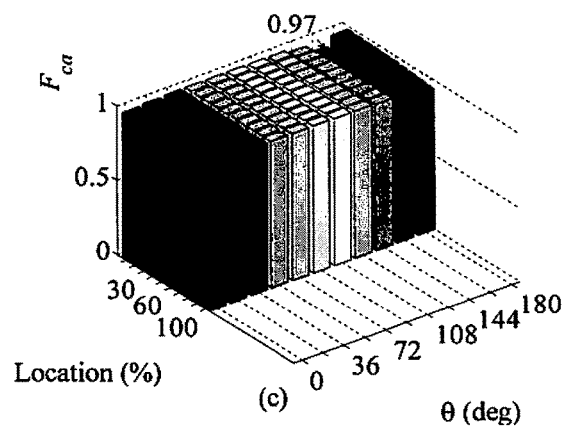

Influence of fault location is evaluated by applying faults between 10% of the line length to 100% in steps of 10%. FIGS. 41A-41C depict estimated indices for Phase-A-to-Phase-C faults at 11 different fault inception angles.

According to FIGS. 41A and 41B, the worst values of indices associated with the healthy phase occur for the far end faults. Since the values of indices are significantly dependent on the fault inception angle, indices are estimated for fine intervals of fault inception angles (every 0.9°) for a far end fault. FIGS. 42A-42C show variation of indices with the fault inception angle. By considering FIG. 41C and FIG. 42B, & can be set to 0 and $\varepsilon_2$ can be set slightly higher than 0.1. By considering maximum values of the indices corresponding to the healthy phase to the faulty phase shown in FIG. 41B and FIG. 42A, $\varepsilon_5$ can be set to 0.98. By considering the minimum values of indices corresponding faulty phase to healthy phase shown in FIG. 41A and FIG. 42C, & can be set slightly below 6.7. Based on the results for line-to-line faults, it can be concluded that a set of values can be found for $\varepsilon_2$-$\varepsilon_5$ that satisfies criteria A1-A3. Therefore, faulty phases for line-to-line faults can be identified accurately with the proposed method.

C. Identification of Faulty Phase for Line-to-Ground Faults

FIGS. 43A-43C show the estimated indices for Phase-A-to-ground fault, for different combinations of fault resistances and fault inception angles. FIGS. 44A-44C show the variation of estimated indices with the fault location for Phase-C-to-ground faults.

FIGS. 43A-43C further elaborates on the independence of indices from the fault resistance, even when the fault is involving ground currents. It can be seen by FIGS. 44A-44C and FIGS. 45A-45C that changes in indices with the fault inception angles is less for line-to-ground faults, when compared with the line-to-line faults (see FIGS. 40-40C and 41A-41C). Therefore, finding threshold constants, 8-89, is easier for line-to-ground faults.

Considering the range of the values for the index corresponding to the two unfaulty phases, see FIG. 44A and FIG. 45C, $\varepsilon_7$ can be set to 0 and & can be set slightly larger than 0.347. By considering maximum value of the indices corresponding to healthy phase to faulty phase, see FIG. 44B and FIG. 45A, $\varepsilon_9$ can be set to slightly lower than 0.46. Considering the minimum values of indices corresponding to faulty phase to healthy phase di/dt values, see FIG. 44C and FIG. 45B, $\varepsilon_8$ can be set slightly lower than 0.42. As the line-to-ground fault is the most common type fault in transmission line, ability to accurately identify faulty phase raise overall accuracy significantly.

D. Discriminating Three Phase Faults from Line-to-Line Faults

FIGS. 46A-46C prove that indices are independent of fault resistance even for three phase faults. According to FIG. 35, three phase faults are discriminated from line-to-line faults by the absence of residual current component and failure to fulfill criteria A1 to A3.

This is proved with the help of estimated fault indices for a close-up and remote faults for different fault inception angles (varied in small steps) shown in FIG. 46D-46F. As per FIG. 46D-46F showing estimated indices for faults at 5% and 95% away from the relay, only for a very short span of angle criterion A2 is valid. However, the criterion A3 is invalid for all fault scenarios as minimum value of indices, 0.09, is higher than 1-65, 0.02. Therefore, it can be concluded that any three phase fault doesn't satisfies the criteria A1-A3 simultaneously.

E. Identification of Faulty Phases for Line-to-Line-to-Ground Faults

FIG. 47A shows the indices for Phase-A-to-Phase-B-to-ground fault at 45% of the line length. Phase-B is involved in the fault for fault inception angle 54° as per criterionC1 since $F_{bc}$ is the highest index. As the index associated with two remaining phases, Feu, is less than unity (see Table XII showing the numerical values), Phase-A can be identified as involved in the fault as per criterion C2. Furthermore, as per FIG. 47B, indices do not significantly vary with the fault resistance even for the line-to-line-to-ground faults. Fulfillment of criteria C1 and C2 for line-to-line-to-ground fault can be verified with Table XII which shows indices for Phase-A-to-Phase-B-to-ground faults at 45% of the line (Scenario-1), and Phase-A-to-Phase-C-to-ground faults at 60% of the line (Scenario-2) for some angles.

Possibility of misclassifying line-to-line-to-ground faults is evaluated by simulating faults in small intervals of fault inception angles. As per FIGS. 48A-48C, criterion C1 identifies one phase involved in the fault, Phase-B or Phase-C, accurately from 0° to 180°. However, for 10° span between Point-A1 and Point-A2, criterion C2 declares as Phase-A is involved in the fault rather than Phase-B as $F_{ab}$>1.

Possibility of misclassifying line-to-line-to-ground faults as a line-to-ground fault is analyzed by testing criteria B2 and B3 for intervals where one index is close to unity, 10° span between point-A1 and Point-A2. However, around span between Point-A1 and Point-A2, it can be classified as a Phase-C-to-ground fault as both criteria B2 and B3 are satisfied. Therefore, if a line-line-to-ground fault happens within about 5° around the zero crossing of one phase, the method could erroneously declare a single phase to ground fault. However, if probability of occurring a fault at any fault inception angles is assumed to be uniform, the error probability of line-to-line-to-ground fault classification is about 10°/180°, 5.5%. In general, 80% of the transmission faults are single phase to ground faults and a line-to-line-ground fault is even less likely than a line-to-line fault [45]. Therefore, a maximum value for overall error probability can be estimated by assuming line-to-line, line-to-line-ground, and three phase faults are equally probable, i.e. 1.1% (5.5%×⅕).

Conclusions Regarding Fault Classification Method for HVAC System

A novel fast fault type and faulty phase detection algorithm based on incremental current signals that is particularly suited for a HVAC power transmission system is described hereinbefore. The results of rigorous evaluation show that the indices proposed in this paper are very effective for simplifying the faulty phase identification problem. The proposed fault index is independent of fault resistance and a set of threshold values can be found easily for comparison used in the faulty phase selection algorithm. Simplicity of the method facilitates for easy implementation with low cost hardware and avoids the need for generating large training data sets. A 100% accurate fault classification is observed for most frequent types of faults, line-to-ground faults and line-to-line faults. Although occasional misclassification of line-to-line-to-ground faults can happen when the fault inception angle is around zero, still an accuracy level above 95.5% can be achieved for line-line-to-ground faults.

A comprehensive and fast faulty phase selection method based on local current transients which is particularly suited for HVAC power transmission systems is described hereinbefore. Faulty phase selection in transient based protection relays is considered to be very challenging as it requires making decisions within a short time period and while transients are dependent on many parameters such as fault resistance and fault inception angle. Three indices are defined for each combination of phase currents. Each index compares the magnitudes of the rate of change of current through two associated phases. A systematic logic is introduced to identify different types of faults and the faulted phases. As the proposed indices are almost independent of fault resistance, faulty phase selection can be reduced to a manageable problem that can be handled with threshold-based comparison and it can be easily implemented on low-cost hardware. Very accurate predictions are observed during the rigorous evaluation carried at different fault locations and for different fault inception angles and resistances.

FIGS. 49-55 relate to another arrangement of the first aspect of the invention described herein that is particularly suited for high voltage alternating current (HVAC) power transmission system, which has three power-transmitting conductors, and in which the power-transmitting conductors are operably connected between two sets of nodes so as to transmit the power along the power-transmitting conductors from a first set of nodes to a second set of nodes.

The problem of fault classification involves identification of the fault type and the phases involved in a fault. In the paper, the problem is broken down into several steps as shown in FIG. 49.

Fault classification using direct measurements of phase currents and voltages may be prone to incorrect results due to mutual coupling between phase conductors. Therefore, modal transformations such as Fortescue transform, Karrenbauer transform and Clarke transform have been used to simplify the fault classification by decoupling the three phase system. The Karrenbauer and Clarke transforms are applicable to transform time domain signals, while the Fortescue transform is primarily applied in frequency domain, i.e. to phasors. However, the Clarke components calculated with reference to Phase-A only helps to discriminate Phase-A-to-ground faults from Phase-B and Phase-C faults. In order to enable discrimination of faults that involve any of the phases, the transform given in Equation (19) is proposed to extract seven current components.

$$\begin{bmatrix} i_{\alpha A} \\ i_{\alpha B} \\ i_{\alpha C} \\ i_{\beta A} \\ i_{\beta B} \\ i_{\beta C} \\ i_\gamma \end{bmatrix} = \begin{bmatrix} \frac{2}{3} & -\frac{1}{3} & -\frac{1}{3} \\ -\frac{1}{3} & \frac{2}{3} & -\frac{1}{3} \\ -\frac{1}{3} & -\frac{1}{3} & \frac{2}{3} \\ 0 & \frac{1}{\sqrt{3}} & -\frac{1}{\sqrt{3}} \\ -\frac{1}{\sqrt{3}} & 0 & \frac{1}{\sqrt{3}} \\ \frac{1}{\sqrt{3}} & -\frac{1}{\sqrt{3}} & 0 \\ \frac{1}{3} & \frac{1}{3} & \frac{1}{3} \end{bmatrix} \begin{bmatrix} i_a \\ i_b \\ i_c \end{bmatrix} \quad (19)$$

This transform is inspired by the Clarke transform, and can be considered as computing α and β components repeatedly, taking phases A, B, and C as the reference phase to obtain the pairs $i_{\alpha A}$, $i_{\beta A}$; $i_{\alpha A}$, $i_{\beta B}$; and $i_{\alpha c}$, $i_{\beta c}$ respectively. The component $i_\gamma$ is the same as that obtained from the standard Clarke transform, and equal to one third of the residual current. These current components that are not necessarily independent, but helpful for fault type classification and faulted phase identification.

A set of nine fault classification indices are defined using the derivatives of the transformed quantities of the phase currents obtained from Equation (19) as given in Equations (20), (21) and (22).

$$G_{\alpha X}^{\gamma} = \frac{\max\left|\frac{di_\gamma(t)}{dt}\right|}{\max\left|\frac{di_{\alpha X}(t)}{dt}\right|} \quad (20)$$

$$G_{\beta X}^{\alpha X} = \frac{\max\left|\frac{di_{\alpha X}(t)}{dt}\right|}{\max\left|\frac{di_{\beta X}(t)}{dt}\right|} \quad (21)$$

$$G_{\alpha X}^{\beta X} = \frac{\max\left|\frac{di_{\beta X}(t)}{dt}\right|}{\max\left|\frac{di_{\alpha X}(t)}{dt}\right|} \quad (22)$$

where X is the reference phase. Each of Equations (20), (21) and (22) leads to three indices for X=A, B, and C (each of the three phases). The measured phase currents are band pass filtered before computing transformed quantities. The cut-off frequencies of the band pass filter are selected to remove the power frequency signal components and noisy high frequency components. For example, filtering the current signal of each one of the conductors comprises applying a band pass filter having a lower cut-off frequency between about 250 Hz and about 500 Hz and an upper cut-off frequency between about 1000 Hz and about 2000 Hz to the current signal of each one of the conductors. In order to avoid the effect of the reflected secondary current waves, the maximum of the respective time derivatives observed within a Tw time window after detecting a fault are used.

Figure 50:
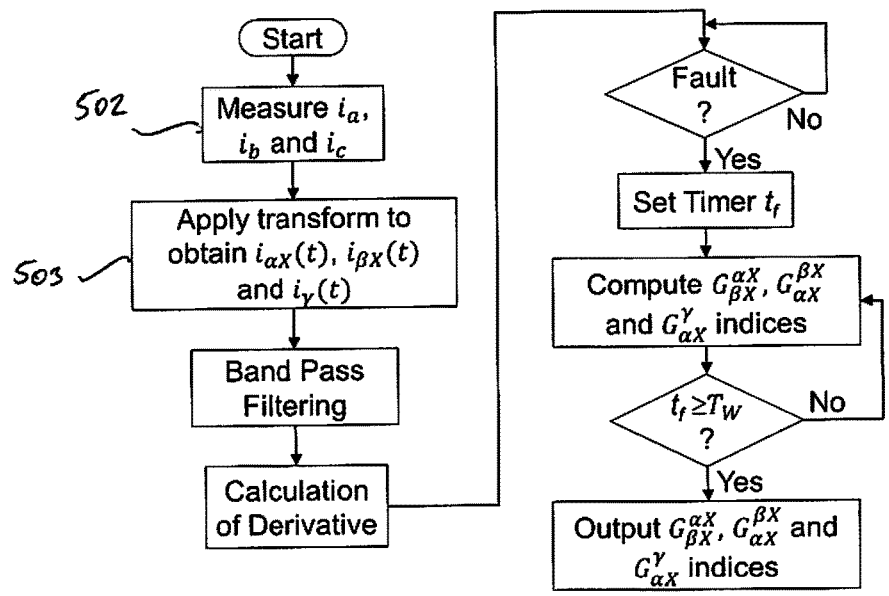
FIG. 50 shows a flowchart for calculating fault classification indices according to the arrangement of FIG. 49.

The steps in the computation of fault classification indices from measured phase currents are shown in FIG. 50.

Referring to FIG. 50, and generally speaking, in the latest arrangement of fault classification method for a HVAC power transmission system, the step of monitoring the current signals, from the previously generally recited method, comprises:

measuring the current in each one of the conductors, that is phases A through C, at or generally in proximity to a common selected one of the first and second sets of nodes, similarly to the earlier arrangement of fault classification method for HVAC systems, as shown at 502;

determining for each one of the conductors a pair of modal current components, referred to herein as $i_{\alpha X}$ and $i_{\beta X}$ where X denotes the phase, that is, either A or B or C, which are based on predetermined weightings of the currents measured in the three conductors such that the current signals that are representative of the currents in the conductors are substantially free of mutual coupling between the power-transmitting conductors, as shown at 503 and represented by Equation (19); and determining a modal residual current component, referred to herein as $i_y$, defined as one-third of a residual current at the selected set of nodes, where the residual current is defined as a sum of the currents in the three conductors, which is also shown at 503 and represented by Equation (19).

The ratio of a pair of the maximum rates of change of the filtered current signals comprises a plurality of ratios for each one of the conductors, that is for each of phases A and B and C, including (i) a first ratio, referred to herein as $G_{\alpha X}^{\gamma}$ where X denotes the phase formed by dividing the maximum of an absolute value of the rate of change of the modal residual current component $i_y$ by the maximum of an absolute value of the rate of change of a first one of the modal current components of the conductor $i_{\alpha X}$; (ii) a second ratio, referred to herein $G_{\beta X}^{\alpha X}$ where X denotes the phase, as formed by dividing the maximum of the absolute value of the rate of change of the first modal current component of the conductor $i_{\alpha X}$ by the maximum of an absolute value of the rate of change of a second one of the modal current components of the conductor $i_{\beta X}$; and (iii) a third ratio, referred to herein as $G_{\alpha X}^{\beta X}$ where X denotes the phase, formed by dividing the maximum of the absolute value of the rate of change of the second modal current component of the conductor $i_{\beta X}$ by the maximum of the absolute value of the rate of change of the first modal current component of the conductor $i_{\alpha X}$. As such, in this method there are formed a total of nine ratios for a three-phase HVAC system.

Normally, phase A is considered a first conductor, phase B is considered a second conductor, and phase C is considered a third conductor.

Figure 51:
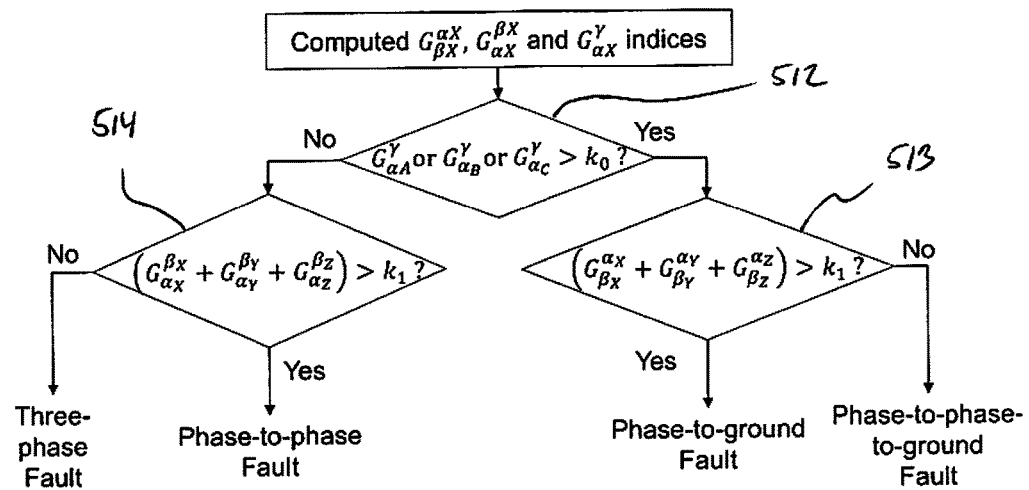
FIG. 51 shows a portion of the algorithm of FIG. 49 in greater detail.

The logic involved in the fault type classification algorithm are shown in FIG. 51. The values of $G_{\alpha X}^{\gamma}$ is compared against the threshold $k_0$ to discriminate between ground faults and non-ground faults. If it is a ground fault, the sum of $G_{\beta A}^{\alpha A}$, $G_{\beta B}^{\alpha B}$ and $G_{\beta C}^{\alpha C}$ is compared against the threshold $k_1$ to discriminate between the phase-to-ground faults and phase-to-phase-to-ground faults. If it is a non-ground fault, the sum of $G_{\alpha A}^{\beta A}$, $G_{\alpha B}^{\beta B}$, and $G_{\alpha C}^{\beta C}$, is compared against the threshold $k_1$ to discriminate between the phase-to-phase faults and three-phase faults.

In other words, in the latest arrangement, and with reference to FIG. 51, the step of comparing the ratio against a discrimination factor to identify the one or more of the faulted conductors in the previously generally recited method comprises:
  checking whether the first ratio of any one of the three conductors, that is $G_{\alpha A}^{\gamma}$, $G_{\alpha B}^{\gamma}$ and $G_{\alpha C}^{\gamma}$, is greater than a first discrimination factor, referred to herein as $k_0$, as shown at 512, and
    if true then determining that the one or more faulted conductors comprise no more than two conductors which are faulted to ground, or
    if false then determining that the one or more faulted conductors comprise at least two faulted conductors.

Typically, the first discrimination factor $k_0$ lies in a range from about 0.85 to about 0.95.

If it is determined at 512 that the one or more faulted conductors comprise no more than two conductors which are faulted to ground, that is the determination at 512 is 'true', the step of comparing the ratio against a discrimination factor in the previously generally recited method further comprises:
  checking whether a sum of the second ratios of the three conductors, that is $G_{\beta A}^{\alpha A}$, $G_{\beta B}^{\alpha B}$ and $G_{\beta C}^{\alpha C}$, is greater than a second discrimination factor, referred to herein as k, as shown at 513, and
    if true then determining that only one of the conductors is faulted to ground, or
    if false then determining that two of the conductors are faulted to ground.

Alternatively, if it is determined at 512 the one or more faulted conductors comprise at least two faulted conductors, that is the determination at 512 is 'false', the step of comparing the ratio against a discrimination factor further comprises:
  checking whether a sum of the third ratios of the three conductors, that is $G_{\alpha A}^{\beta A}$, $G_{\alpha B}^{\beta B}$, and $G_{\alpha C}^{\beta C}$, is greater than the second discrimination factor $k_1$, as shown at 514, and
    if true then determining only two of the conductors are faulted but not to ground, or
    if false then determining that the first, second and third conductors are faulted.

Typically, the second discrimination factor $k_1$ lies in a range from about 50 to about 150.

Thus at the conclusion of either of steps 513 or 514 the type of fault has been identified.

Figure 52:
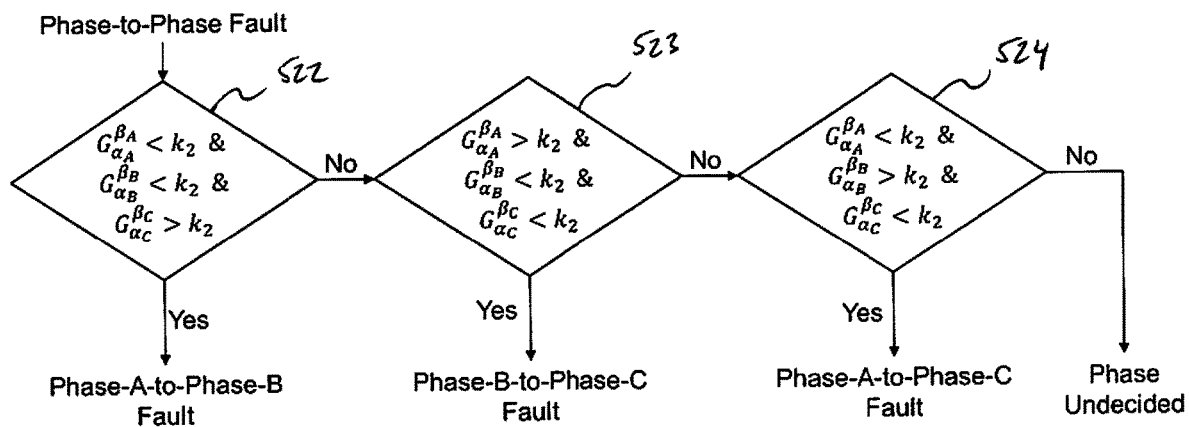
FIG. 52 shows a phase classification portion of the algorithm of FIG. 49 for Phase-to-Phase Faults.
Figure 53:
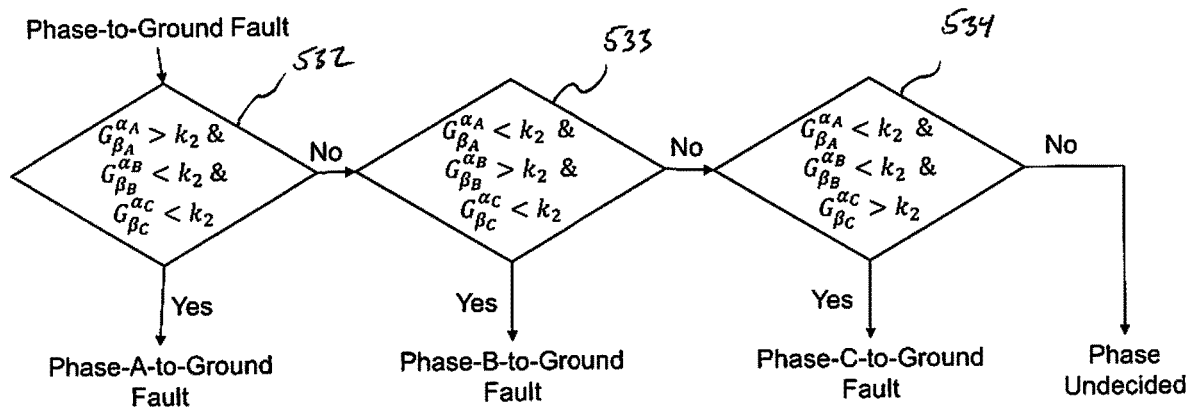
FIG. 53 shows a phase classification portion of the algorithm of FIG. 49 for Phase-to-Ground Faults.
Figure 54:
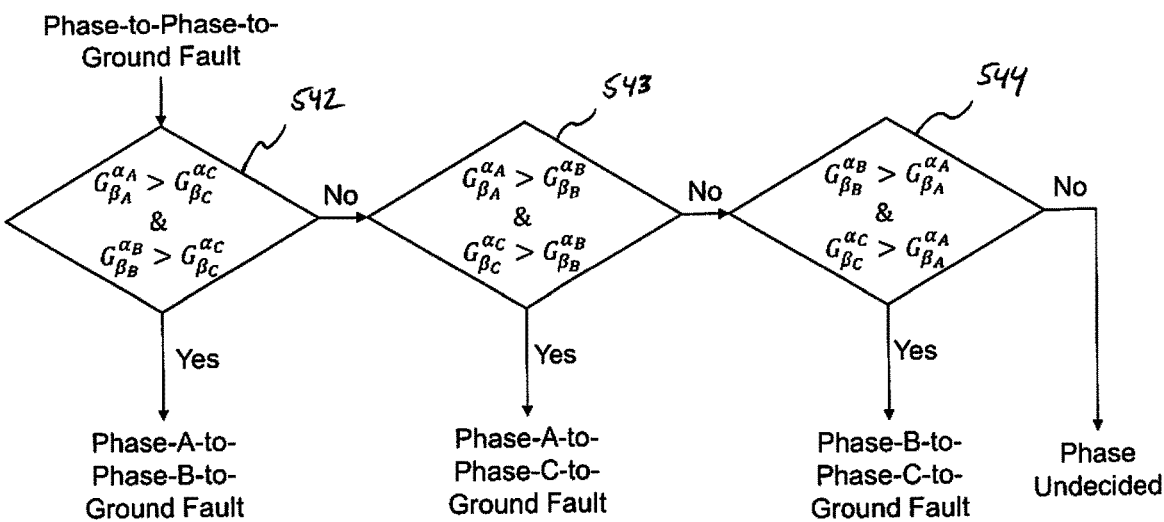
FIG. 54 shows a phase classification portion of the algorithm of FIG. 49 for Phase-to-Phase-to-Ground Faults.

Once the fault type is identified, the faulty phase selection logic shown in FIGS. 52-54 are applied to determine the phase conductors involved in phase-to-phase, single phase-to-ground, and phase-to-phase-to-ground faults, respectively.

In the case of phase-to-phase faults, the healthy phase (the phase that is not involved in the fault) has a larger value for $G_{\alpha X}^{\beta X}$ index compared to those computed for faulty phases.

As shown in FIG. 52, if it is determined at 514 that only two of the conductors are faulted but not to ground, the step of comparing the ratio against a discrimination factor in the previously generally recited method further comprises:
  checking whether (i) the third ratio of the first conductor $G_{\alpha A}^{\beta A}$ is less than a third discrimination factor, referred to herein as $k_2$, (ii) the third ratio of the second conductor $G_{\alpha B}^{\beta B}$ is less than the third discrimination factor $k_2$, and (iii) the third ratio of the third conductor $G_{\alpha C}^{\beta C}$ is greater than the third discrimination factor $k_2$, as shown at 522, and
    if true then determining that the first and second conductors, that is phases A and B, are faulted but not to ground, or
    if false then determining that another set of the conductors is faulted but not to ground.

If it is determined at 514 that only two of the conductors are faulted but not to ground, the step of comparing the ratio against a discrimination factor in the previously generally recited method further comprises:
  checking whether (i) the third ratio of the first conductor $G_{\alpha A}^{\beta A}$ is greater than the third discrimination factor $k_2$, (ii) the third ratio of the second conductor $G_{\alpha B}^{\beta B}$ is less than the third discrimination factor $k_2$, and (iii) the third ratio of the third conductor $G_{\alpha C}^{\beta C}$ is less than the third discrimination factor $k_2$, as shown at 523, and
    if true then determining that the second and third conductors, that is phases B and C, are faulted but not to ground, or
    if false then determining that another set of the conductors is faulted but not to ground.

If it is determined at 514 that only two of the conductors are faulted but not to ground, the step of comparing the ratio against a discrimination factor in the previously generally recited method further comprises:
  checking whether (i) the third ratio of the first conductor $G_{\alpha A}^{\beta A}$ is less than the third discrimination factor $k_2$, (ii) the third ratio of the second conductor $G_{\alpha B}^{\beta B}$ is greater than the third discrimination factor $k_2$, and (iii) the third ratio of the third conductor $G_{\alpha C}^{\beta C}$ is less than the third discrimination factor $k_2$, as shown at 524, and
    if true then determining the first and third conductors, that is phases A and C, are faulted but not to ground, or
    if false then determining another set of the conductors is faulted but not to ground.

In the case of phase-to-ground faults, the faulty phase has a larger value for $G_{\beta X}^{\alpha X}$ index compared to those computed for the healthy phases.

As shown in FIG. 53, if it is determined at 513 that only one of the conductors is faulted to ground, that is the determination at 513 is 'true', the step of comparing the ratio against a discrimination factor in the previously generally recited method further comprises:
  checking whether (i) the second ratio of the first conductor $G_{\beta A}^{\alpha A}$ is greater than the third discrimination factor $k_2$, (ii) the second ratio of the second conductor $G_{\beta B}^{\alpha B}$ is less than the third discrimination factor $k_2$, and (iii) the second ratio of the third conductor $G_{\beta C}^{\alpha C}$ is less than the third discrimination factor $k_2$, as shown at 532, and
    if true then determining that the first conductor, that is phase A, is the only conductor faulted to ground, or
    if false then determining that another one of the conductors is faulted to ground.

If it is determined at 513 that only one of the conductors is faulted to ground, that is the determination at 513 is 'true', the step of comparing the ratio against a discrimination factor in the previously generally recited method further comprises:
  checking whether (i) the second ratio of the first conductor $G_{\beta A}^{\alpha A}$ is less than the third discrimination factor $k_2$, (ii) the second ratio of the second conductor $G_{\beta B}^{\alpha A}$ is greater than the third discrimination factor $k_2$, and (iii) the second ratio of the third conductor $G_{\beta C}^{\alpha C}$ is less than the third discrimination factor $k_2$, as shown at 533, and if true then determining that the second conductor, that is phase B, is the only conductor faulted to ground, or if false then determining that another one of the conductors is faulted to ground.

If it is determined at 513 that only one of the conductors is faulted to ground, that is the determination at 513 is 'true', the step of comparing the ratio against a discrimination factor in the previously generally recited method further comprises:

checking whether (i) the second ratio of the first conductor $G_{\beta A}^{\alpha A}$ is less than the third discrimination factor $k_2$, (ii) the second ratio of the second conductor $G_{\beta B}^{\alpha B}$ is less than the third discrimination factor $k_2$, and (iii) the second ratio of the third conductor $G_{\beta C}^{\alpha C}$ is greater than the third discrimination factor $k_2$, as shown at 534, and if true then determining that the third conductor, that is phase C, is the only conductor faulted to ground, or if false then determining that another one of the conductors is faulted to ground.

Typically, the third discrimination factor $k_2$ lies in a range from about 1 to about 10.

As depicted in FIG. 54, the phases involved in a phase-to-phase-to-ground faults are the phases corresponding to two largest values of $G_{\beta X}^{\alpha X}$ index.

As shown in FIG. 54, if it is determined at 513 that two conductors are faulted to ground, that is the determination at 513 is 'false', the step of comparing the ratio against a discrimination factor in the previously generally recited method further comprises:

checking whether (i) the second ratio of the first conductor $G_{\beta A}^{\alpha A}$ is greater than the second ratio of the third conductor $G_{\beta C}^{\alpha C}$ and (ii) the second ratio of the second conductor $G_{\beta B}^{\alpha B}$ is greater than the second ratio of the third conductor $G_{\beta C}^{\alpha C}$, as shown at 542, and if true then determining that the first and second conductors, that is phases A and B, are the only conductors faulted to ground, or if false then determining that another set of the conductors is faulted to ground.

If it is determined at 513 that two conductors are faulted to ground, that is the determination at 513 is 'false', the step of comparing the ratio against a discrimination factor in the previously generally recited method further comprises:

checking whether (i) the second ratio of the first conductor $G_{\beta A}^{\alpha A}$ is greater than the second ratio of the second conductor $G_{\beta B}^{\alpha BB}$ and (ii) the second ratio of the third conductor $G_{\beta C}^{\alpha CA}$ is greater than the second ratio of the second conductor $G_{\beta B}^{\alpha B}$, as shown at 543 and if true then determining that the first and third conductors, that is phases A and C, are the only conductors faulted to ground, or if false then determining that another set of the conductors is faulted to ground.

If it is determined at 513 that two conductors are faulted to ground, that is the determination at 513 is 'false', the step of comparing the ratio against a discrimination factor in the previously generally recited method further comprises:

checking whether (i) the second ratio of the second conductor $G_{\beta B}^{\alpha B}$ is greater than the second ratio of the first conductor $G_{\beta A}^{\alpha A}$ and (ii) the second ratio of the third conductor $G_{\beta C}^{\alpha C}$ is greater than the second ratio of the first conductor $G_{\beta A}^{\alpha A}$, as shown at 544, and if true then determining that the second and third conductors, that is phases B and C, are the only conductors faulted to ground, or if false then determining that another set of the conductors is faulted to ground.

It will be appreciated that the series of steps shown in FIGS. 52-54 may be carried out in the illustrated order or in another order.

The scope of the claims should not be limited by the preferred embodiments set forth in the examples but should be given the broadest interpretation consistent with the specification as a whole.

REFERENCES

[1] D. V. Hertem, M. Ghandhari, "Multi-terminal VSC HVDC for the European supergrid: Obstacles," *Renewable and Sustainable Energy Reviews*, vol., no 9, December 2010.

[2] R. Dantas, J. Liang, C. E. Ugalde-Loo, A. Adamczyk, C. Barker and R. Whitehouse, "Progressive Fault Isolation and Grid Restoration Strategy for MTDC Networks," *IEEE Trans. Power Del.*, vol. 33, no. 2, pp. 909-918, April 2018.

[3] C. Li, A. M. Gole and C. Zhao, "A Fast DC Fault Detection Method Using DC Reactor Voltages in HVdc Grids," *IEEE Trans. Power Del.*

[4] J. Sneath and A. D. Rajapakse, "Fault Detection and Interruption in an Earthed HVDC Grid Using ROCOV and Hybrid DC Breakers," *IEEE Trans. on Power Del.*, vol. 31, no. 3, pp. 973-981, June 2016.

[5] S. De Boeck, P. Tielens, W. Leterme and D. Van Hertem, "Configurations and earthing of HVDC grids," 2013 *IEEE Power & Energy Society General Meeting*, Vancouver, B C, 2013, pp. 1-5.

[6] P. Tunnerhoff, P. Ruffing and A. Schnettler, "Comprehensive Fault Type Discrimination Concept for Bipolar Full-Bridge-Based MMC HVDC Systems with Dedicated Metallic Return," in *IEEE Trans. Power Del.*, vol. 33, no. 1, pp. 330-339, February 2018.

[7] T. G. Magg, H. D. Mutschler, S. Nyberg, J. Wasborg, H. Thunehed, B. Sandberg, "Caprivi link HVDC interconnector: site selection geophysical investigations interference impacts and design of the earth electrodes", Proc. CIGRE Paris Session, 2010 Aug. 22-27.

[8] A. Raza et al., "A Protection Scheme for Multi-Terminal VSC-HVDC Transmission Systems," in *IEEE Access*, vol. 6, pp. 3159-3166, 2018.

[9] Haleem, N. M., & Rajapakse, A. D, "Local measurement based ultra-fast directional ROCOV scheme for protecting Bi-pole HVDC grids with a metallic return conductor", *IJEPES*, vol. 98, pp. 323-330, June 2018.

[10] J. Wu, H. Li, G. Wang and Y. Liang, "An Improved Traveling-Wave Protection Scheme for LCC-HVDC Transmission Lines," in *IEEE Trans. Power Del.*, vol. 32, no. 1, pp. 106-116, February 2017.

[11] F. Kong, Z. Hao, S. Zhang and B. Zhang, "Development of a Novel Protection Device for Bipolar HVDC Transmission Lines," in *IEEE Trans. Power Del.*, vol. 29, no. 5, pp. 2270-2278, October 2014.

[12] R. Li, L. Xu and L. Yao, "DC Fault Detection and Location in Meshed Multiterminal HVDC Systems Based on DC Reactor Voltage Change Rate," *IEEE Trans Power Del.*, vol. 32, no. 3, pp. 1516-1526, 2017.

[13] R. A. Walling, M. Sublich, D. J. Lorden and S. A. Doe, "Simultaneous pole and neutral faults on an HVDC line with a dedicated metallic return," *IEEE Trans. Power Del.*, vol. 5, no. 2, pp. 1129-1136, April 1990.

[14] Y. Zhang, N. Tai and B. Xu, "Fault Analysis and Traveling-Wave Protection Scheme for Bipolar HVDC Lines," in *IEEE Trans. Power Del.*, vol. 27, no. 3, pp. 1583-1591, July 2012.

[15] P. Sanjeevikumar, B. Paily, M. Basu and M. Conlon, "Classification of fault analysis of HVDC systems using artificial neural network," 2014 49th *International Universities Power Engineering Conference (UPEC)*, Cluj-Napoca, 2014, pp. 1-5.

[16] S. Pirooz Azad and D. Van Hertem, "A Fast Local Bus Current-Based Primary Relaying Algorithm for HVDC Grids," in *IEEE Trans. Power Del.*, vol. 32, no. 1, pp. 193-202, February 2017.

[17] M. H. Naushath and A. D. Rajapakse, "Energization and Regulation of a Hybrid HVDC Grid with LCC and VSC," IEEE Electrical Power and Energy Conference (EPEC), October 2017, Saskatoon, S K, 2017.

[18] W. Leterme, J. Beerten and D. Van Hertem, "Equivalent circuit for half-bridge MMC dc fault current contribution," 2016 *IEEE International Energy Conference* (ENERGYCON), Leuven, 2016, pp. 1-6.

[19] Z. Xu, H. Xiao, L. Xiao, and Z. Zhang, "DC Fault Analysis and Clearance Solutions of MMC-HVDC Systems," Energies, vol. 11, no. 4, p. 941, April 2018.

[20] Leterme, W., Beerten, J., & Van Hertem, D. (2016). Nonunit protection of HVDC grids with inductive DC cable termination. IEEE Trans. Power Del., 31(2), 820-828.

[21] ALSTOM, "HVDC: Connecting to the future", France, Alstom Grid, 2010, pp. 144-209.

[22] C. V. Thio, "Nelson River HVdc Bipole-Two Part I—System Aspects," *IEEE Trans. Power App. Syst.*, vol. no. 1, pp. 165-173, January 1979.

[23] M. N. Haleem and A. D. Rajapakse, "Local measurement based ultra-fast directional ROCOV scheme for protecting Bi-pole HVDC grids with a metallic return conductor," *IJEPES, Elsevier*, vol. 98, pp 323-330, June 2018.

[24] U. N. Gnanarathna, A. M. Gole and R. P. Jayasinghe, "Efficient Modeling of Modular Multilevel HVDC Converters (MMC) on Electromagnetic Transient Simulation Programs," *IEEE Trans. Power Del.*, vol. 26, no. 1, pp. 316-324, January 2011.

[25] W. Wang, M. Barnes, O. Marjanovic and O. Cwikowski, "Impact of DC Breaker Systems on Multi-terminal VSC-HVDC Stability," *IEEE Trans Power Del.*, vol. 31, no. 2, pp. 769-779, April 2016.

[26] C. V. Thio, "Nelson River HVdc Bipole-Two Part I—System Aspects," *IEEE Trans. Power App. Syst.*, vol. PAS-98, no. 1, pp. 165-173, January 1979.

[27] M. Aredes, R. Dias, A. F. Da Cunha De Aquino, C. Portela and E. Watanabe, "Going the Distance," in *IEEE Ind. Electronic. Magazine*, vol. 5, no. 1, pp. 36-48, March 2011.

[28] J. Suonan, S. Gao, G. Song, Z. Jiao and X. Kang, "A Novel Fault-Location Method for HVDC Transmission Lines," in *IEEE Tran. Power Del.*, vol. 25, no. 2, pp. 1203-1209, April 2010.

[29] P. Tünnerhoff, P. Ruffing and A. Schnettler, "*Comprehensive Fault Type Discrimination Concept for Bipolar Full-Bridge-Based MMC HVDC Systems with Dedicated Metallic Return*," in *IEEE Tran Power Del*, vol. 33, no. 1, pp. 330-339, February 2018.

[30] T. Bi, S. Wang and K. Jia, "Single pole-to-ground fault location method for MMC-HVDC system using active pulse," in *IET Gener., Transm & Dis.*, vol. 12, no. 2, pp. 272-278, 30 1 2018.

[31] O. M. K. K. Nanayakkara, A. D. Rajapakse and R. Wachal, "Location of DC Line Faults in Conventional HVDC Systems With Segments of Cables and Overhead Lines Using Terminal Measurements," in *IEEE Trans. Power Del*, vol. 27, no. 1, pp. 279-288, January 2012.

[32] L. Yuansheng, W. Gang and L. Haifeng, "Time-Domain Fault-Location Method on HVDC Transmission Lines Under Unsynchronized Two-End Measurement and Uncertain Line Parameters," in *IEEE Trans Power Del.*, vol. 30, no. 3, pp. 1031-1038, June 2015.

[33] Z. He, K. Liao, X. Li, S. Lin, J. Yang and R. Mai, "Natural Frequency-Based Line Fault Location in HVDC Lines," in *IEEE Trans. Power Del*, vol. 29, no. 2, pp. 851-859, April 2014.

[34] C. Li and P. He, "Fault-location method for HVDC transmission lines based on phase frequency characteristics," in *IET Gener. Transm. & Dis.*, vol. 12, no. 4, pp. 912-916, 27 2 2018.

[35] M. Farshad and J. Sadch, "A Novel Fault-Location Method for HVDC Transmission Lines Based on Similarity Measure of Voltage Signals," in *IEEE Trans Power Del.*, vol. 28, no. 4, pp. 2483-2490, October 2013.

[36] J. M. Johnson and A. Yadav, "Complete protection scheme for fault detection, classification and location estimation in HVDC transmission lines using support vector machines," in *IET Science, Measurement & Technology*, vol. 11, no. 3, pp. 279-287, 5 2017.

[37] S. Vasanth, Y. M. Yeap and A. Ukil, "Fault location estimation for VSC-HVDC system using Artificial Neural Network," 2016 *IEEE Region* 10 *Conference (TENCON)*, Singapore, 2016, pp. 501-504.

[38] N. Perera and A. D. Rajapakse, "Recognition of Fault Transients Using a Probabilistic Neural-Network Classifier," in *IEEE Trans. on Power Del.*, vol. 26, no. 1, pp. 410-419, January 2011.

[39] K. M. Silva, B. A. Souza and N. S. D. Brito, "*Fault detection and classification in transmission lines based on wavelet transform and ANN*," in *IEEE Trans. on Power Del.*, vol. 21, no. 4, pp. 2058-2063, October 2006.

[40] Su Qianli, Dong Xinzhou, Z. Q. Bo and F. Jiang, "New approach of fault detection and fault phase selection based on initial current traveling waves," *IEEE Power Engineering Society Summer Meeting*, Chicago, IL, USA, pp. 393-397. July 2002.

[41] Z. He, L. Fu, S. Lin and Z. Bo, "Fault Detection and Classification in EHV Transmission Line Based on Wavelet Singular Entropy," in *IEEE Trans. on Power Del.*, vol. 25, no. 4, pp. 2156-2163, October 2010.

[42] O. A. S. Youssef, "New algorithm to phase selection based on wavelet transforms," in *IEEE Trans. on Power Del.*, vol. 17, no. 4, pp. 908-914, October 2002.

[43] M. Ben Hessine, S. Marrouchi and S. Chebbi, "A fault classification scheme with high robustness for transmission lines using fuzzy-logic system," 2017 *International Conference on Advanced Systems and Electric Technologies (IC_ASET)*, Hammamet, Tunisia, pp. 256-261. January 2017.

[44] L. Shang, G. Herold and J. Jaeger, "A new approach to high-speed protection for transmission line based on transient signal analysis using wavelets," 2001 *Seventh International Conference on Developments in Power System Protection (IEE)*, Amsterdam, Netherlands, pp. 173-176. April 2001.

[45] A. Yadav and A. Swetapadma, "Combined DWT and Naive Bayes based fault classifier for protection of double circuit transmission line," *International Conference on Recent Advances and Innovations in Engineering (ICRAIE*-2014), Jaipur, 2014.

Tables

TABLE I

LCC Test System Data

| PARAMETER | VALUE | UNITS |
|---|---|---|
| Nominal DC Voltage | ±500 | kV |
| Operating point | 600 | MW/pole |
| Length | 900 | km |
| AC Sys. SCR Rectifier | 2.9 | |
| AC Sys. SCR Inverter | 5.0 | |
| DC reactor | 0.75 | H |
| Cut-off frequencies of DC side shunt filer | 720 & 1440 | Hz |
| Cut-off frequencies of AC side shunt filter | 540 & 780 | Hz |
| Transformer Data | | |
| MVA | 600 × 2 | MW/pole |
| Leakage Reactance | 0.15 | pu |
| Transformer Ratio | 230 kV/209 kV | |

TABLE II

VSC Test System Data

| PARAMETER | VALUE | UNITS |
|---|---|---|
| Nominal DC Grid Power | 1,000 | MW |
| Nominal AC Voltage (VLL) | 230 | kV |
| Nominal DC Voltage | ±320 | kV |
| Equivalent MMC DC Capacitance | 100 | µF |
| Number of levels | 98 | |
| Arm reactor | 25 | mH |
| di/dt limiting reactor on poles | 40 | mH |
| Terminal reactor on DMR | 2.5 | mH |
| Power from VSC-1 | 150 | MW/pole |
| Power from VSC-2 | −400 | MW/pole |
| Power from VSC-3 | 264 | MW/pole |

TABLE III

Fault scenarios.

| SCENARIO | TEST SYSTEM | FAULT TYPE | FAULT LOCATION | RESISTANCE |
|---|---|---|---|---|
| Sc-1 | 1 | P→G | LCC link @ 500 km from Rect. | 0.05 Ω |
| Sc-2 | 1 | N→G | LCC link @ 300 km from Rect. | 0.05 Ω |
| Sc-3 | 2 | P→G | Line-34 @ 750 km from VSC-3 | 0.05 Ω |
| Sc-4 | 2 | P→R | Line-34 @ 750 km from VSC-3 | 0.05 Ω |
| Sc-5 | 2 | P→G | Cable-14 @ 250 km from VSC-1 | 0.05 Ω |
| Sc-6 | 2 | P→R | Cable-14 @ 250 km from VSC-1 | 0.05 Ω |

TABLE AI

Transmission system parameters of FIG. 1B

| PARAMETER | VALUE | UNITS |
|---|---|---|
| Line series inductance ($L_x$) | 0.40 | mH/km |
| Mutual inductance ($L_m$) | 0.19 | mH/km |
| Line series resistance ($R_x$) | 0.45 | mΩ/km |
| Shunt capacitance ($C_x$) | 2.70 | nF/km |
| Mutual capacitance ($C_m$) | 0.16 | nF/km |
| Length from converter-1 to fault | 100 | km |
| Length from converter-2 to fault | 300 | km |

TABLE AII

Converter parameters of the circuit of FIG. 1B

| PARAMETER | VALUE | UNITS |
|---|---|---|
| Arm inductor ($L_{arm}$) | 37 | mH |
| Series resistance ($R_{arm}$) | 0.5 | Ω |
| Terminal inductor ($L_t$) | 50 | mH |
| Equivalent capacitance ($C_{eq}$) | 300 | µF |
| IGBT blocking threshold | 2 | pu |
| Blocking delay | 500 | µs |

TABLE IV

Converter parameters.

| PARAMETER | VALUE | UNITS |
|---|---|---|
| Nominal DC Voltage | ±500 | kV |
| Operating point | 700 | MW/pole |
| Length | 800 | km |
| AC Sys. SCR Rectifier | 2.9 | |
| AC Sys. SCR Inverter | 5.0 | |
| DC reactor | 0.75 | H |
| Cut-off frequencies of DC side shunt filer | 720 & 1440 | Hz |
| Cut-off frequencies of AC side shunt filter | 660 & 780 | Hz |
| Transformer Data | | |
| MVA | 600 × 2 | MW/pole |
| Leakage Reactance | 0.15 | pu |
| Transformer Ratio | 230 kV/209 kV | |

TABLE V

Estimated coupling coefficients for the test system.

| Loc. (km) | $K^{-1}_{np}$ | $K^{-1}_{pn}$ | Loc. (km) | $K^{-1}_{np}$ | $K^{-1}_{pn}$ |
|---|---|---|---|---|---|
| 0 | 344.0690 | 2422.689 | 450 | 4.732842 | 4.878133 |
| 50 | 177.6568 | 474.9237 | 500 | 4.172521 | 4.288561 |
| 100 | 43.04042 | 54.9398 | 550 | 3.730998 | 3.825307 |
| 150 | 21.55040 | 24.33007 | 600 | 3.357883 | 3.441351 |
| 200 | 14.07274 | 15.15696 | 650 | 3.051066 | 3.125217 |
| 250 | 10.03818 | 10.66607 | 700 | 2.799645 | 2.869266 |
| 300 | 7.856659 | 8.258868 | 750 | 2.630967 | 2.681031 |
| 350 | 6.457271 | 6.702997 | 800 | 1.85992 | 1.890377 |
| 400 | 5.457357 | 5.649014 | — | | |

TABLE VI

Fault locations for low locations for low resistance P-pole to ground faults (@P = 1.4 GW)

| Act. Loc. (km) | $R_F$ (Ω) | $K^{-1}_{np}$ | Est. Loc. (km) | Error (km) | Error (%) |
|---|---|---|---|---|---|
| 48 | 0.3 | 194.1777 | 44.536 | 3.46 | 0.43 |
| 82 | 3.0 | 64.1146 | 85.790 | −3.80 | −0.47 |
| 144 | 5.0 | 22.74165 | 145.003 | −1.00 | −0.12 |
| 192 | 1.5 | 14.82150 | 193.420 | −1.42 | −0.18 |
| 240 | 0.5 | 10.6452 | 240.377 | −0.38 | −0.05 |
| 390 | 4.0 | 5.6301 | 390.164 | −0.16 | −0.02 |
| 430 | 0.1 | 4.9886 | 430.745 | −0.75 | −0.09 |
| 530 | 5.0 | 3.8902 | 530.860 | −0.60 | −0.11 |
| 570 | 0.1 | 3.5724 | 570.141 | −0.14 | −0.02 |
| 654 | 0.8 | 3.02038 | 653.602 | 0.40 | 0.05 |
| 760 | 0.3 | 2.56451 | 758.284 | 1.72 | 0.21 |

TABLE VII

Fault locations for low resistance N-pole to ground faults (@P = 1.4 GW)

| Loc. (km) | $R_F$ (Ω) | $K^{-1}_{pn}$ | Est Loc (km) | Error (km) | Error (%) |
|---|---|---|---|---|---|
| 54 | 0.9 | 361.910 | 55.306 | −1.3061 | −0.1633 |
| 78 | 0.6 | 107.9511 | 86.139 | −1.1390 | −0.1424 |
| 126 | 0.4 | 33.46736 | 127.345 | −1.3458 | −0.1682 |
| 252 | 3.2 | 10.50146 | 252.536 | −0.5367 | −0.0671 |
| 318 | 2.2 | 7.634849 | 317.599 | 0.4014 | 0.0502 |
| 426 | 3.7 | 5.219229 | 426.104 | −0.1039 | −0.0130 |
| 510 | 0.3 | 4.178933 | 510.827 | −0.8275 | −0.1034 |
| 572 | 2.7 | 3.646403 | 572.112 | −0.1116 | −0.0140 |
| 660 | 1.6 | 3.065987 | 660.542 | −0.5420 | −0.0678 |
| 770 | 0.4 | 2.519464 | 767.369 | 2.6311 | 0.3289 |

TABLE VIII

Estimated fault locations for monopole configuration

| Loc. (km) | $R_F$ (Ω) | $K^{-1}_{rp}$ | Est Loc (km) | Error (km) | Error (%) |
|---|---|---|---|---|---|
| 84 | 0.05 | 49.85848 | 86.1253 | 0.1253 | −0.0278 |
| 106 | 5.00 | 30.88232 | 105.6301 | 0.3699 | 0.0822 |
| 130 | 25 | 20.82156 | 132.8416 | −2.8416 | −0.6315 |
| 262 | 10 | 6.997834 | 261.4623 | 0.5377 | 0.1195 |
| 356 | 15 | 4.598211 | 356.7631 | 0.7631 | −0.1696 |
| 430 | 0.1 | 3.683695 | 428.6270 | 1.3730 | 0.3051 |
| 464 | 5 | 3.109535 | 465.4117 | −1.4117 | −0.3137 |

TABLE IX

Fault locations using ground coupling for monopole configuration

| Loc. (km) | $R_F$ (Ω) | $K^{-1}_{gp}$ | Est Loc (km) | Error (km) | Error (%) |
|---|---|---|---|---|---|
| 84 | 8.0 | 31.24628 | 81.1398 | 2.8602 | 0.5720 |
| 142 | 3.0 | 10.66627 | 144.0472 | −2.0472 | −0.4094 |
| 162 | 32 | 8.092958 | 163.8240 | −1.8240 | −0.3648 |
| 174 | 12 | 7.458965 | 170.8626 | −0.8626 | −0.1725 |
| 246 | 65 | 4.018190 | 246.4173 | −0.4173 | −0.0835 |
| 318 | 55 | 2.765533 | 320.0641 | −2.0641 | −0.4128 |
| 384 | 2 | 2.202026 | 384.8230 | −0.8230 | −0.1646 |
| 417 | 0.2 | 2.011581 | 423.9275 | −6.9275 | −1.3855 |
| 452 | 4 | 1.841765 | 454.7313 | −2.7313 | −0.5463 |

TABLE X

Estimated fault locations for high resistance faults

| Pole | Loc. (km) | $R_F$ (Ω) | Est Loc (km) | Error (km) | Error (%) |
|---|---|---|---|---|---|
| P | 118 | 9.0 | 118.9965 | −0.9865 | −0.1233 |
| N | 162 | 12.0 | 162.3993 | −0.3993 | −0.0499 |
| P | 236 | 30.0 | 237.6296 | −1.6296 | −0.2037 |
| N | 270 | 70.0 | 269.3440 | 0.6560 | 0.0820 |
| P | 356 | 35.0 | 358.0190 | −2.0190 | −0.2524 |
| P | 480 | 9.0 | 480.3729 | −0.3729 | −0.0466 |
| P | 524 | 17.0 | 524.3383 | −0.3383 | −0.0423 |
| N | 612 | 45.0 | 611.4804 | 0.5196 | 0.0649 |
| P | 712 | 7.0 | 714.5440 | −2.5440 | −0.3180 |
| N | 762 | 8.0 | 760.6705 | 1.3295 | 0.1662 |

TABLE XI

Transmission line parameters (at 60 Hz)

| PARAMETER | VALUE | UNITS |
|---|---|---|
| $R_1$ | $5.067 \times 10^{-2}$ | Ω/km |
| $X_{L1}$ | $4.822 \times 10^{-1}$ | Ω/km |
| $X_{C1}$ | 0.2947 | Ω/km |
| $R_0$ | $2.1443 \times 10^{-1}$ | Ω/km |
| $X_{L0}$ | 1.52566 | Ω/km |
| $X_{C0}$ | 0.4144 | Ω/km |

TABLE XII

Faulty Phase Identification Using Criteria C1 and C2

| Fault Scenario | Angle (deg) | $F_{ab}$ | $F_{bc}$ | $F_{ca}$ | Crit. C1 | Crit. C2 |
|---|---|---|---|---|---|---|
| 1 | 54 | 1.491 | 6.677 | 0.088 | B | A |
| 1 | 90 | 2.540 | 1.455 | 0.238 | A | B |
| 1 | 162 | 0.659 | 11.915 | 0.111 | B | A |
| 2 | 54 | 11.676 | 0.096 | 0.755 | A | C |
| 2 | 126 | 3.161 | 0.168 | 1.679 | A | C |

Legend

To help identify correspondence between terminology in the description and the claims:

| In the claims | In the description |
|---|---|
| HVDC (claims 6-7) | |
| First power-transmitting conductor | P-pole |
| Second power-transmitting conductor | N-pole |
| Ratio | $F_{PN}$ |
| Discrimination factor | $1 + k_2$ or $D_1$ |
| HVDC (claims 8-13) | |
| First power-transmitting conductor | P-pole |
| Second power-transmitting conductor | N-pole |
| Return conductor | DMR |
| First ratio | $F_{PN}$ |
| Second ratio | $F_{PR}$ |
| Third ratio | $F_{RN}$ |
| Fourth ratio | $F_{gRN}$ |
| Fifth ratio | $F_{gPR}$ |
| First discrimination factor | $D_1$ |
| Second discrimination factor | $D_2$ |
| Third discrimination factor | $D_3$ |
| HVAC (claims 24-34) | |
| First power-transmitting conductor | Phase A |
| Second power-transmitting conductor | Phase B |
| Third power-transmitting conductor | Phase C |

-continued

| In the claims | In the description |
|---|---|
| First ratio | $F_{ab}$ |
| Second ratio | $F_{bc}$ |
| Third ratio | $F_{ca}$ |
| Prescribed threshold | $3K_1$ |
| First discrimination factor | $1 - \varepsilon_2$ |
| Second discrimination factor | $1 + \varepsilon_3$ |
| Third discrimination factor | $1 + \varepsilon_4$ |
| Fourth discrimination factor | $1 - \varepsilon_5$ |
| Fifth discrimination factor | $1 - \varepsilon_6$ |
| Sixth discrimination factor | $1 + \varepsilon_7$ |
| Seventh discrimination factor | $1 + \varepsilon_8$ |
| Eighth discrimination factor | $1 - \varepsilon_9$ |
| HVAC (claims 35-49) | |
| First power-transmitting conductor | Phase A |
| Second power-transmitting conductor | Phase B |
| Third power-transmitting conductor | Phase C |
| First ratio | $G^{\gamma}_{\alpha X}$ |
| Second ratio | $G^{\alpha X}_{\beta X}$ |
| Third ratio | $G^{\beta X}_{\alpha X}$ |
| First discrimination factor | $k_0$ |
| Second discrimination factor | $k_1$ |
| Third discrimination factor | $k_2$ |

The invention claimed is:

1. A method for identifying one or more faulted conductors among operating conductors in a power transmission system including a ground when a fault event has occurred in the power transmission system in which at least two of the operating conductors transmit power, wherein the power-transmitting conductors are respectively operably connected between first and second sets of terminals so as to transmit the power along the power-transmitting conductors from the first set of terminals to the second set of terminals, the method comprising:

monitoring current signals which are representative of currents in the power-transmitting conductors at a generally common location within the power transmission system, wherein monitoring the current signals comprises measuring the current in each one of the power-transmitting conductors at or generally in proximity to a common selected one of the first and second sets of terminals;

filtering the current signals to produce filtered current signals associated with respective ones of the power-transmitting conductors;

determining a maximum rate of change of each filtered current signal within a predetermined time interval after the fault event has commenced;

calculating a plurality of ratios, each ratio being between a pair of the maximum rates of change of the filtered current signals associated with different pairs of the operating conductors;

comparing the ratios against a plurality of threshold values in which at least one of the threshold values is a positive constant representative of a minimum ratio of a pair of the maximum rates of change of the filtered current signals based on a fault occurring at a maximum distance from the generally common location at which the current signals are monitored; and determining either (i) one or more of the operating conductors are faulted conductors faulted in parallel with the ground or (ii) two or more operating conductors are faulted conductors faulted in parallel with one another based on a result of the comparison of the ratios to the threshold values.

2. The method of claim 1, further including disconnecting the identified one or more faulted conductors so as to interrupt fault currents generated as a result of the fault event.

3. The method of claim 1, further including determining a rate of change of the filtered current signal of at least one of the conductors and comparing a sum thereof to a fixed threshold value to validate that the fault event has occurred.

4. The method of claim 1, wherein the predetermined time interval has a duration between about 0.2 and about 2.0 milliseconds.

* * * * *